(12) United States Patent
Ryu et al.

(10) Patent No.: US 11,552,137 B2
(45) Date of Patent: Jan. 10, 2023

(54) DISPLAY DEVICE

(71) Applicant: Samsung Display Co., Ltd., Yongin-si (KR)

(72) Inventors: Ji Hun Ryu, Yongin-si (KR); Eun Jin Sung, Yongin-si (KR); Yun Ho Kim, Yongin-si (KR); Il Nam Kim, Yongin-si (KR); Won Sang Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/504,425

(22) Filed: Oct. 18, 2021

(65) Prior Publication Data

US 2022/0109029 A1   Apr. 7, 2022

Related U.S. Application Data

(63) Continuation of application No. 16/809,434, filed on Mar. 4, 2020, now Pat. No. 11,152,435.

(30) Foreign Application Priority Data

Apr. 24, 2019   (KR) ........................ 10-2019-0047882

(51) Int. Cl.
*H01L 27/00*   (2006.01)
*H01L 27/32*   (2006.01)
(Continued)

(52) U.S. Cl.
CPC ........ *H01L 27/323* (2013.01); *G06V 40/1306* (2022.01); *G09G 3/3266* (2013.01);
(Continued)

(58) Field of Classification Search
None
See application file for complete search history.

(56) References Cited

U.S. PATENT DOCUMENTS 7,663,306 B2   2/2010   Imamura
9,276,239 B2   3/2016   Park et al.
(Continued)

FOREIGN PATENT DOCUMENTS

CN   109103231   12/2018
JP   5757775    7/2015
(Continued)

OTHER PUBLICATIONS

Non-Final Office Action dated Mar. 2, 2021, in U.S. Appl. No. 16/809,434.
(Continued)

*Primary Examiner* — Michael A Faragalla
(74) *Attorney, Agent, or Firm* — H.C. Park & Associates, PLC

(57) ABSTRACT

A display device includes a light sensing array layer (LSAL), a substrate, a selective light transmission layer (SLTL), a pixel circuit layer (PCL), a display element layer (DEL), and pixels. The LSAL includes an optical sensor to sense incident light. The substrate is on the LSAL and includes a display area (DA) including pixel areas (PAs), and a non-DA adjacent to the DA. The SLTL is disposed on the substrate and includes through-holes to form a path of light onto the optical sensor, and a light-blocking conductive pattern (LBCP) between the through-holes. The PCL is disposed on the SLTL and includes a conductive layer and an insulation layer. The DEL is disposed on the PCL and emits light. Each pixel includes a pixel circuit disposed on the PCL, and a light emitting element on the DEL in a corresponding pixel area. The LBCP is electrically connected to the conductive layer.

20 Claims, 34 Drawing Sheets

(51) Int. Cl.
  *H01L 51/52* (2006.01)
  *G09G 3/3275* (2016.01)
  *G09G 3/3266* (2016.01)
  *G06V 40/13* (2022.01)

(52) U.S. Cl.
  CPC ....... *G09G 3/3275* (2013.01); *H01L 27/3276* (2013.01); *H01L 51/5246* (2013.01); *G09G 2300/0439* (2013.01); *H01L 2251/308* (2013.01); *H01L 2251/5338* (2013.01)

(56) References Cited

U.S. PATENT DOCUMENTS

| | | | |
|---|---|---|---|
| 9,501,686 | B2 | 11/2016 | Lin |
| 9,768,310 | B2 | 9/2017 | Ahn et al. |
| 10,083,335 | B2 | 9/2018 | Zhang |
| 10,268,884 | B2* | 4/2019 | Jones ............... G06F 3/0412 |
| 10,360,431 | B2 | 7/2019 | Gozzini et al. |
| 10,360,430 | B2 | 8/2019 | Zhang et al. |
| 11,152,435 | B2 | 10/2021 | Ryu et al. |
| 2008/0197778 | A1 | 8/2008 | Kubota |
| 2013/0308193 | A1 | 11/2013 | Ogawa |
| 2017/0090083 | A1 | 3/2017 | Takishita et al. |
| 2017/0249494 | A1 | 8/2017 | Zhang et al. |
| 2017/0351898 | A1 | 12/2017 | Zhang |
| 2018/0046837 | A1* | 2/2018 | Gozzini ............... H04W 12/06 |
| 2018/0075278 | A1 | 3/2018 | Zhang |
| 2018/0182985 | A1 | 6/2018 | Kang |
| 2018/0294299 | A1 | 10/2018 | Baek et al. |
| 2019/0006440 | A1 | 1/2019 | Sun et al. |
| 2019/0050621 | A1 | 2/2019 | Xu et al. |
| 2019/0095674 | A1 | 3/2019 | Ko et al. |
| 2019/0205594 | A1 | 7/2019 | Lee et al. |
| 2019/0228204 | A1 | 7/2019 | Park et al. |
| 2019/0278968 | A1 | 9/2019 | Yoshii et al. |
| 2019/0354789 | A1 | 11/2019 | Gu et al. |
| 2020/0065547 | A1 | 2/2020 | Ryu et al. |
| 2020/0066825 | A1 | 2/2020 | Yang et al. |
| 2020/0104562 | A1 | 4/2020 | Sung et al. |
| 2020/0219915 | A1 | 7/2020 | Kim et al. |
| 2020/0219946 | A1 | 7/2020 | Ryu et al. |
| 2020/0219948 | A1 | 7/2020 | Kim et al. |
| 2020/0203468 | A1 | 9/2020 | Zeng et al. |
| 2020/0395433 | A1 | 12/2020 | Sung et al. |

FOREIGN PATENT DOCUMENTS

| | | |
|---|---|---|
| KR | 10-2014-0100853 | 8/2014 |
| KR | 10-2015-0075512 | 7/2015 |
| KR | 10-2016-0062831 | 6/2016 |
| KR | 10-2017-0027349 | 3/2017 |
| KR | 10-2018-0001904 | 1/2018 |
| KR | 10-2018-0003363 | 1/2018 |
| KR | 10-2018-0047579 | 5/2018 |
| KR | 10-1884254 | 8/2018 |
| KR | 10-2018-0100140 | 9/2018 |
| KR | 10-2018-0113885 | 10/2018 |
| KR | 10-2019-0107215 | 9/2019 |
| KR | 10-2020-0023567 | 3/2020 |
| KR | 10-2020-0038388 | 4/2020 |
| KR | 10-2020-0085397 | 7/2020 |
| KR | 10-2020-0085401 | 7/2020 |
| KR | 10-2020-0085403 | 7/2020 |
| WO | 2018214481 | 11/2018 |

OTHER PUBLICATIONS

Notice of Allowance dated Jun. 16, 2021, in U.S. Appl. No. 16/809,434.
Non-Final Office Action dated Apr. 28, 2022, issued to U.S. Appl. No. 16/892,682.
Final Office Action dated Aug. 18, 2022, issued to U.S. Appl. No. 16/892,682.
Non-Final Office Action dated Nov. 10, 2022, issued to U.S. Appl. No. 16/892,682.

* cited by examiner

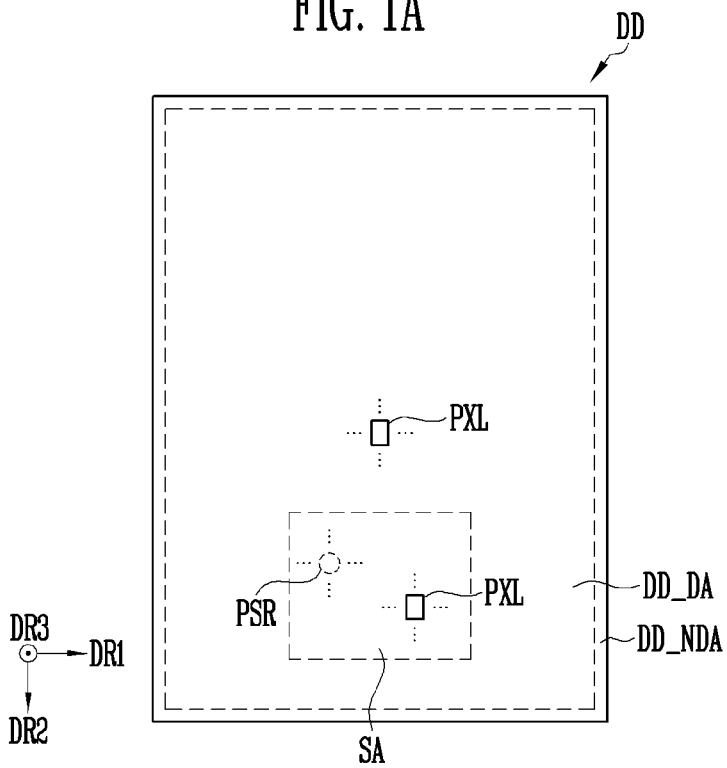
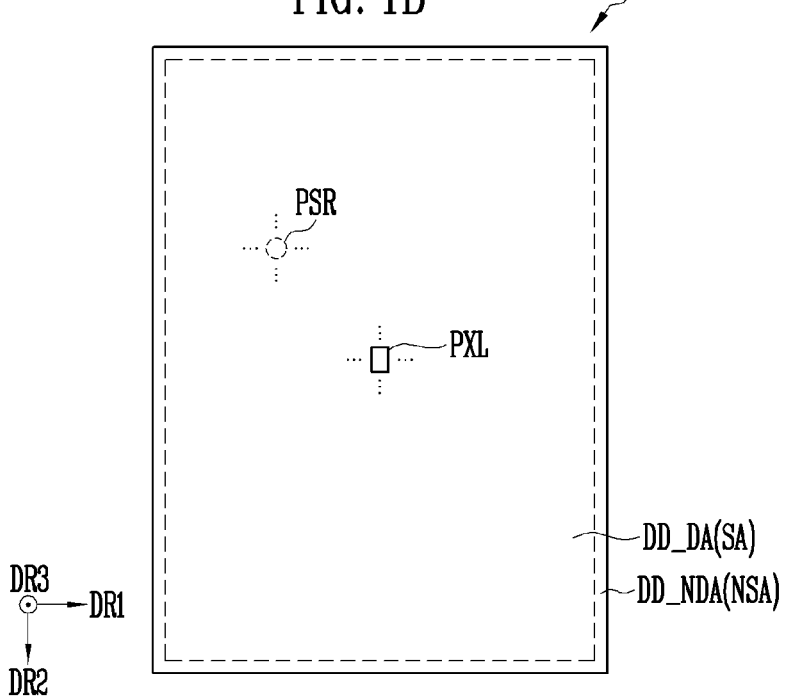

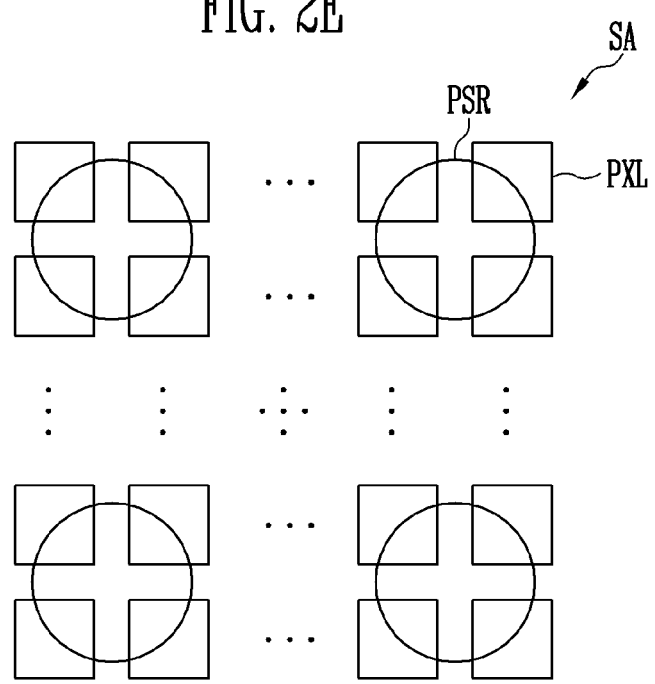

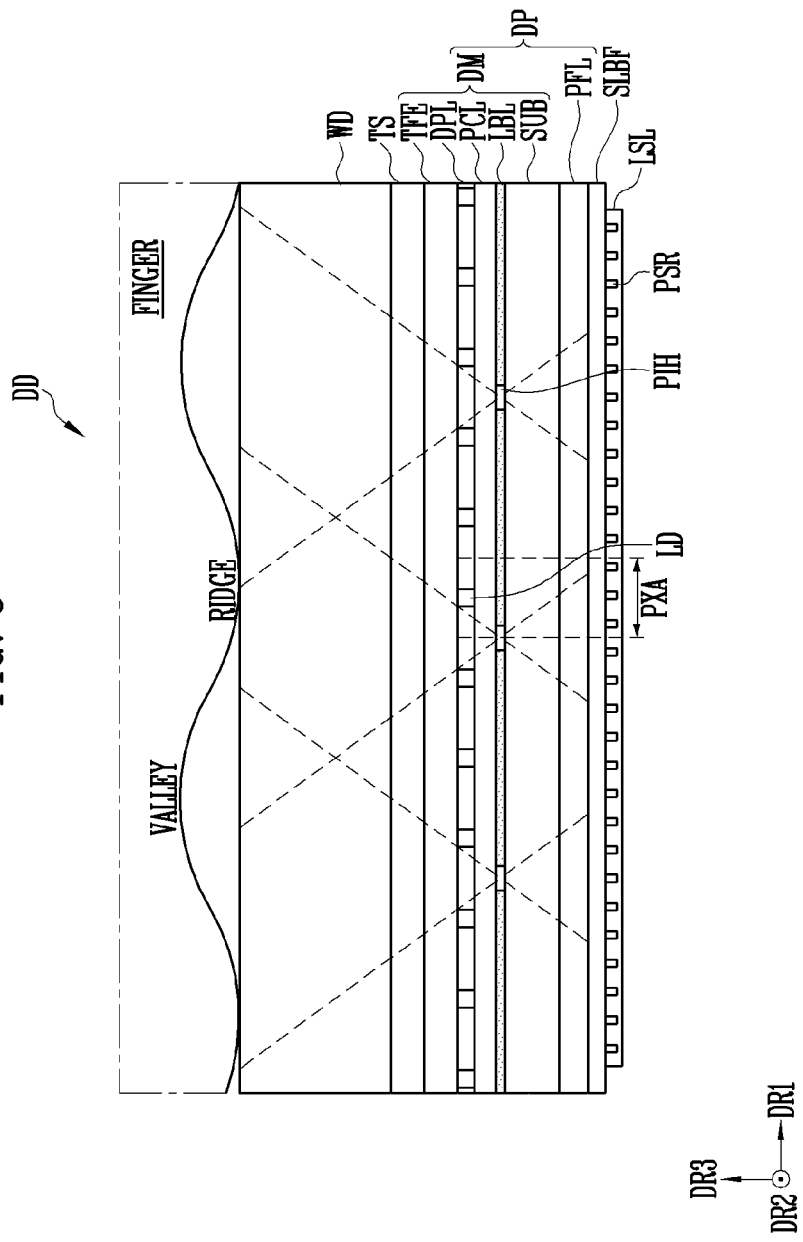

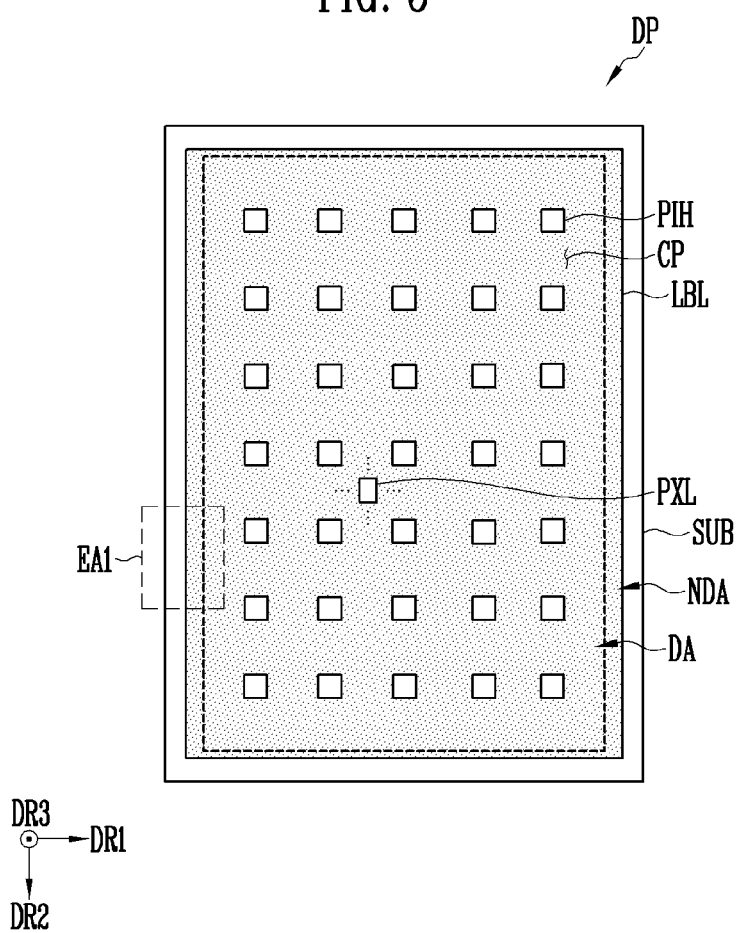

DISPLAY DEVICE

CROSS-REFERENCE TO RELATED APPLICATIONS

This application is a Continuation of U.S. patent application Ser. No. 16/809,434, filed Mar. 4, 2020, which claims priority to and the benefit of Korean Patent Application No. 10-2019-0047882, filed Apr. 24, 2019, each of which is hereby incorporated by reference for all purposes as if fully set forth herein.

BACKGROUND

Field

Exemplary embodiments generally relate to a display device, and, more particularly, to a display device including a fingerprint sensor.

Discussion

A display device, such as a smart phone, a tablet personal computer (PC), and the like, are widely used, and a biometric information authentication method using, for instance, a fingerprint of a user is drawing attention. To provide a fingerprint sensing function to a display device, a fingerprint sensor may be provided in a form embedded or attached to the display device. The fingerprint sensor may be, for example, a sensor of a light sensing type. The fingerprint sensor of the light sensing type may include a light source, a lens, and an optical sensor array. When fingerprint sensing is performed in at least one area of the display device using the aforementioned fingerprint sensor, an accuracy of fingerprint sensing of the fingerprint sensor may be deteriorated when light inflows from the outside.

In addition, when a separate film for selectively transmitting and/or blocking specific light is applied to a display device for a more accurate fingerprint sensing capability of the fingerprint sensor, a thickness and a manufacturing cost of the display device may increase.

The above information disclosed in this section is only for understanding the background of the inventive concepts, and, therefore, may contain information that does not form prior art.

SUMMARY

Some exemplary embodiments provide a display device capable of improving an emission efficiency of a light emitting element by changing characteristics of a transistor in a pixel by electrically connecting a conductive pattern of a pinhole array mask layer and some elements in the pixel and transferring a voltage transmitted to some elements of the pixel to the light-blocking conductive pattern.

Some exemplary embodiments provide a display device capable of improving a fingerprint sensing capability of a fingerprint sensor by providing a function of selectively blocking light in a determined wavelength range to an insulation layer, a protective film, or the like included in the display device.

Additional aspects will be set forth in the detailed description which follows, and, in part, will be apparent from the disclosure, or may be learned by practice of the inventive concepts.

According to some exemplary embodiments, a display device includes a light sensing array layer, a substrate, a selective light transmission layer, a pixel circuit layer, a display element layer, and a plurality of pixels. The light sensing array layer includes at least one optical sensor configured to sense incident light. The substrate is disposed on the light sensing array layer. The substrate includes a display area including a plurality of pixel areas, and a non-display area adjacent to at least one side of the display area. The selective light transmission layer is disposed on the substrate. The selective light transmission layer includes a plurality of through-holes configured to form a path of light onto the at least one optical sensor, and a light-blocking conductive pattern disposed between the plurality of through-holes. The pixel circuit layer is disposed on the selective light transmission layer. The pixel circuit layer includes at least one conductive layer and at least one insulation layer. The display element layer is disposed on the pixel circuit layer. The display element layer is configured to emit light. Each pixel among the plurality of pixels includes a pixel circuit disposed on the pixel circuit layer, and a light emitting element disposed on the display element layer in a corresponding pixel area among the plurality of pixel areas. The light-blocking conductive pattern is electrically connected to the at least one conductive layer.

According to various exemplary embodiments, a display device may provide a function of blocking light in a determined wavelength range from some elements of the display panel without having a separate film for absorbing and/or blocking the specific light, thereby reducing manufacturing time and cost, as well as realizing a thinner display device.

According to various exemplary embodiments, a display device may change characteristics of one or more transistors in a pixel by electrically connecting a conductive pattern of a pinhole array mask layer and some elements in the pixel, thereby improving an emission efficiency of a light emitting element of the pixel.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIGS. 1A and 1B are plan views schematically illustrating a display device according to various exemplary embodiments.

FIGS. 2A, 2B, 2C, 2D, and 2E are plan views schematically illustrating various arrangement structures of pixels and optical sensors according to various exemplary embodiments.

FIG. 3 is a sectional view schematically illustrating the display device of FIG. 1A or 1B according to some exemplary embodiments.

FIG. 5 is a plan view schematically illustrating an arrangement structure of a pinhole array mask layer and a display unit of FIG. 3 according to some exemplary embodiments.

DETAILED DESCRIPTION OF THE ILLUSTRATED EMBODIMENTS

Figure 2A:
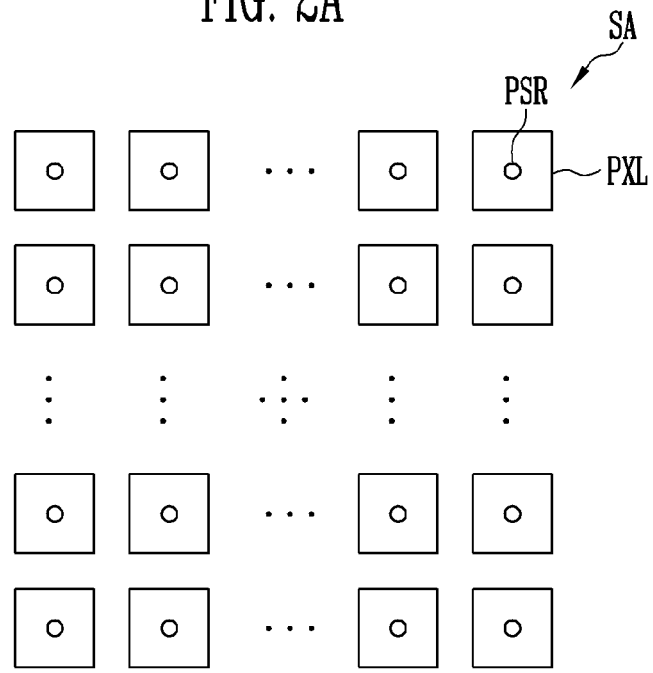

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

FIGS. 1A and 1B are plan views schematically illustrating a display device according to various exemplary embodiments. For instance, FIGS. 1A and 1B are plan views schematically illustrating a display device according to some exemplary embodiments and an optical sensor included in the display device and overlaps at least one area of the display device.

Referring to FIGS. 1A and 1B, a display device DD according to some exemplary embodiments may include a display area DD_DA and a non-display area DD_NDA.

The display device DD may be provided in various shapes, for example, the shape of a rectangular plate having two pairs of sides parallel to each other, but exemplary embodiments are not limited thereto. The display device DD may display arbitrary information, for example, a text, a video, a photograph, a two-dimensional or three-dimensional image, and/or the like in an image display direction.

The display device DD may be entirely or at least partially flexible. For example, the display device DD may be flexible in its entire area or flexible in an area corresponding to a flexible area.

The display area DD_DA may display content via pixels PXL and the non-display area DD_NDA may be disposed at least one side of the display area DD_DA. For example, the non-display area DD_NDA may be provided surrounding the display area DD_DA.

A plurality of pixels PXL may be provided in the display area DD_DA. According to some exemplary embodiments, each of the pixels PXL may include at least one light emitting element. According to some exemplary embodiments, the light emitting element may be a light emitting unit including an organic light emitting diode, or ultra-small inorganic light emitting diodes having a size in a micro to nano-scale range, but exemplary embodiments are not limited thereto. The display device DD displays an image in the display area DD_DA by driving the pixels PXL in response to input image data.

The non-display area DD_NDA may be an area outside (e.g., around) the display area DD_DA and another area except the display area DD_DA. According to some exemplary embodiments, the non-display area DD_NDA may include a line area, a pad area, a mounting area of a driving circuit, and/or various dummy areas.

In some exemplary embodiments, one area of the display device DD may be set to (or provided as) a sensing area SA capable of sensing a three-dimensional pattern, such as epidermal ridge information (e.g., a fingerprint, footprint, etc.) of a user. For example, the display area DD_DA of the display device DD may include the sensing area SA. For instance, at least portion of the display area DD_DA may be the sensing area SA.

For example, as shown in FIG. 1A, only a portion of an area of the display area DD_DA may be set to the sensing area SA. As shown in FIG. 1B, the entire display area DD_DA may be set to the sensing area SA. When the entire display area DD_DA is set to the sensing area SA, the non-display area DD_NDA surrounding the display area DD_DA may be a non-sensing area NSA. According to some exemplary embodiments, at least one area of the display area DD_DA may be set to the sensing area SA. A plurality of optical sensors PSR and a plurality of pixels PXL may be disposed in the sensing area SA.

The optical sensors PSR may be disposed on a surface (hereinafter referred to as "the other surface) opposite to one surface (e.g., a display surface) where the image is displayed in (or via) the display device DD. For instance, the optical sensors PSR may be disposed on a side where no image is displayed in the display device DD. The optical sensors PSR may use light emitting elements provided in at least one pixel PXL disposed in or around the sensing area SA as a light source for fingerprint sensing. For this purpose, the optical sensors PSR may be overlapped with at least a portion of the pixels PXL disposed in the sensing area SA, or disposed around the pixels PXL.

The optical sensors PSR may constitute a fingerprint sensor of a light sensing type together with the pixels PXL of the sensing area SA, e.g., light emitting elements provided in the pixels PXL. For instance, the optical sensors PSR may sense that light emitted from the light emitting element is reflected by (or off) the user and detect the reflected light to sense the fingerprint of the user. Although the optical sensors PSR are described as being used for fingerprint sensing, exemplary embodiments are not limited thereto. According to some exemplary embodiments, the optical sensors PSR may be used to perform various functions, such as touch sensors and scanners in addition to (or as alternative of) fingerprint sensing.

The display device DD according to some exemplary embodiments may sense a shape and a pattern of an object disposed on the display device DD using the optical sensors PSR disposed in the sensing area SA included in the display area DD_DA. For example, the display device DD may sense a user's fingerprint. In addition, the display device DD according to some exemplary embodiments may sense a user's fingerprint using light emitted from the pixels PXL. As described above, the display device DD including a fingerprint sensor may be implemented using the pixels PXL as a light source without a separate external light source, thereby reducing a thickness of the display device DD and reducing manufacturing time and/or cost.

FIGS. 2A to 2E are plan views schematically illustrating various arrangement structures of pixels and optical sensors according to various exemplary embodiments. For instance, FIGS. 2A to 2E illustrate various exemplary embodiments demonstrating relative size, resolution, and disposition relationship between at least one pixel PXL and at least one optical sensor PSA provided in the sensing area SA.

Figure 2B:
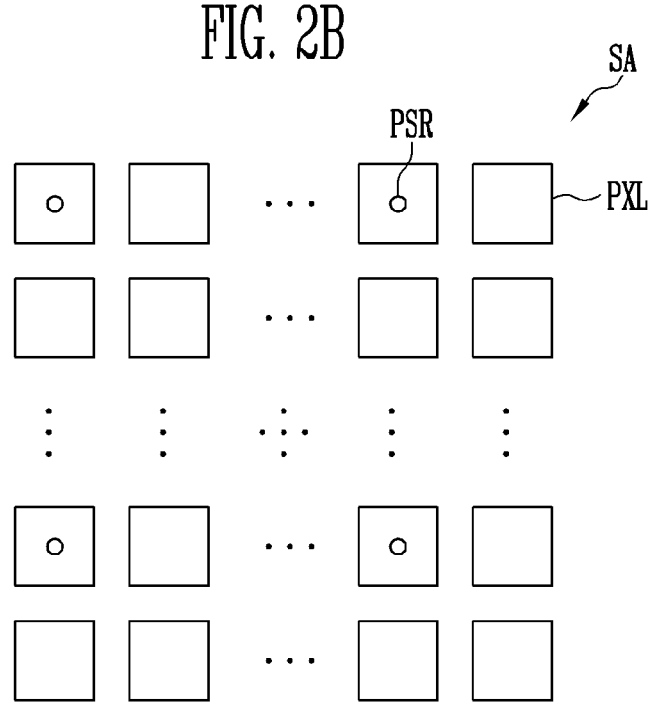
Figure 2C:
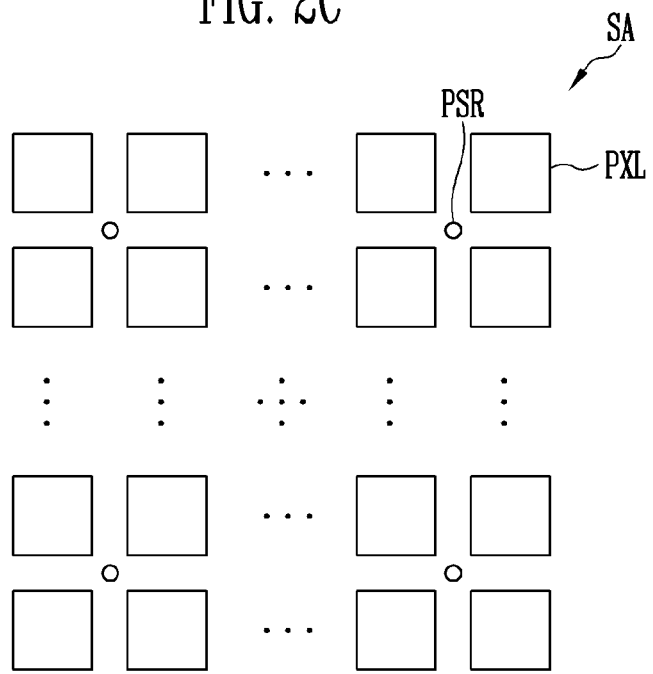
Figure 2D:
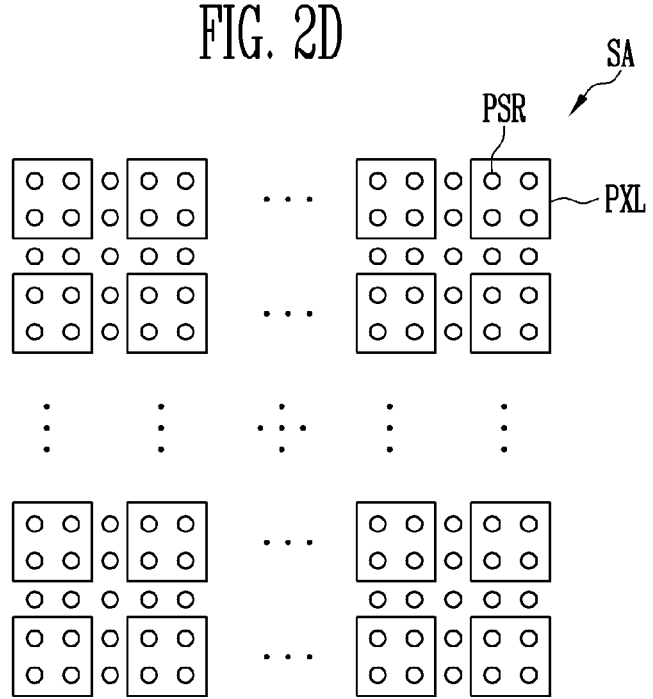

Referring to FIGS. 2A to 2E, the optical sensors PSR may be disposed with the same resolution (or density) as the pixels PXL or may be disposed with a different resolution (or density) from the pixels PXL in the sensing area SA. In some exemplary embodiments, the optical sensors PSR may have the same number as the number of the pixels PXL in the sensing area SA, such as shown in FIG. 2A. In this case, the optical sensors PSR and the pixels PXL may be disposed to be paired on a one-to-one basis. As another example, the optical sensors PSR may be disposed in a smaller number than the number of the pixels PXL in the sensing area SA, such as shown in FIGS. 2B, 2C, and 2E. As yet another example, the optical sensors PSR may be disposed in a larger number than the number of the pixels PXL in the sensing area SA, such as shown in FIG. 2D.

The pixels PXL and the optical sensors PSR may be disposed to overlap with each other, but exemplary embodiments are not limited thereto. According to some exemplary embodiments, the pixels PXL and the optical sensors PSR may be disposed not to overlap with each other, such as shown in FIG. 2C. In this case, the optical sensors PSR may be disposed in an area between adjacent pixels PXL. According to some exemplary embodiments, the pixels PXL and the optical sensors PSR may be disposed to overlap only a portion of an area of the pixels PXL and the optical sensors PSR, such as shown in FIG. 2E. According to another exemplary embodiment, only a portion of the optical sensors PSR may be disposed to overlap with the pixels PXL, such as shown in FIG. 2D.

In some exemplary embodiments, the optical sensors PSR may have the same size as the pixels PXL, or a size smaller than the pixels PXL, such as shown in FIGS. 2A to 2D. In addition, the optical sensors PSR may have a larger size than the pixels PXL, such as shown in FIG. 2E. When the optical sensors PSR have a size larger than the size of the pixels PXL, the optical sensors PSR may have a size to cover at least one pixel PXL.

The arrangement structure between the pixels PXL and the optical sensors PSR is not limited to the various exemplary embodiments described above. In other words, the shape, arrangement, relative size, number, resolution, and the like of the pixels PXL and the optical sensors PSR in the sensing area SA may be variously changed within the range (or limit) that is consistent with the inventive concepts. According to some exemplary embodiments, the pixels PXL and the optical sensors PSR may be disposed in the sensing area SA in the form of a combination of at least one of the various exemplary embodiments shown in FIGS. 2A to 2E.

According to some exemplary embodiments, the optical sensors PSR may be arranged regularly or irregularly in the sensing area SA.

Figure 4:
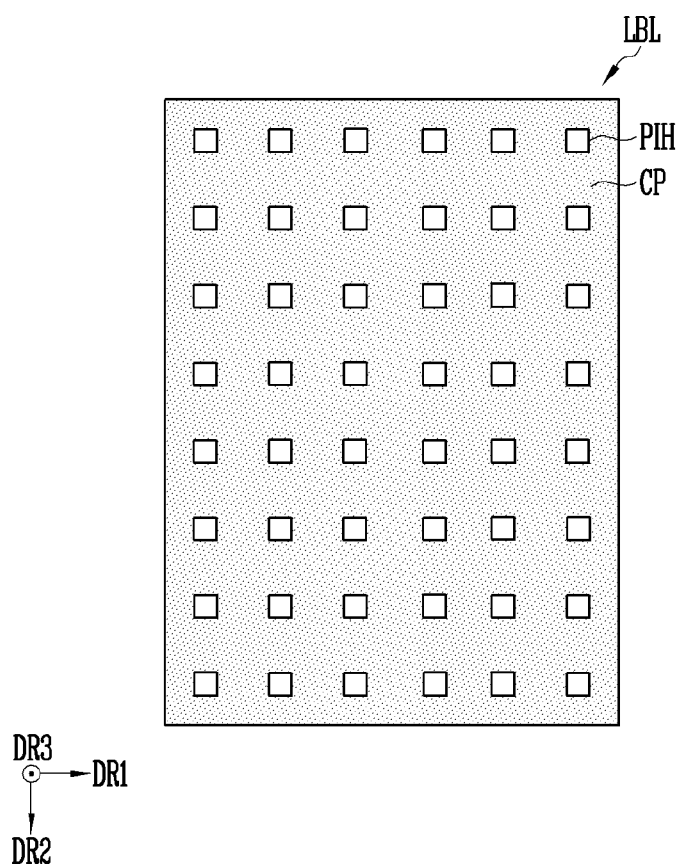
FIG. 4 is a plan view schematically illustrating a pinhole array mask layer of FIG. 3 according to some exemplary embodiments.

FIG. 3 is a sectional view schematically illustrating the display device of FIG. 1A or 1B according to some exemplary embodiments. FIG. 4 is a plan view schematically illustrating a pinhole array mask layer of FIG. 3 according to some exemplary embodiments. FIG. 5 is a plan view schematically illustrating an arrangement structure of a pinhole array mask layer and a display unit of FIG. 3 according to some exemplary embodiments.

Referring to FIGS. 1A to 5, the display device DD according to some exemplary embodiments may include a display panel DP and a light sensing array layer LSL disposed on one surface of the display panel DP. In addition, the display device DD may include a touch sensor TS disposed on the other side of the display panel DP and a window WD disposed on the touch sensor TS.

The display panel DP may display an image. A type of the display panel DP is not particularly limited as long as the display panel DP is capable of displaying an image. A display panel capable of emitting light, such as an organic light emitting display (OLED) panel may be used as the display panel DP. In addition, a non-light emitting display panel, such as a liquid crystal display (LCD) panel, an electrophoretic display (EPD) panel, or an electrowetting display (EWD) panel may be used as the display panel DP. When a non-light emitting display panel is used as the display panel DP of the display device DD according to some exemplary embodiments, the display device DD may include a backlight unit providing light to the display panel DP.

The display panel DP may include a display unit DM and a protective film layer PFL disposed between the display unit DM and the light sensing array layer LSL. In some exemplary embodiments, the display unit DM may include a substrate SUB, a pinhole array mask layer LBL, a pixel circuit layer PCL, a display element layer DPL, and a thin-film encapsulation layer TFE.

The substrate SUB may be a base substrate of the display panel DP and may be a substantially transparent or translucent substrate. According to some exemplary embodiments, the substrate SUB may be a rigid substrate including, for instance, glass or tempered glass, or a flexible substrate including, for instance, a plastic material. In some exemplary embodiments, the substrate SUB may be a flexible substrate.

According to some exemplary embodiments, the substrate SUB may include a display area DA corresponding to the display area DD_DA of the display device DD and a non-display area NDA corresponding to the non-display area DD_NDA of the display device DD as shown in FIGS. 1A and 1B. A plurality of pixel areas PXA in which one pixel PXL is provided and/or formed may be provided on the display area DA of the substrate SUB. For instance, the display area DA of the substrate SUB may include a plurality of pixel areas PXA. In some exemplary embodiments, at least one area in the display area DA of the substrate SUB may be set to the sensing area SA.

The pixel circuit layer PCL may be disposed on the other side (e.g., upper surface) of the substrate SUB and may include at least one conductive layer. For example, the pixel circuit layer PCL may include a plurality of circuit elements formed in each of the pixel areas PXA to constitute a pixel circuit of the corresponding pixel PXL, and lines for providing various signals and power for driving the pixels PXL. In this case, the pixel circuit layer PCL may include various circuit elements, such as at least one transistor and at least one capacitor, and a plurality of conductive layers for constituting lines connected thereto. In addition, the pixel circuit layer PCL may include at least one insulation layer provided between a plurality of conductive layers. In addition, the pixel circuit layer PCL may include a line unit that is disposed on the non-display area NDA of the substrate SUB and provides signals and/or power corresponding to lines connected to the pixels PXL.

The display element layer DPL may be disposed on the other side of the substrate SUB including the pixel circuit layer PCL. According to some exemplary embodiments, the display element layer DPL may include a plurality of light emitting elements LD connected to the circuit elements and/or lines of the pixel circuit layer PCL through contact holes and the like. In some exemplary embodiments, the display element layer DPL may include light emitting elements LD disposed at least one in each of the pixel areas PXA. For instance, the display element layer DPL may include a plurality of light emitting elements LD. In some exemplary embodiments, the light emitting elements LD may be organic light emitting diodes or ultra-small light emitting elements using a structure in which an inorganic crystal structure is grown.

In some exemplary embodiments, each pixel PXL may include circuit elements disposed in the pixel circuit layer PCL of each pixel area PXA and at least one light emitting element LD disposed in the pixel circuit layer PCL. A more detailed description of a structure of each pixel PXL will be provided later.

The thin-film encapsulation layer TFE may be disposed on the display element layer DPL to cover at least the display area DA of the substrate SUB.

The pinhole array mask layer LBL may be disposed between the display panel DP and the light sensing array layer LSL in the sensing area SA. For example, the pinhole array mask layer LBL may be disposed on the other side (e.g., upper surface) of the substrate SUB and disposed between the substrate SUB and the pixel circuit layer PCL. The pinhole array mask layer LBL may include a plurality of pinholes PIH and a light-blocking conductive pattern CP.

The light-blocking conductive pattern CP may be formed of a light-blocking and/or absorbing material. In some exemplary embodiments, the light-blocking conductive pattern CP may be formed of an opaque metal layer between adjacent pinholes PIH. The pinholes PIH may be empty spaces opened by removing at least one area of the light-blocking conductive pattern CP. The pinholes PIH may be through-holes passing through at least one area of the light-blocking conductive pattern CP.

The pinhole array mask layer LBL may include a plurality of pinholes PIH uniformly provided in a light-blocking conductive pattern CP to have a predetermined size and distance. Exemplary embodiments, however, are not limited thereto, and the size, shape, number, resolution, and/or arrangement structure of the pinholes PIH may be variously changed. For example, the pinholes PIH may be irregularly provided in the light-blocking conductive pattern CP.

The pinholes PIH may be formed at appropriate size and distance to sense more clearly the shape of a fingerprint, while preventing (or at least reducing) diffraction of incident light. For example, a width of each pinhole PIH may be set to about 10 times or more of the wavelength of the incident light to prevent diffraction of light. In addition, the distance between the pinholes PIH may be determined by a distance between the pinhole array mask layer LBL and the light sensing array layer LSL, a wavelength of incident light, and a viewing angle, e.g., field of view (FOV), for the pinholes PIH.

Some of light incident on the pinhole array mask layer LBL may be blocked by the light-blocking conductive pattern CP and other portions of the light may reach the light sensing array layer LSL under the pinhole array mask layer LBL through the pinholes PIH. The pinhole array mask layer LBL may selectively transmit light (hereinafter, referred to as reflected light) that is reflected on an object, for example, a fingerprint of a user, disposed on the display surface of the display device DD. The pinholes PIH described above may be optical holes, and each of the pinholes PIH may be a through-hole or a light hole.

According to some exemplary embodiments, the pinhole array mask layer LBL may constitute an optical system for controlling a path of light or the like by being disposed between the display element layer DPL where light emitting elements LD are disposed and the light sensing array layer LSL where optical sensors PSR are disposed, and selectively transmitting only some of the light in the display device DD described in association with FIGS. 1A, 1B, and 2A to 2E.

The pinhole array mask layer LBL may correspond to the display area DA of the substrate SUB and may have a size (or area) that is greater than or equal to the size of the display area DA, but exemplary embodiments are not limited thereto. According to some exemplary embodiments, the pinhole array mask layer LBL may have a size (or area) corresponding to at least one area of the display area DA of the substrate SUB, for example, the sensing area SA.

The protective film layer PFL may be disposed on one surface (e.g., the lower surface) of the substrate SUB. The protective film layer PFL may be bonded to the display unit DM through an adhesive layer (not shown). The protective film layer PFL may be bonded to the light sensing array layer LSL through another adhesive layer (not shown) including a transparent adhesive, such as an optically clear adhesive (OCA).

A selective light-blocking film SLBF may be disposed on a surface (e.g., the lower surface) of the protective film layer PFL.

The selective light-blocking film SLBF may block light in a determined (or specific) wavelength range, for example, light in the infrared wavelength region, of external light inflowing to the display device DD, thereby preventing (or at least reducing) the light in the infrared region from being incident on the optical sensors PSR of the light sensing array layer LSL. Although the selective light-blocking film SLBF is described as being provided on the lower surface of the protective film layer PFL, exemplary embodiments are not limited thereto. According to some exemplary embodiments, the selective light-blocking film SLBF may be provided anywhere in the display unit DM so long as the selective light-blocking film SLBF is disposed over (e.g., only over) the light sensing array layer LSL. In addition, the selective light blocking film SLBF may not be provided when a configuration for blocking light in the infrared region is included in the display unit DM.

The light sensing array layer LSL may be attached to one surface (e.g., lower surface) of the display panel DP to overlap with at least one area of the display panel DP. For example, the light sensing array layer LSL may be disposed to overlap with the display panel DP in at least the sensing area SA. The light sensing array layer LSL may include a plurality of optical sensors PSR distributed at predetermined resolutions and/or distance.

The optical sensors PSR of the light sensing array layer LSL may output an electrical signal corresponding to the reflected light received through the pinholes PIH as a sensing signal. The reflected light received by each optical sensor PSR may have different optical characteristics (e.g., frequency, wavelength, size, etc.) depending on whether the reflected light is formed by, for instance, a valley or a ridge of a fingerprint formed on the user's finger. In this manner, each of the optical sensors PSR may output a sensing signal having a different electrical characteristic corresponding to the optical characteristic of the reflected light. The sensing signals output by the optical sensors PSR may be converted into image data to be used to identify the user's fingerprint.

In some exemplary embodiments, the light sensing array layer LSL including the optical sensors PSR and the pinhole array mask layer LBL including the pinholes PIH may constitute the optical system of the fingerprint sensor in the sensing area SA. In addition, according to some exemplary embodiments, the pinhole array mask layer LBL may implement the display unit DM together with the pixel circuit layer PCL. In this case, the thickness of the display device DD having the fingerprint sensor of the light sensing type may be reduced or minimized. In addition, it is possible to prevent or reduce moiré patterns that may occur in the display device DD including the fingerprint sensor of the light sensing type by controlling the size, distance, and/or resolution of each of the light sensing array layer LSL including the optical sensors PSR and the pinhole mask array layer LBL including the pinholes PIH.

The touch sensor TS may be disposed on the display panel DP including the above-described configurations.

The touch sensor TS may be disposed on a surface where an image is emitted in (or displayed by) the display panel DP and receive a touch input (or interaction) of the user. The touch sensor TS may recognize a touch event of the display device DD through a user's hand or a separate input means, e.g., stylus. The touch sensor TS may include a plurality of touch electrodes and sensing lines electrically connected to the touch electrode.

The window WD may be a member disposed at the uppermost surface of the display device DD including the display panel DP and may be a substantially transparent or translucent substrate. The window WD may include a rigid or flexible substrate, and a constituent material of the window WD is not particularly limited.

Figure 6A:
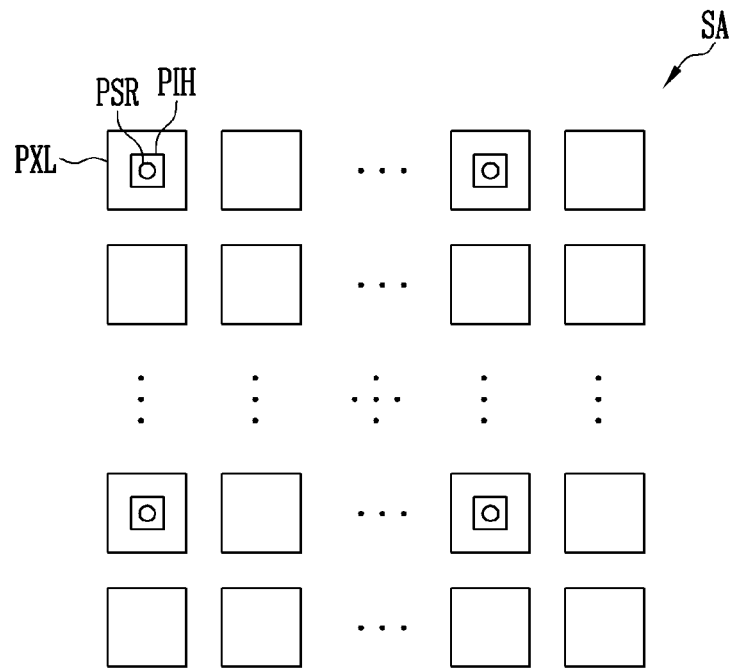
FIGS. 6A and 6B are plan views schematically illustrating arrangement structures of pixels, pinholes, and optical sensors according to various exemplary embodiments.
Figure 6B:
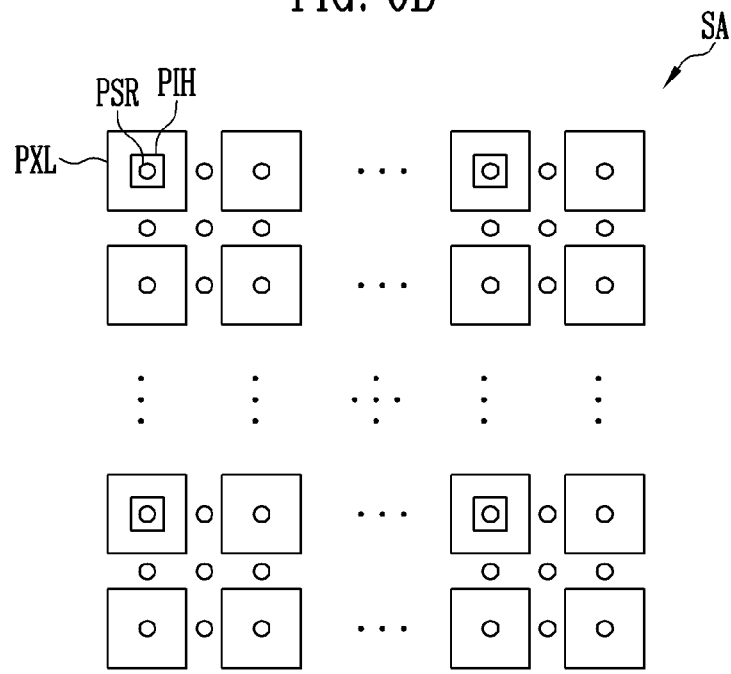

FIGS. 6A and 6B are plan views schematically illustrating arrangement structures of pixels, pinholes, and optical sensors according to various exemplary embodiments. For instance, FIGS. 6A and 6B illustrate various exemplary embodiments demonstrating relative sizes, resolutions, and/or disposition relationships of each of the pixels PXL, the pinholes PIH, and the optical sensors PSR disposed in the sensing area SA described in association with FIGS. 1A, 1B, and 2A to 2E.

Referring to FIGS. 6A and 6B, the sensing area SA may include a number of pinholes PIH and optical sensors PSR that is different from a number of the pixels PXL.

In some exemplary embodiments, the sensing area SA may include a smaller number of the pinholes PIH and the optical sensors PSR than the number of the pixels PXL, such as shown in FIG. 6A. In this case, each pinhole PIH and each optical sensor PSR may have a size smaller than a size of each pixel PXL, and the pinholes PIH and the optical sensors PSR may be distributed in the sensing area SA with a lower resolution than the pixels PXL. In addition, according to some exemplary embodiments, the pinholes PIH and the optical sensors PSR may be distributed in the sensing area SA at substantially equivalent number and distance to correspond one-to-one with each other. For example, the pinholes PIH and the optical sensors PSR may be disposed to overlap each other in pairs on a one-to-one basis. The pinholes PIH and the optical sensors PSR may have the same or different sizes. As such, the relative size and resolution of the pinholes PIH and the optical sensors PSR are not particularly limited.

According to some exemplary embodiments, the optical sensors PSR may be distributed in the sensing area SA to have a smaller size and a higher resolution than the pixels PXL and/or the pinholes PIH, such as shown in FIG. 6B. For example, the optical sensor PSR may overlap with the pinhole PIH and/or the pixel PXL. The pinholes PIH may be distributed in the sensing area SA with the same resolution as or different resolution from the pixels PXL.

As described above, the size, number, resolution, position, and/or arrangement structure with the pixels PXL of the pinholes PIH and/or the optical sensors PSR disposed in the sensing area SA may be variously changed. The arrangement structure of the pixels PXL, the pinholes PIH, and the optical sensors PSR are not limited to the exemplary embodiments shown in FIGS. 6A and 6B. For example, the shape, alignment form, relative size, number, resolution, and/or arrangement relationship of the pixels PXL, the pinholes PIH, and/or the optical sensors PSR disposed in the sensing area SA may be variously changed.

Figure 7:
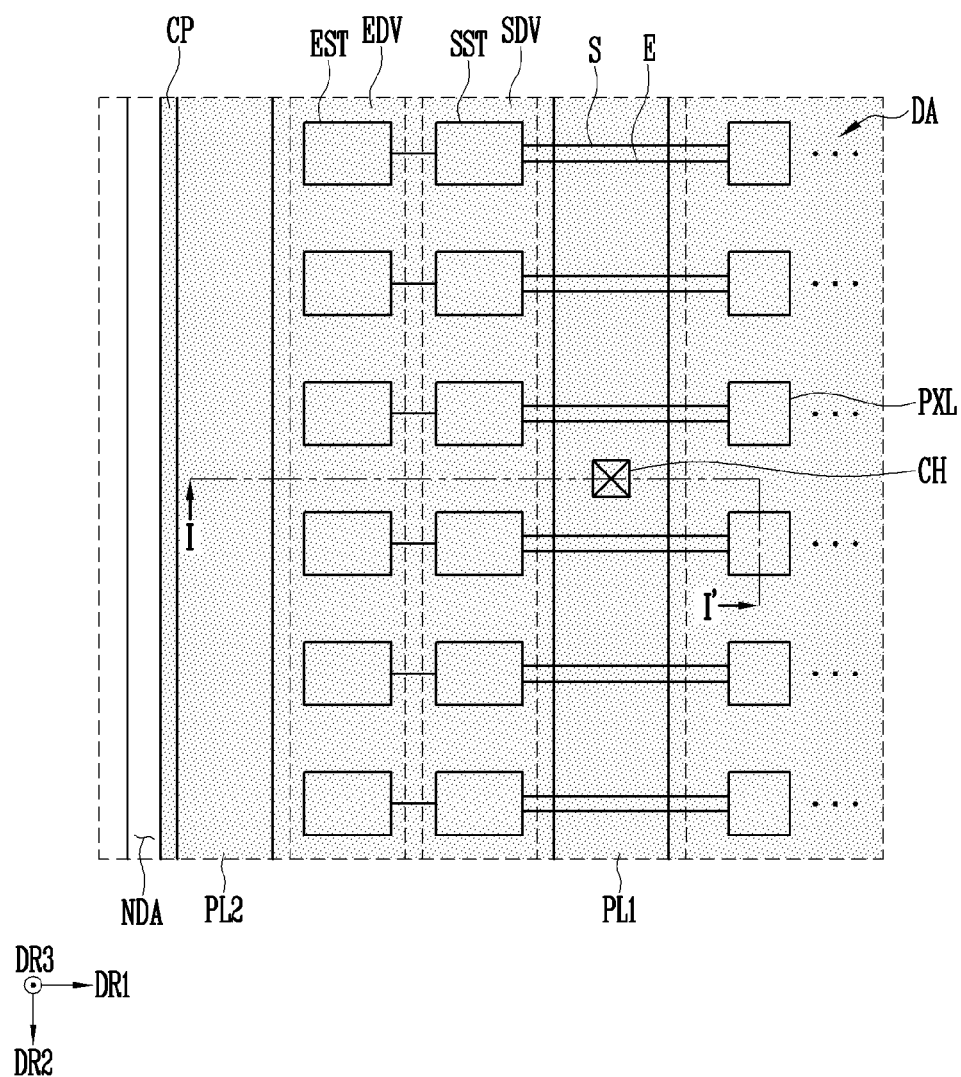
FIG. 7 is an enlarged plan view of a portion EA1 in FIG. 5 according to some exemplary embodiments.
Figure 8:
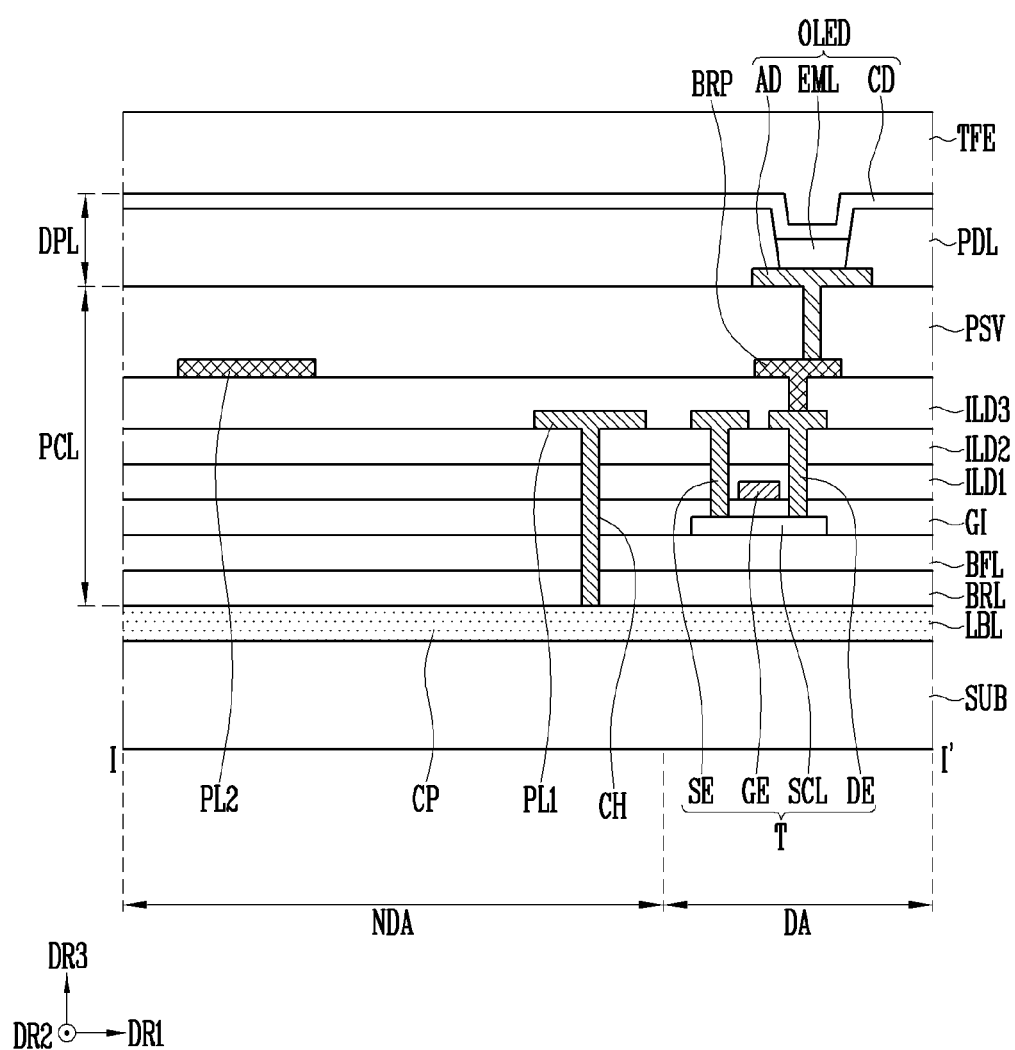
FIG. 8 is a cross-sectional view taken along sectional line I-I' in FIG. 7 according to some exemplary embodiments.

FIG. 7 is an enlarged plan view of a portion EA1 in FIG. 5 according to some exemplary embodiments. FIG. 8 is a cross-sectional view taken along sectional line I-I' in FIG. 7 according to some exemplary embodiments.

For convenience of description of a connection relationship between the pinhole array mask layer LBL and power lines disposed in the non-display area NDA of the substrate SUB, only a portion of the configurations included in each of the non-display area NDA and the display area DA of the substrate SUB are schematically illustrated in FIG. 7.

Referring to FIGS. 1A to 8, the substrate SUB may be partitioned into the display area DA and the non-display area NDA, and the pixels PXL may be disposed in the display area DA.

Each of the pixels PXL may be included in at least one pixel row that is arranged in a first direction DR1, and the pixel rows may be arranged (e.g., spaced apart from one another) in a second direction DR2. Each of the pixels PXL may be included in at least one pixel column that is arranged in the second direction DR2, and the pixel columns may be arranged in the first direction DR1. The pixels PXL may be arranged in a matrix formation in the display area DA, but exemplary embodiments are not limited thereto. Each of the pixels PXL will be described in more detail later.

The display area DA may have sides with a shape of a straight line, but may have sides with a shape of a curved line according to some exemplary embodiments. In FIG. 7, only one side of the display area DA is shown for convenience of description, but the other side of the display area DA may have substantially the same shape as the one side so that a shape of the display area DA is symmetrical; however, exemplary embodiments are not limited thereto.

A driver and a line unit may be disposed in the non-display area NDA of the substrate SUB. The driver may include at least one scan driver SDV connected to the pixels PXL through scan lines S and at least one light emission driver EDV connected to the pixels PXL through light emission control lines E.

The scan driver SDV may have a plurality of scan stages SST and each of scan stages SST may be connected to a corresponding one of the scan lines S. The scan lines S connect an output end of the scan stages SST and a scan signal input end of the outermost pixel PXL of the pixel row. The scan stages SST may operate in response to a clock signal. The scan stages SST may be implemented with a substantially equivalent circuit.

The light emission driver EDV may be provided adjacent to the scan driver SDV. The light emission driver EDV may include a plurality of light emitting stages EST. The light emission control lines E may connect the output ends of the light emitting stages EST and the light emitting signal input ends of the outermost pixel PXL of the pixel row. Each of the light emitting stages EST provides a light emission control signal to the pixels PXL disposed at the same pixel row.

Although not directly shown in the drawing, a data driver may be provided in the non-display area NDA of the substrate SUB. The data driver may transfer a data signal to each of the pixels PXL through a data line (not shown).

The line unit may include a first power line PL1 and a second power line PL2. The first power line PL1 and the second power line PL2 may be disposed in the non-display area NDA and may be provided in the form of surrounding a boundary of the display area DA. Each of the first and second power lines PL1 and PL2 may be electrically connected to the pixels PXL.

A first pixel power (e.g., ELVDD) may be transmitted to (or by) the first power line PL1, and a second pixel power (e.g., ELVSS) having a voltage level different from the first pixel power may be transmitted to the second power line PL2. The first power line PL1 may be electrically connected to a pixel power line provided to each of the pixels PXL. Accordingly, the first pixel power ELVDD transmitted to the first power line PL1 may be transferred to each of the pixels PXL. The second power line PL2 may be electrically connected to a conductive layer (e.g., a cathode included in a light emitting element OLED) provided commonly to the pixels PXL. Accordingly, the second pixel power ELVSS applied to the second power line PL2 may be transferred to each of the pixels PXL.

A pinhole array mask layer LBL, a pixel circuit layer PCL, a display element layer DPL, and a thin-film encapsulation layer TFE may be disposed on the substrate SUB.

The pinhole array mask layer LBL may be disposed on one surface of the substrate SUB to be disposed between the substrate SUB and the pixel circuit layer PCL. The pinhole array mask layer LBL may selectively transmit light reflected from an object disposed on the display surface of the display device DD, for example, a fingerprint of a user. For this purpose, the pinhole array mask layer LBL may include at least one pinhole PIH and a light-blocking conductive pattern CP. The pinhole array mask layer LBL may be provided to correspond to the display area DA and the non-display area NDA of the substrate SUB.

In describing the pixel circuit layer PCL, the display element layer DPL, and the thin-film encapsulation layer TFE, the configurations provided in the non-display area NDA of the substrate SUB will be described after describing the configurations provided in the display area DA of the substrate SUB.

The pixel circuit layer PCL may include a plurality of insulation layers, a plurality of conductive layers, and a semiconductor layer. The conductive layers of the pixel circuit layer PCL may constitute signal lines and/or pixel circuits. The pixel circuit layer PCL may include a barrier layer BRL, a buffer layer BFL provided and/or formed on the barrier layer BRL, and at least one transistor T provided and/or formed on the buffer layer BFL and included in a pixel circuit.

The barrier layer BRL may prevent or at least reduce (hereinafter referred to as prevent) moisture and/or oxygen from penetrating into a semiconductor layer SCL of the transistor T. In addition, the barrier layer BRL may prevent metal atoms and/or impurities from diffusing from the substrate SUB to the semiconductor layer SCL of the transistor T.

The buffer layer BFL may be provided and/or formed on the barrier layer BRL. The buffer layer BFL may prevent metal atoms and/or impurities from diffusing (e.g., outgassing) from the substrate SUB, and may control a heat transfer rate during a process of crystallizing the semiconductor layer SCL of the transistor T to obtain a substantially uniform active pattern. In addition, the buffer layer BFL may improve a surface flatness of the substrate SUB when a surface of the substrate SUB is not uniform. According to the type of the substrate SUB, two or more buffer layers BFL may be provided on the substrate SUB or no buffer layer BFL may be provided.

The transistor T included in the pixel circuit layer PCL may be provided in the display area DA. The transistor T may include a semiconductor layer SCL, a gate electrode GE, a first end SE and a second end DE. One of the first and second ends SE and DE may be a source electrode and the other of the first and second ends SE and DE may be a drain electrode of the transistor T. In some exemplary embodiments, the first end SE may be the source electrode and the second end DE may be the drain electrode.

The semiconductor layer SCL may be disposed on the buffer layer BFL. The semiconductor layer SCL may include a first region in contact with the first end SE and a second region in contact with the second end DE. A region between the first region and the second region may be a channel region. The semiconductor layer SCL may be a semiconductor pattern formed of, for instance, at least one of polysilicon, amorphous silicon, oxide semiconductor, and the like, but exemplary embodiments are not limited thereto. The channel region may be an intrinsic semiconductor pattern that is not doped with impurity. According to some exemplary embodiments, an impurity may include n-type impurities, p-type impurities, and/or other metals. The first and second regions may be impurity-doped semiconductor patterns.

The gate electrode GE may be provided and/or formed on the semiconductor layer SCL with the gate insulation layer GI interposed therebetween.

The first end SE may contact the first region of the semiconductor layer SCL through contact holes passing through first and second interlayer insulation layers ILD1 and ILD2 and the gate insulation layer GI, and the second end DE may contact the second region of the semiconductor layer SCL through other contact holes passing through the first and second interlayer insulation layers ILD1 and ILD2 and the gate insulation layer GI.

Although the first end SE and the second end DE of the transistor T are described as separate electrodes electrically connected to the semiconductor layer SCL, exemplary embodiments are not limited thereto. According to some exemplary embodiments, the first end SE of the transistor T may be one of the first and second regions of the semiconductor layer SCL, and the second end DE of the transistor T may be the other of the first and second regions of the semiconductor layer SCL.

A third interlayer insulation layer ILD3 may be provided and/or formed on the transistor T. The third interlayer insulation layer ILD3 may include a contact hole exposing a portion of a bridge pattern BRP provided and/or formed thereon. The bridge pattern BRP may be electrically connected to the second end DE of the transistor T through the contact hole included in the third interlayer insulation layer ILD3.

A passivation layer PSV may be provided and/or formed on the bridge pattern BRP. The passivation layer PSV may include a contact hole exposing a portion of the bridge pattern BRP.

The display element layer DPL may be disposed on the passivation layer PSV of the pixel circuit layer PCL and may include a light emitting element OLED emitting light.

The light emitting element OLED may include first and second electrodes AD and CD, and an emission layer EML provided between the first and second electrodes AD and CD. One of the first and second electrodes AD and CD may be an anode and the other may be a cathode of the light emitting element OLED. When the light emitting element OLED is an organic light emitting element of a front light emitting type, the first electrode AD may be a reflective electrode and the second electrode CD may be a transmissive electrode. In some exemplary embodiments, a case in which the light emitting element OLED is an organic light emitting element of the front light emitting type and the first electrode AD is an anode will be described as exemplary embodiment.

The first electrode AD may be electrically connected to the second end DE of the transistor T by being connected to the bridge pattern BRP through a contact hole passing through the passivation layer PSV. According to some exemplary embodiments, when the bridge pattern BRP is not provided, the first electrode AD may be directly electrically connected to the second end DE of the transistor T. The first electrode AD may be formed of a reflective layer (not shown) that may reflect light and a transparent conductive layer (not shown) that is disposed on or under the reflective layer. In this case, at least one of the transparent conductive layer and the reflective layer may be electrically connected to the second end DE of the transistor T.

The display element layer DPL may further include a pixel definition layer PDL having an opening exposing a portion of the first electrode AD, for example, an upper surface of the first electrode AD.

Each of the pixels PXL provided in the display panel DP may be disposed in a pixel area PXA on (or in) a plan view. In some exemplary embodiments, the pixel area PXA may include a light emitting area where light is emitted from the light emitting element OLED and a non-light emitting area adjacent to the light emitting area. The non-light emitting area may surround the light emitting area. In some exemplary embodiments, the light emitting area may be defined corresponding to a portion of a first electrode AD exposed by the opening of (or in) the pixel definition layer PDL.

The emission layer EML may be disposed on the upper surface of the first electrode AD exposed by the opening of the pixel definition layer PDL. The emission layer EML may have a multi-layered structure including at least a light generation layer. The emission layer EML may include a hole injection layer for injecting holes, a hole transport layer that has a relatively excellent hole transportability and blocks a migration of electrons that are not combined in the light generating layer to increase opportunities for recombination of holes and electrons, a light generation layer that generates (or emits) light by recombination of injected electrons and holes, a hole blocking layer for blocking a migration of holes that are not combined in the light generation layer, an electron transport layer for smoothly transporting electrons to the light generating layer, and an electron injection layer for injecting electrons.

The color of light generated in the light generation layer may be one of, for instance, red, green, blue, and white, but is not limited thereto. For example, the color of light generated in the light generating layer of the emission layer EML may be one of magenta, cyan, and yellow. The hole injection layer, the hole transport layer, the hole blocking layer, the electron transport layer, and the electron injection layer may be common layers connected to each other in the light emitting area adjacent to each other.

The thin-film encapsulation layer TFE covering the second electrode CD may be disposed on the second electrode CD.

The thin-film encapsulation layer TFE seals the display element layer DPL. The thin-film encapsulation layer TFE may be formed of a single layer, but may be formed of multiple layers. The thin-film encapsulation layer TFE may include a plurality of insulation layers covering the display element layer DPL including the light emitting elements OLED. The thin-film encapsulation layer TFE may include at least one inorganic layer and at least one organic layer. For example, the thin-film encapsulation layer TFE may have a structure in which the at least one inorganic layer and the at least one organic layer are alternately stacked. In some exemplary embodiments, the thin-film encapsulation layer TFE may be an encapsulation substrate disposed on a display element layer DPL and cemented with (or coupled to) a substrate SUB using a sealant.

The barrier layer BRL, the buffer layer BFL, the gate insulation layer GI, the first to third interlayer insulation layers ILD1 to ILD3, and the passivation layer PSV included in the pixel circuit layer PCL may also be provided to (or extend into) the non-display area NDA of the substrate SUB. In addition, the pixel definition layer PDL and the second electrode CD included in the display element layer DPL may be provided in the non-display area NDA of the substrate SUB. Similarly, the thin-film encapsulation layer TFE may also be provided in the non-display area NDA of the substrate SUB.

The first and second power lines PL1 and PL2 provided in the non-display area NDA of the substrate SUB may be included in the pixel circuit layer PCL and may be provided in different layers with the third insulation layer ILD3 interposed therebetween. According to some exemplary embodiments, the first power line PL1 and the second power line PL2 may be provided in the same layer.

The first power line PL1 may be provided and/or formed on the second interlayer insulation layer ILD2. The first power line PL1 may be electrically connected to the light-blocking conductive pattern CP of the pinhole array mask layer LBL through a contact hole CH passing through the barrier layer BRL, the buffer layer BFL, the gate insulation layer GI, and the first and second interlayer insulation layers ILD1 and ILD2 sequentially disposed in the non-display area NDA of the substrate SUB. When the first power line PL1 provided in the non-display area NDA of the substrate SUB is electrically connected to the light-blocking conductive pattern CP through the contact hole CH, the first pixel power ELVDD transmitted to the first power line PL1 may be transferred to the light-blocking conductive pattern CP.

The pinhole array mask layer LBL including the light-blocking conductive pattern CP may be provided in the form of a plate to correspond to the display area DA and the non-display area NDA of the substrate SUB, such as shown in FIG. 5. Accordingly, when the first power line PL1 and the light-blocking conductive pattern CP are electrically connected to each other through the contact hole CH in the non-display area NDA of the substrate SUB, the first pixel power ELVDD transmitted to the first power line PL1 may be supplied throughout the pinhole array mask layer LBL. When the first pixel power ELVDD having a constant voltage level is transmitted to a light-blocking conductive pattern CP, electrical characteristics of at least one transistor T provided in the pixel circuit layer PCL disposed in the display area DA of the substrate SUB may be changed. When electrical characteristics of at least one transistor T provided in the pixel circuit layer PCL changes according to a voltage level of the first pixel power ELVDD transmitted to the light-blocking conductive pattern CP, an amount of current flowing through the light emitting element OLED connected to the transistor T may change.

When the amount of current flowing through the light emitting element OLED changes, an amount (or intensity) of light emitted from the light emitting element OLED may change. For instance, when the amount (or intensity) of light emitted from the light emitting element OLED increases, the amount (or intensity) of reflected light incident on the pinholes PIH of the pinhole array mask layer LBL may increase, and, as a result, the amount (or intensity) of light reaching the optical sensors PSR provided in the light sensing array layer LSL through the pinholes PIH may also increase. Therefore, the optical sensors PSR disposed in the light sensing array layer LSL may output a sensing signal based on optical characteristics associated with a greater amount of reflected light, and the accuracy of, for instance, fingerprint sensing based on the sensing signal may be improved.

Figure 9:
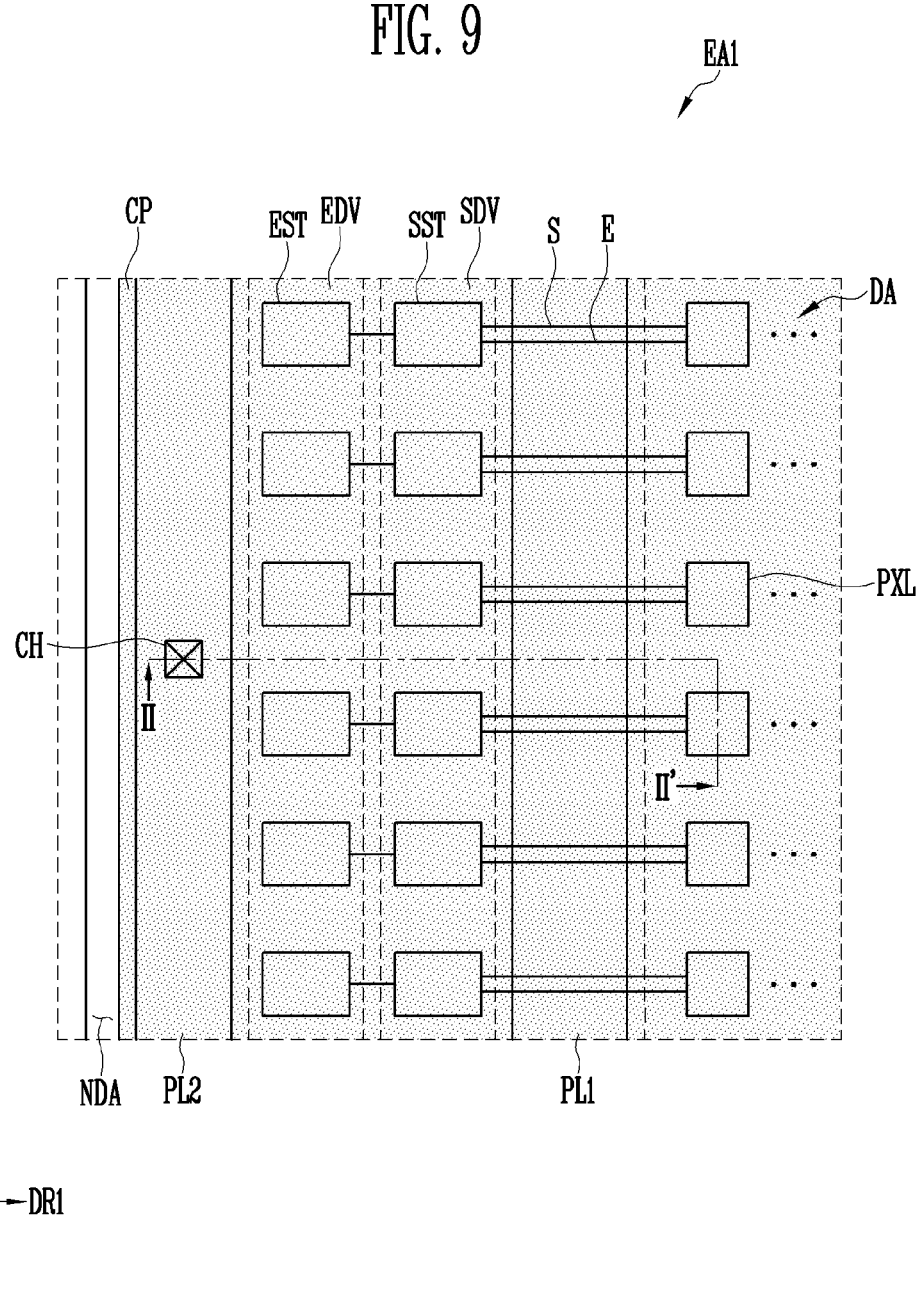
FIG. 9 is an enlarged plan view illustrating a portion EA1 in FIG. 5 according to some exemplary embodiments.
Figure 10:
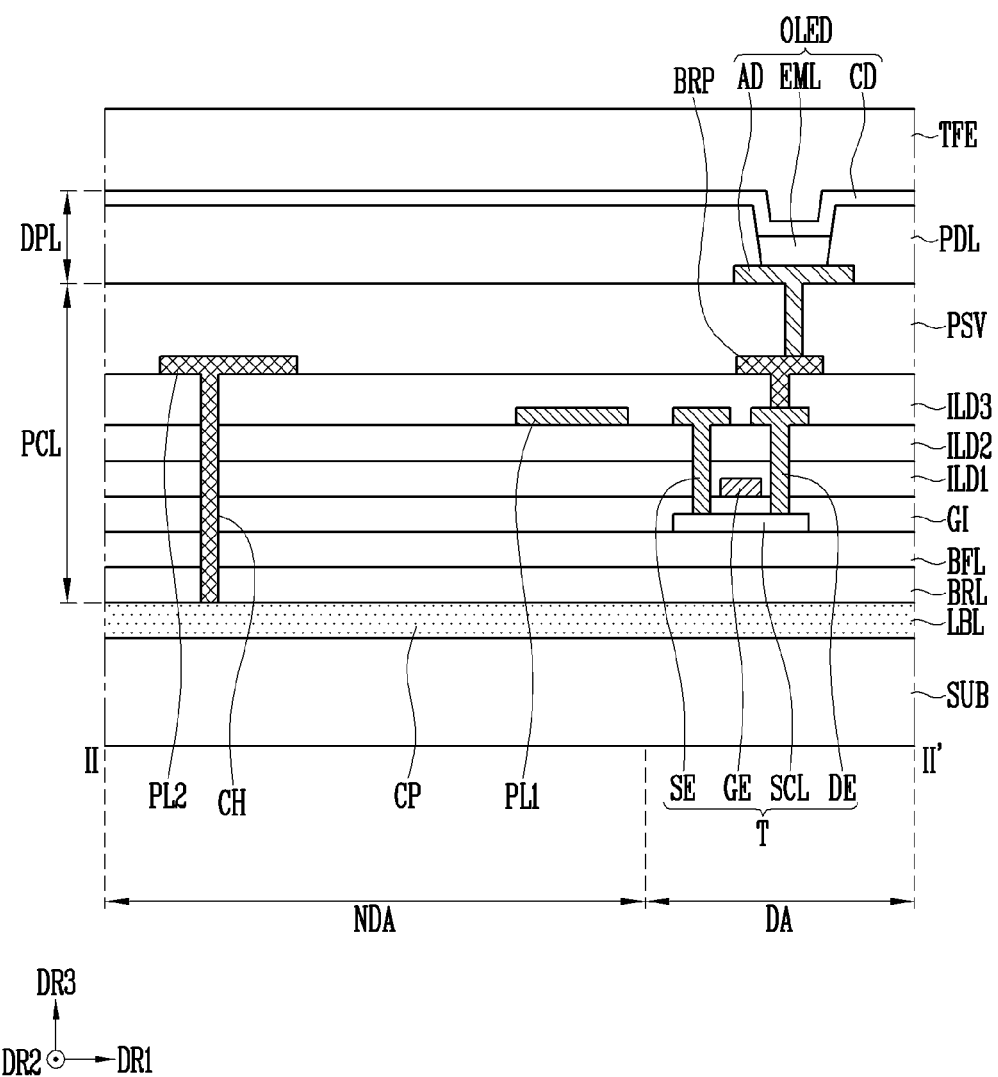
FIG. 10 is a cross-sectional view taken along sectional line II-II' in FIG. 9 according to some exemplary embodiments.

FIG. 9 is an enlarged plan view illustrating a portion EA1 in FIG. 5 according to some exemplary embodiments. FIG. 10 is a cross-sectional view taken along sectional line II-II' in FIG. 9 according to some exemplary embodiments.

One area of the display unit DM shown in FIGS. 9 and 10 may be substantially equivalent or similar to one area of the display unit DM shown in FIGS. 7 and 8, except that the second power line PL2 is electrically connected to the light-blocking conductive pattern CP through the contact hole CH. Thus, with respect to the exemplary embodiments described in association with FIGS. 9 and 10, to avoid redundant description, differences from the exemplary embodiments described in association with FIGS. 7 and 8 will be mainly described. Parts not specifically described in association with FIGS. 9 and 10 correspond to parts previously described and the same numbers denote the same constituent elements, and similar numbers denote similar constituent elements.

Referring to FIGS. 1A to 6B, 9, and 10, the substrate SUB may be partitioned into the display area DA and the non-display area NDA. The driver and the line unit including the first and second power lines PL1 and PL2 may be provided in the non-display area NDA.

The second power line PL2 may be disposed on the third interlayer insulation layer ILD3. The second power line PL2 may be provided on the same layer as the bridge pattern BRP provided in the pixel circuit layer PCL disposed in the display area DA of the substrate SUB, but exemplary embodiments are not limited thereto. According to some exemplary embodiments, the second power line PL2 may be provided in the same layer as at least one conductive layer provided in the pixel circuit layer PCL disposed in the display area DA.

The second power line PL2 may be electrically connected to the light-blocking conductive pattern CP of the pinhole array mask layer LBL through a contact hole CH passing through the barrier layer BRL, the buffer layer BFL, the gate insulation layer GI, and the first to third interlayer insulation layers ILD1 to ILD3 sequentially disposed in (or on) the non-display area NDA of the substrate SUB When the second power line PL2 provided in the non-display area NDA of the substrate SUB is electrically connected to the light-blocking conductive pattern CP through the contact hole CH, the second pixel power ELVSS transmitted to the second power line PL2 may be transferred to the light-blocking conductive pattern CP. When the second pixel power ELVSS having a constant voltage level is transmitted to a light-blocking conductive pattern CP, electrical characteristics of at least one transistor T provided in the pixel circuit layer PCL disposed in the display area DA of the substrate SUB may be changed. When the electrical characteristic of at least one transistor T provided in the pixel circuit layer PCL changes, an amount of current flowing through the light emitting element OLED connected to the transistor T may change, and the amount (or intensity) of reflected light incident on the pinholes PIH of the pinhole array mask layer LBL may change.

According to various exemplary embodiments, the light-blocking conductive pattern CP of the pinhole array mask layer LBL is electrically connected to line units provided on the non-display area NDA of the substrate SUB, for example, one of the first and second power lines PL1 and PL2 to receive the power (or signal) transmitted to the one power line, but exemplary embodiments are not limited thereto. According to some exemplary embodiments, the light-blocking conductive pattern CP of the pinhole array mask layer LBL may be electrically connected to a portion of constituent elements of the pixels PXL provided in the display area DA of the substrate SUB to receive signals (or voltages) transmitted to the constituent elements.

Hereinafter, exemplary embodiments in which the light-blocking conductive pattern CP of the pinhole array mask layer LBL is electrically connected to a portion of the constituent elements of the pixels PXL will be described.

Figure 11:
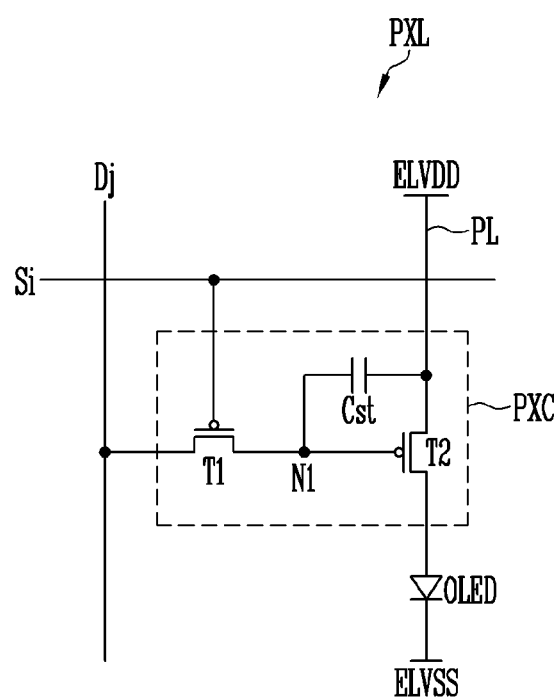
FIG. 11 is a circuit diagram illustrating an electrical connection relationship of constituent elements included in a pixel among pixels shown in FIGS. 1A and 1B according to some exemplary embodiments.

FIG. 11 is a circuit diagram illustrating an electrical connection relationship of constituent elements included in a pixel among pixels shown in FIGS. 1A and 1B according to some exemplary embodiments.

In FIG. 11, not only constituent elements included in each of pixels shown in each of FIGS. 1A and 1B, but also an area where the constituent elements are provided are referred to as a pixel PXL. According to some exemplary embodiments, the pixel PXL shown in FIG. 11 may be one of the pixels PXL provided in the display devices of FIGS. 1A and 1B, and the pixels PXL may have substantially the same or similar structure.

Referring to FIGS. 1A to 11, the pixel PXL may include a light emitting element OLED and a pixel circuit PXC for driving the light emitting element OLED. In some exemplary embodiments, the light emitting element OLED may refer to an organic light emitting diode.

The pixel circuit PXC may be connected to the scan line Si and data line Dj of the corresponding pixel PXL. For example, when the pixel PXL is disposed in the i-th row (where i is a natural number) and the j-th column (where j is a natural number) of the display area DD_DA of the display device DD, the pixel circuit PXC of the pixel PXL may be connected to the i-th scan line Si and the j-th data line Dj of the display area DA. According to some exemplary embodiments, the pixel circuit PXC may include first and second transistors T1 and T2 and a storage capacitor Cst. The structure of the pixel circuit PXC, however, is not limited to the exemplary embodiments described in association with FIG. 11.

A first transistor T1 (e.g., a switching transistor) is connected between the j-th data line Dj and a first node N1, and a gate electrode of the first transistor T1 is connected to the i-th scan line Si. This first transistor T1 is turned on when a scan signal having a gate-on voltage (e.g., a low voltage) is supplied from the i-th scan line Si. When the first transistor T1 is turned on, the j-th data line Dj and the first node N1 may be electrically connected.

A second transistor T2 (e.g., a driving transistor) is connected between the first pixel power ELVDD and the light emitting element OLED, and a gate electrode of the second transistor T2 is connected to the first node N1. The second transistor T2 controls the amount of current supplied from the first pixel power ELVDD to the second pixel power ELVSS via the light emitting element OLED in response to a voltage of the first node N1. The first pixel power ELVDD may be a high potential power, and the second pixel power ELVSS may be a low potential power.

The storage capacitor Cst is connected between the first pixel power ELVDD and the first node N1. This storage capacitor Cst charges a voltage corresponding to the data signal supplied to the first node N1 and, in some exemplary embodiments, maintains the charged voltage until the data signal of the next frame is supplied.

The light emitting element OLED is connected between the second transistor T2 and the second pixel power ELVSS. This light emitting element OLED may emit light at a luminance corresponding to the current controlled by the second transistor T2.

In FIG. 11, the pixel circuit PXC is shown including the first transistor T1 for transferring the data signal to the pixel PXL, the storage capacitor Cst for storing the data signal, and the second transistor T2 for supplying a driving current corresponding to the data signal to the light emitting element OLED. Exemplary embodiments, however, are not limited thereto, and the structure of the pixel circuit PXC may be variously changed. For example, the pixel circuit PXC may further include at least one transistor element, such as a transistor element for compensating a threshold voltage of the second transistor T2, a transistor element for initializing the first node N1, and/or a transistor element for controlling a light emitting time of the light emitting element OLED, or other circuit elements, such as a boosting capacitor, and the like for boosting a voltage of the first node N1. A pixel circuit PXC having this exemplary structure will be described later with reference to FIG. 19.

In addition, transistors included in the pixel circuit PXC, for example, the first and second transistors T1 and T2 are all shown as P-type transistors, but exemplary embodiments are not limited thereto. For instance, at least one of the first and second transistors T1 and T2 included in the pixel circuit PXC may be changed to an N-type transistor.

Figure 12:
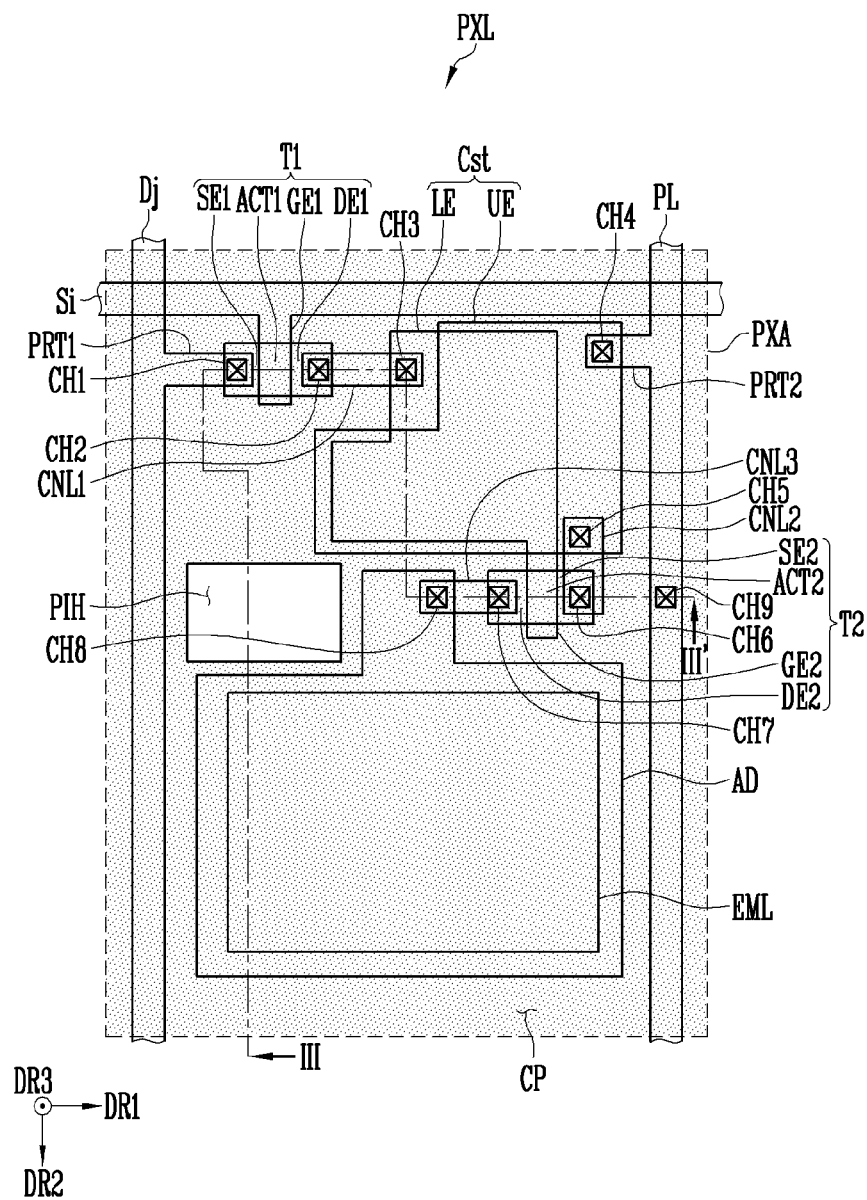
FIG. 12 is a plan view schematically illustrating the pixel of FIG. 11 according to some exemplary embodiments.
Figure 13:
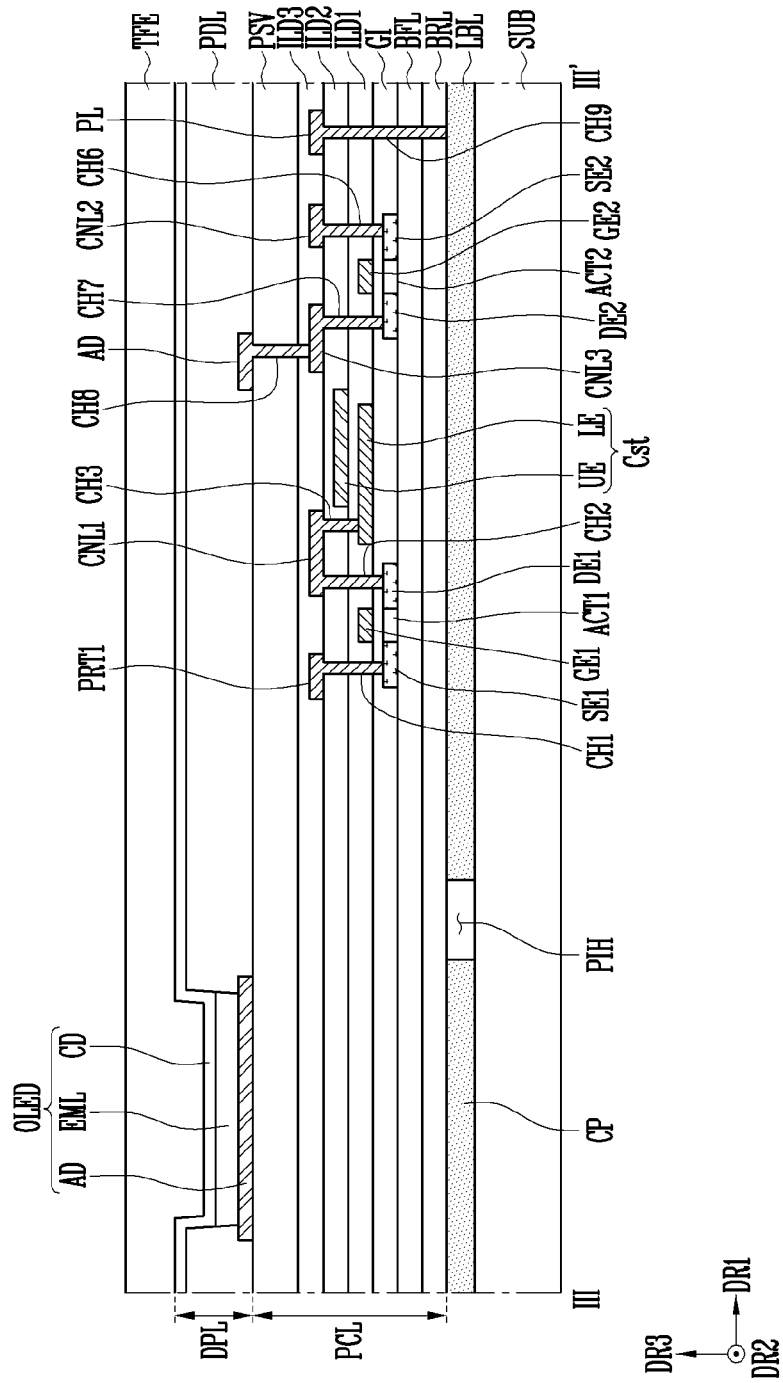
FIG. 13 is a cross-sectional view taken along sectional line III-III' in FIG. 12 according to some exemplary embodiments.

FIG. 12 is a plan view schematically illustrating the pixel of FIG. 11 according to some exemplary embodiments. FIG. 13 is a cross-sectional view taken along sectional line III-III' in FIG. 12 according to some exemplary embodiments. FIGS. 14A to 14D are graphs for illustrating a change in characteristics of a transistor in a pixel circuit layer due to a voltage transmitted to a light-blocking conductive pattern of FIG. 12 according to various exemplary embodiments.

In FIG. 12, one scan line Si, one pixel power line PL, and one data line Dj connected to one pixel PXL are shown with reference to a pixel PXL disposed in the i-th row and j-th column provided in the display area DD_DA of the display device DD. Further, in FIGS. 12 and 13, for convenience of description, the scan line of the i-th row is referred to as scan line Si, the data line of the j-th column is referred to as data line Dj, and the pixel power line of the j-th column is referred to as pixel power line PL. In addition, in FIGS. 12 and 13, the structure of one pixel PXL is simplified by showing each electrode only as a single electrode layer and each insulation layer only as a single insulation layer, but exemplary embodiments are not limited thereto. Moreover, with respect to the pixel PXL of FIGS. 12 and 13, to avoid redundant description, differences from the exemplary embodiments previously described will be mainly described. Parts not specifically described in association with FIGS. 12 and 13 follow the previously described exemplary embodiments, the same numbers denote the same constituent elements, and similar numbers denote similar constituent elements.

Referring to FIGS. 1A to 14D, one pixel PXL may be connected to a pixel line unit provided and/or formed on the display area DA of the substrate SUB.

The substrate SUB may include a display area DA corresponding to the display area DD_DA of the display device DD and a non-display area NDA corresponding to the non-display area DD_NDA of the display device DD. A plurality of pixel areas PXA in which one pixel PXL is provided in one pixel area PXA may be provided in the display area DA of the substrate SUB.

The pixel line unit may include a scan line Si, a data line Dj, and a pixel power line PL that transfer a signal to the pixel PXL, and may further include other lines as necessary.

The scan line Si may extend in the first direction DR1 on the substrate SUB. An i-th scan signal may be supplied to the scan line Si. The data line Dj may extend in the second direction DR2 on the substrate SUB and may transfer the data signal to the pixel PXL. The pixel power line PL may extend in a substantially equivalent direction to the data line Dj and may transfer the first pixel power ELVDD to the pixel PXL.

The pixel PXL may include a display element layer DPL including at least one light emitting element OLED, a pixel circuit layer PCL driving the light emitting element OLED, and a pinhole array mask layer LBL disposed between the pixel circuit layer PCL and the substrate SUB.

The pixel circuit layer PCL may include a pixel circuit PXC for driving a light emitting element OLED and a passivation layer PSV covering the pixel circuit PXC.

The pixel circuit PXC may include first and second transistors T1 and T2, as well as a storage capacitor Cst. The pixel circuit PXC may be provided and/or formed on the buffer layer BFL of the pixel circuit layer PCL.

The first transistor T1 may include a first gate electrode GE1, a first active pattern ACT1, a first source electrode SE1, and a first drain electrode DE1. The first gate electrode GE1 may be connected to the scan line Si. The first gate electrode GE1 may be provided as a portion of the scan line Si or as a shape protruding from the scan line S1.

The first active pattern ACT1, the first source electrode SE1, and the first drain electrode DE1 may be formed of a semiconductor layer in which no impurity is doped or an impurity is doped. For example, the first source electrode SE1 and the first drain electrode DE1 may be formed of a semiconductor layer in which the impurity is doped, and the first active pattern ACT1 may be formed of a semiconductor layer in which no impurity is doped.

The first active pattern ACT1 corresponds to a semiconductor layer overlapping with the first gate electrode GE1.

One end of the first source electrode SE1 is connected to the first active pattern ACT1, and the other end of the first source electrode SE1 is connected to a first protruding portion PRT1 through a first contact hole CH1 passing through the gate insulation layer GI, and the first and second interlayer insulation layers ILD1 and ILD2, sequentially. In some exemplary embodiments, the first protruding portion PRT1 may be provided in a shape protruded in the first direction DR1 from the data line Dj and may be provided integrally with the data line Dj. For instance, the first protruding portion PRT1 may be a portion of the data line Dj. As a result, the other end of the first source electrode SE1 may be connected to the data line Dj by the first contact hole CH1 and the first protruding portion PRT1.

One end of the first drain electrode DE1 is connected to the first active pattern ACT1, and the other end of the first drain electrode DE1 is connected to a first connection line CNL1 through a second contact hole CH2 passing through the gate insulation layer GI and the first and second interlayer insulation layers ILD1 and ILD2, sequentially.

One end of the first connection line CNL1 is connected to the first drain electrode DE1 through the first contact hole CH1, and the other end of the first connection line CNL1 is connected to the second gate electrode GE2 of the second transistor T2 through a third contact hole CH3 passing through the first and second interlayer insulation layers ILD1 and ILD2, sequentially.

The second transistor T2 may include the second gate electrode GE2, the second active pattern ACT2, the second source electrode SE2, and the second drain electrode DE2.

The second gate electrode GE2 may be connected to the first drain electrode DE1 of the first transistor T1 through the third contact hole CH3.

The second active pattern ACT2, the second source electrode SE2, and the second drain electrode DE2 may be formed of a semiconductor layer in which no impurity is doped or an impurity is doped. For example, the second source electrode SE2 and the second drain electrode DE2 may be formed of a semiconductor layer in which the impurity is doped, and the second active pattern ACT2 may be formed of a semiconductor layer in which no impurity is doped.

The second active pattern ACT2 corresponds to a semiconductor layer overlapping with the second gate electrode GE2.

One end of the second source electrode SE2 is connected to the second active pattern ACT2, and the other end of the second source electrode SE2 is connected to a second connection line CNL2 through a sixth contact hole CH6 passing through the gate insulation layer GI and the first and second interlayer insulation layers ILD1 and ILD2, sequentially.

One end of the second connection line CNL2 is connected to the second source electrode SE2 through the sixth contact hole CH6, and the other end of the second connection line CNL2 is connected to an upper electrode UE of the storage capacitor Cst through the fifth contact hole CH5 passing through the second interlayer insulation layer ILD2.

One end of the second drain electrode DE2 is connected to the second active pattern ACT2, and the other end of the second drain electrode DE2 is connected to a third connection line CNL3 through a seventh contact hole CH7 passing through the gate insulation layer GI and the first and second interlayer insulation layers ILD1 and ILD2, sequentially.

One end of the third connection line CNL3 is connected to the second drain electrode DE2 through the seventh contact hole CH7, and the other end of the third connection line CNL3 is connected to the first electrode AD of the display element layer DPL through an eighth contact hole CH8 passing through the third interlayer insulation layer ILD3 and the passivation layer PSV, sequentially.

The storage capacitor Cst may include a lower electrode LE and an upper electrode UE.

The lower electrode LE may be provided integrally with the second gate electrode GE2 of the second transistor T2. When the lower electrode LE is provided integrally with the second gate electrode GE2, the lower electrode LE may be a portion of the second gate electrode GE2.

The upper electrode UE may overlap the lower electrode LE and may cover the lower electrode LE in a plan view. A capacitance of the storage capacitor Cst may increase by widening an overlapped area between the upper electrode UE and the lower electrode LE. The upper electrode UE may be connected to the second protruding portion PRT2 through the fourth contact hole CH4 passing through the second interlayer insulation layer ILD2. The second protruding portion PRT2 may be provided in a shape protruded from the pixel power line PL in the first direction DR1 and may be provided integrally with the pixel power line PL. For instance, the second protruding portion PRT2 may be a portion of the pixel power line PL. The upper electrode UE may be connected to the pixel power line PL by the fourth contact hole CH4 and the second protruding portion PRT2. Accordingly, the first pixel power ELVDD transmitted to the pixel power line PL may be transferred to the upper electrode UE. In addition, the upper electrode UE may be connected to the second connection line CNL2 through the fifth contact hole CH5 and may be connected to the second source electrode SE2 through the second connection line CNL2.

The passivation layer PSV may be disposed on the first and second transistors T1 and T2 to cover the first and second transistors T1 and T2. The passivation layer PSV may be at least one of an inorganic insulation layer including an inorganic material and an organic insulation layer including an organic material.

Next, the display element layer DPL included in each of the pixels PXL will be described.

The display element layer DPL may include the light emitting element OLED disposed on the passivation layer PSV. The light emitting element OLED may include the first electrode AD, the second electrode CD, and the emission layer EML provided between the first and second electrodes AD and CD. The first electrode AD may be an anode, and the second electrode CD may be a cathode. The first electrode AD may be electrically connected to the second drain electrode DE2 of the second transistor T2 through an eighth contact hole CH8 and the third connection line CNL3.

The display element layer DPL may further include a pixel definition layer PDL having an opening exposing a portion of an upper surface of the first electrode AD.

The emission layer EML may be disposed on the exposed upper surface of the first electrode AD. The emission layer EML may be provided as a single layer, but may be provided as multiple layers including various functional layers. The second electrode CD may be disposed on the emission layer EML.

The thin-film encapsulation layer TFE may be provided and/or formed on the display element layer DPL.

The pinhole array mask layer LBL may be disposed between the display element layer DPL and the light sensing array layer LSL to selectively transmit incident light. For example, the pinhole array mask layer LBL may include at least one pinhole PIH and a light-blocking conductive pattern CP. The light-blocking conductive pattern CP may be disposed in an area between pinholes PIH adjacent to each other and may be formed of an opaque metal layer.

In some exemplary embodiments, the pixel power line PL may be provided for each pixel PXL and may be electrically connected to the first power line PL1 disposed in the non-display area NDA of the substrate SUB to receive the first pixel power ELVDD from the first power line PL1. The pixel power line PL may be provided in the same layer as the data line Dj. For example, the pixel power line PL may be provided and/or formed on the second interlayer insulation layer ILD2.

The pixel power line PL may be directly electrically connected to the light-blocking conductive pattern CP through a ninth contact hole CH9 passing through the barrier layer BRL, the buffer layer BFL, the gate insulation layer GI, and the first and second interlayer insulation layers ILD1 and ILD2, sequentially. When the pixel power line PL is electrically connected to the light-blocking conductive pattern CP through the ninth contact hole CH9, the first pixel power ELVDD transmitted to the pixel power line PL may be transferred to the light-blocking conductive pattern CP. When the first pixel power ELVDD is transmitted to the light-blocking conductive pattern CP, an electrical characteristic of at least one circuit element, for example, the first and second transistors T1 and T2 may change.

Figure 14A:
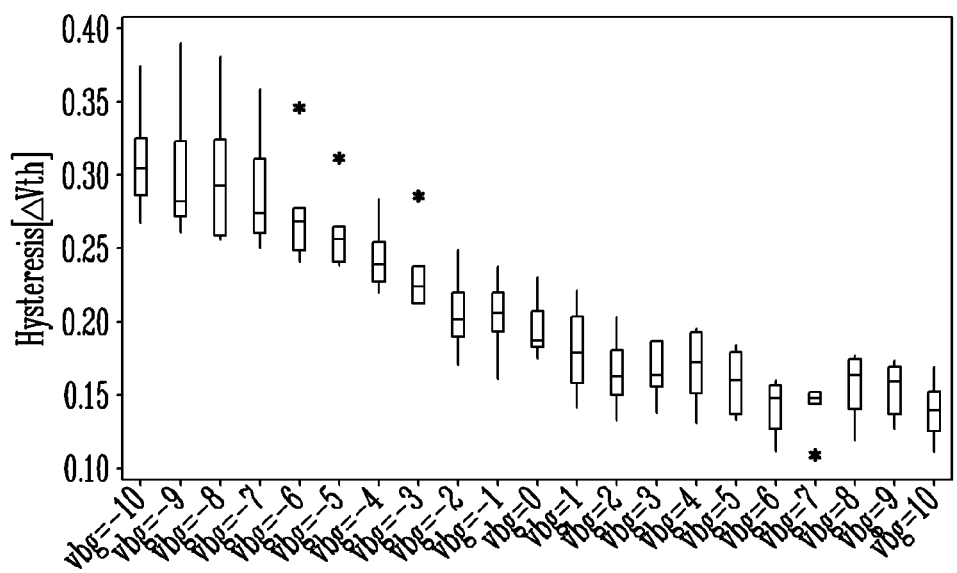
FIGS. 14A, 14B, 14C, and 14D are graphs for illustrating a change in characteristics of a transistor in a pixel circuit layer due to a voltage transmitted to a light-blocking conductive pattern of FIG. 12 according to various exemplary embodiments.
Figure 14B:
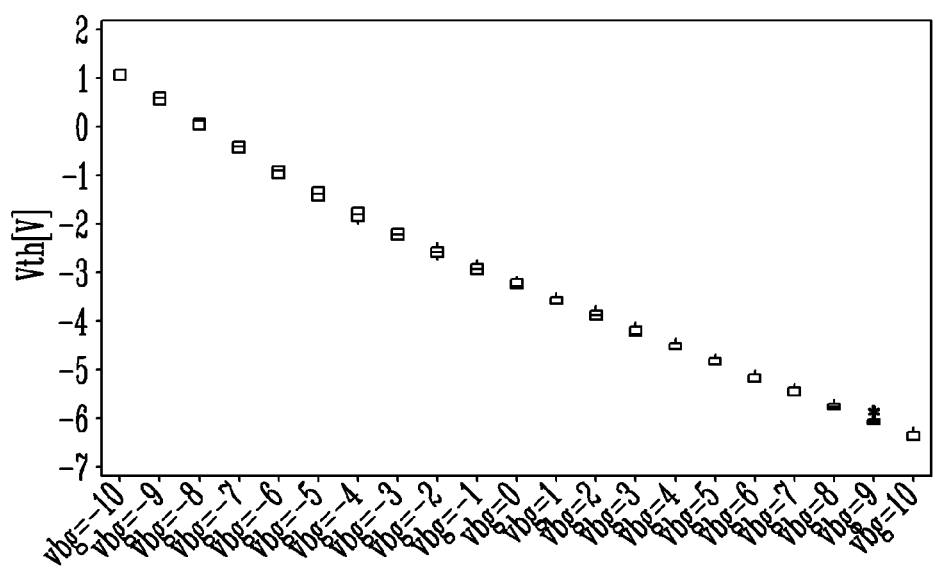
Figure 14C:
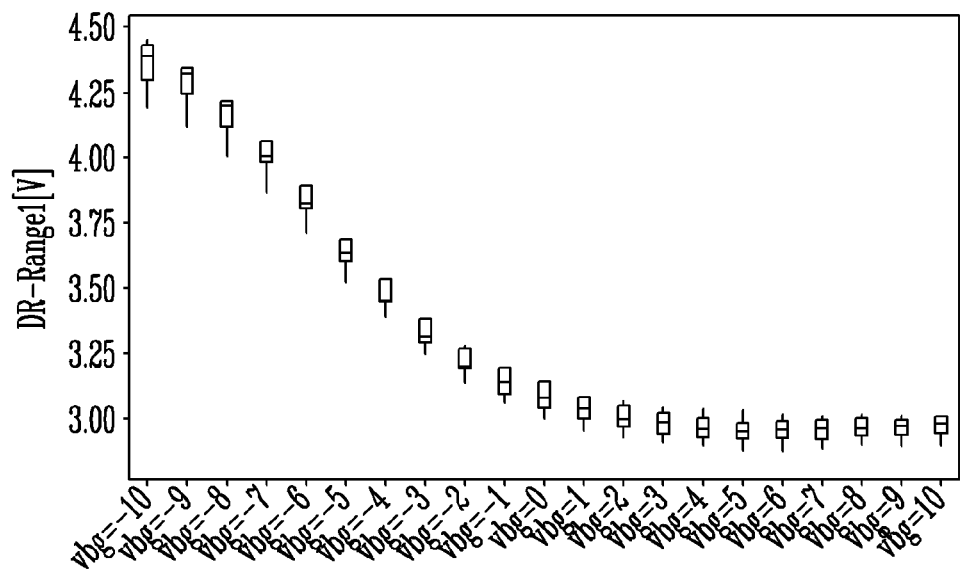
Figure 14D:
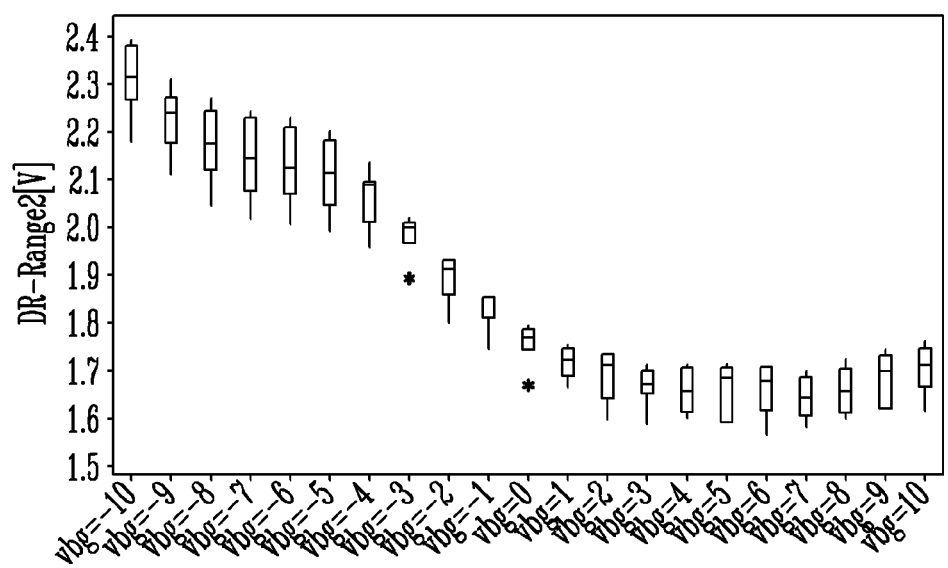

For example, as shown in FIG. 14A, since the electric field effect of the light-blocking conductive pattern CP is different according to the level of a predetermined voltage Vbg (e.g., first pixel power ELVDD) transmitted to the light-blocking conductive pattern CP, hysteresis characteristics of the first and second transistors T1 and T2 provided in the pixel circuit layer PCL may change. For instance, as the level of the predetermined voltage Vbg transmitted to the light-blocking conductive pattern CP increases, the hysteresis characteristics of each of the first and second transistors T1 and T2 each may be reduced. In addition, as shown in FIG. 14B, since the electric field effect of the light-blocking conductive pattern CP is different according to the level of the predetermined voltage Vbg transmitted to the light-blocking conductive pattern CP, threshold voltage characteristics of the first and second transistors T1 and T2 provided in the pixel circuit layer PCL may change. For example, as a level of a predetermined voltage Vbg transmitted to the light-blocking conductive pattern CP increases, the threshold voltages of the first and second transistors T1 and T2 may be reduced. In addition, as shown in FIGS. 14C and 14D, the gate driving range characteristic of each of the first and second transistors T1 and T2 provided in the pixel circuit layer PCL may change according to a level of a predetermined voltage Vbg applied to the light-blocking conductive pattern CP. For instance, as the level of a predetermined voltage Vbg transmitted to the light-blocking conductive pattern CP increases, a gate driving range of each of the first and second transistors T1 and T2 each gate may be reduced.

As described above, when the electrical characteristics of the first and second transistors T1 and T2 change according to the voltage level of the predetermined voltage Vbg transmitted to the light-blocking conductive pattern CP, the amount of current flowing through the light emitting element OLED connected to the second transistor T2 may change. As the amount of current flowing through the light emitting element OLED changes, the amount (or intensity) of light emitted from the light emitting element OLED may change. For instance, as the amount (or intensity) of light emitted from the light emitting element OLED increases, the amount (or intensity) of the reflected light incident on the pinholes PIH of the pinhole array mask layer LBL may increase, and, as a result, the amount (or intensity) of light reaching the optical sensors PSR provided in the light sensing array layer LSL through the pinholes PIH may also increase. Therefore, the optical sensors PSR disposed in the light sensing array layer LSL may output a sensing signal based on optical characteristics for a greater amount of reflected light, and the accuracy of, for instance, fingerprint sensing based on the sensing signal may be improved.

As described above, the display device DD according to some exemplary embodiments may apply a predetermined voltage, for example, the first pixel power ELVDD, to the light-blocking conductive pattern CP through the pixel power line PL disposed in the pixel area PXA of each pixel PX to generate an electric field effect between the light-blocking conductive pattern CP and at least one conductive layer adjacent thereto, thereby changing electrical characteristics of each of first and second transistors T1 and T2. The display device DD may change the electrical characteristics of each of the first and second transistors T1 and T2, for example, the threshold voltage, the hysteresis, and the driving range of the gate voltage to increase the amount (or intensity) of the reflected light incident on the pinhole array mask layer LBL and the light sensing array layer LSL constituting an optical system in the display device DD and improve the accuracy of, for example, fingerprint sensing using the optical system.

Figure 15:
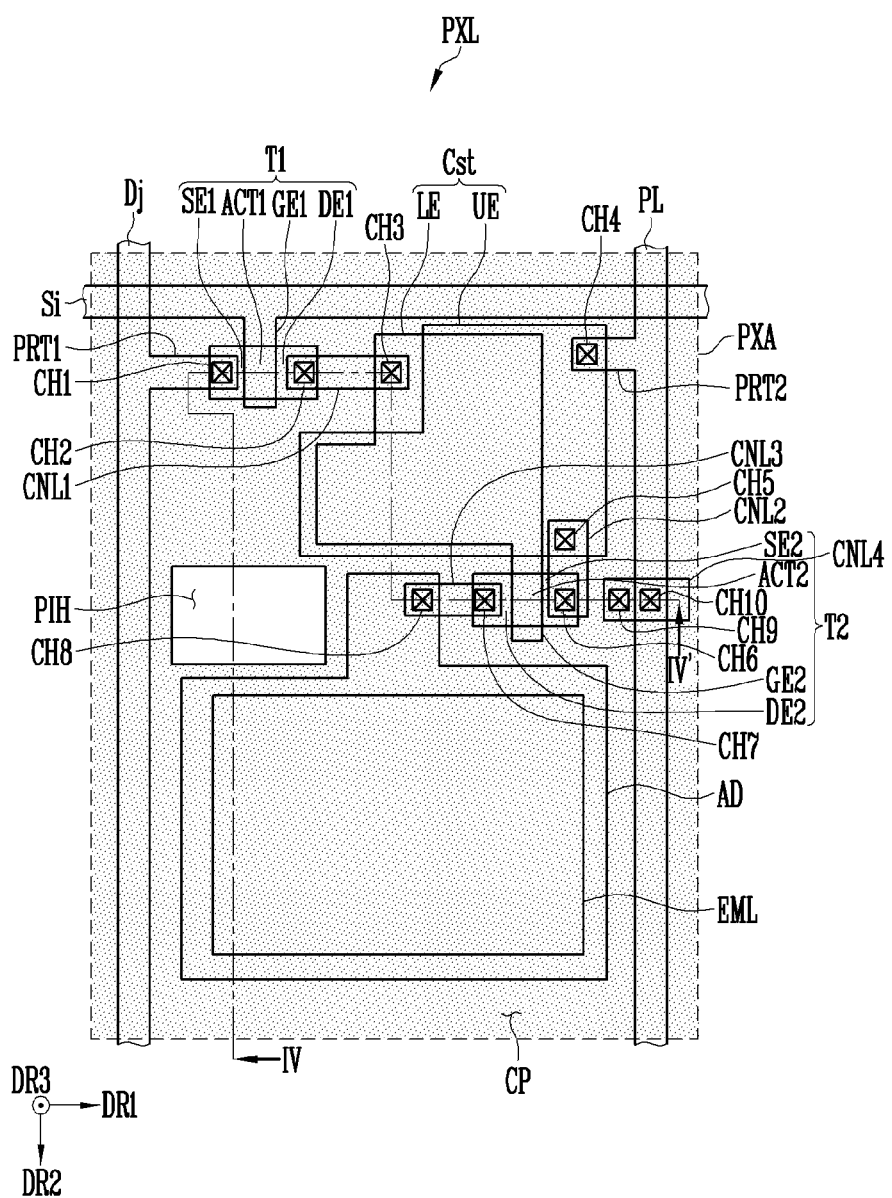
FIG. 15 is a plan view schematically illustrating a pixel of FIG. 11 according to some exemplary embodiments.
Figure 16:
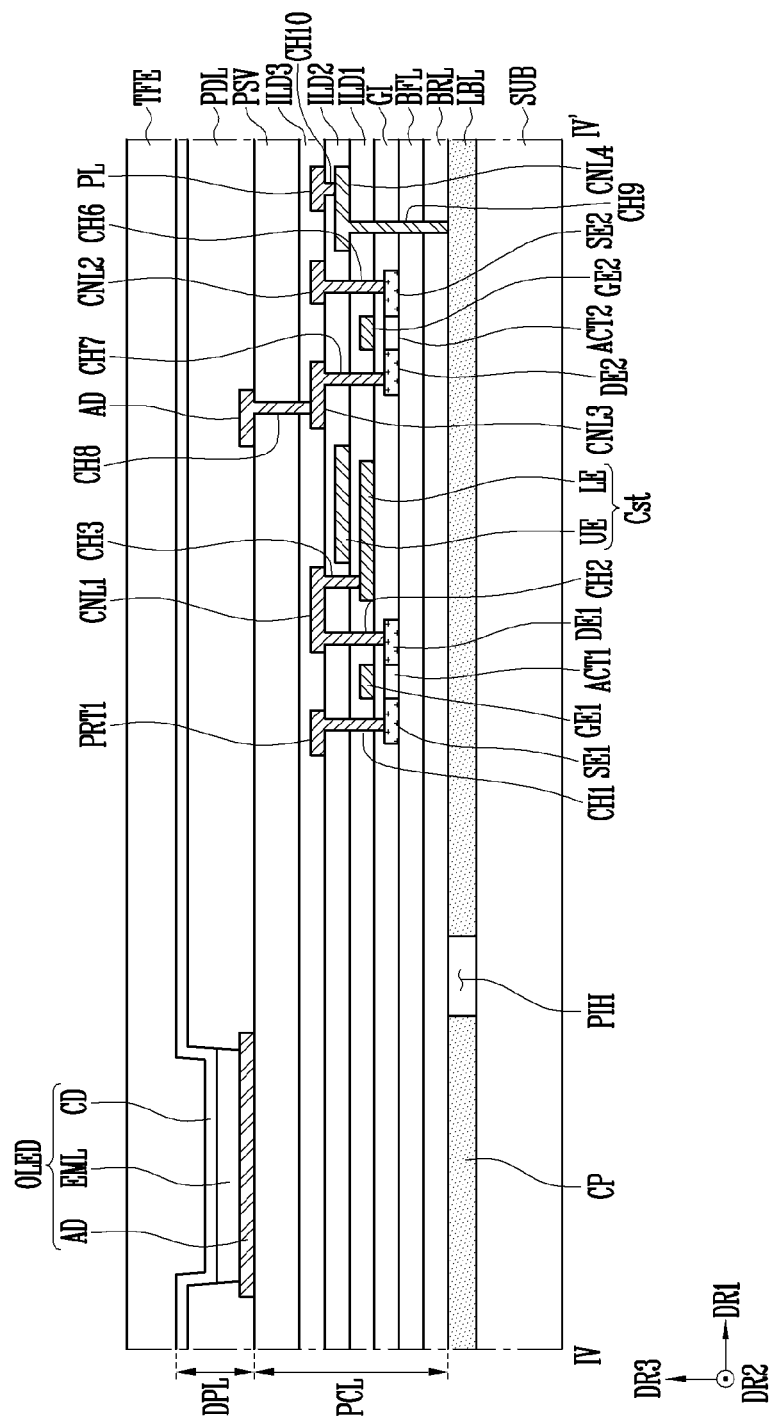
FIG. 16 is a cross-sectional view taken along sectional line IV-VI' in FIG. 15 according to some exemplary embodiments.

FIG. 15 is a plan view schematically illustrating a pixel of FIG. 11 according to some exemplary embodiments. FIG. 16 is a cross-sectional view taken along sectional line IV-VI' in FIG. 15 according to some exemplary embodiments.

One pixel PXL shown in FIGS. 15 and 16 may be substantially equivalent or similar to the pixel shown in FIGS. 12 and 13, except that the pixel power line PL in FIGS. 15 and 16 is electrically connected to the light-blocking conductive pattern CP through a separate connection line, e.g., a fourth connection line CNL4. Thus, with respect to the pixel PXL described in association with FIGS. 15 and 16, to avoid redundant description, differences from the exemplary embodiments previously described will be mainly described. Parts not described in association with FIGS. 15 and 16 follow at least one of the previously described exemplary embodiments, the same numbers denote the same constituent elements, and similar numbers denote similar constituent elements.

Referring to FIGS. 1A to 11, 15, and 16, one pixel PXL may be connected to the scan line Si, the data line Dj, and the pixel power line PL.

The pixel power line PL may extend in the second direction DR2 of the substrate SUB, and the first pixel power ELVDD may be transmitted to the pixel power line PL. In some exemplary embodiments, the pixel power line PL may be electrically connected to the light-blocking conductive pattern CP provided in a pinhole array mask layer LBL through a fourth connection line CNL4.

One end of the fourth connection line CNL4 may be connected to the pixel power line PL through a tenth contact hole CH10 passing through the second interlayer insulation layer ILD2. The other end of the fourth connection line CNL4 may be connected to the light-blocking conductive pattern CP through a ninth contact hole CH9 passing through the barrier layer BRL, the buffer layer BFL, the gate insulation layer GI, and the first interlayer insulation layer ILD1, sequentially.

The fourth connection line CNL4 may be provided and/or formed on the first interlayer insulation layer ILD1 to be disposed on the same layer as the upper electrode UE of the storage capacitor Cst; however, exemplary embodiments are not limited thereto. According to some exemplary embodiments, the fourth connection line CNL4 may be disposed on one of the insulation layers provided in the pixel circuit layer PCL within a range that makes electrical connection between the light-blocking conductive pattern CP and the pixel power line PL.

Since the pixel power line PL and the light-blocking conductive pattern CP are electrically connected to each other through the fourth connection line CNL4, the first pixel power ELVDD transmitted to the pixel power line PL may be transmitted to the light-blocking conductive pattern CP.

When the first pixel power ELVDD is transmitted to the light-blocking conductive pattern CP, the electrical characteristics of each of at least one circuit element, for example, the first and second transistors T1 and T2, provided in the pixel circuit layer PCL may change. When the electrical characteristics of each of the first and second transistors T1 and T2 are changed by the first pixel power ELVDD transmitted to the light-blocking conductive pattern CP, the amount of current flowing through the light emitting element OLED may change and the amount (or intensity) of light emitted from the light emitting element OLED may change. This may improve the accuracy of, for example, fingerprint sensing via at least the optical sensors PSR of the light sensing array layer LSL.

Figure 17:
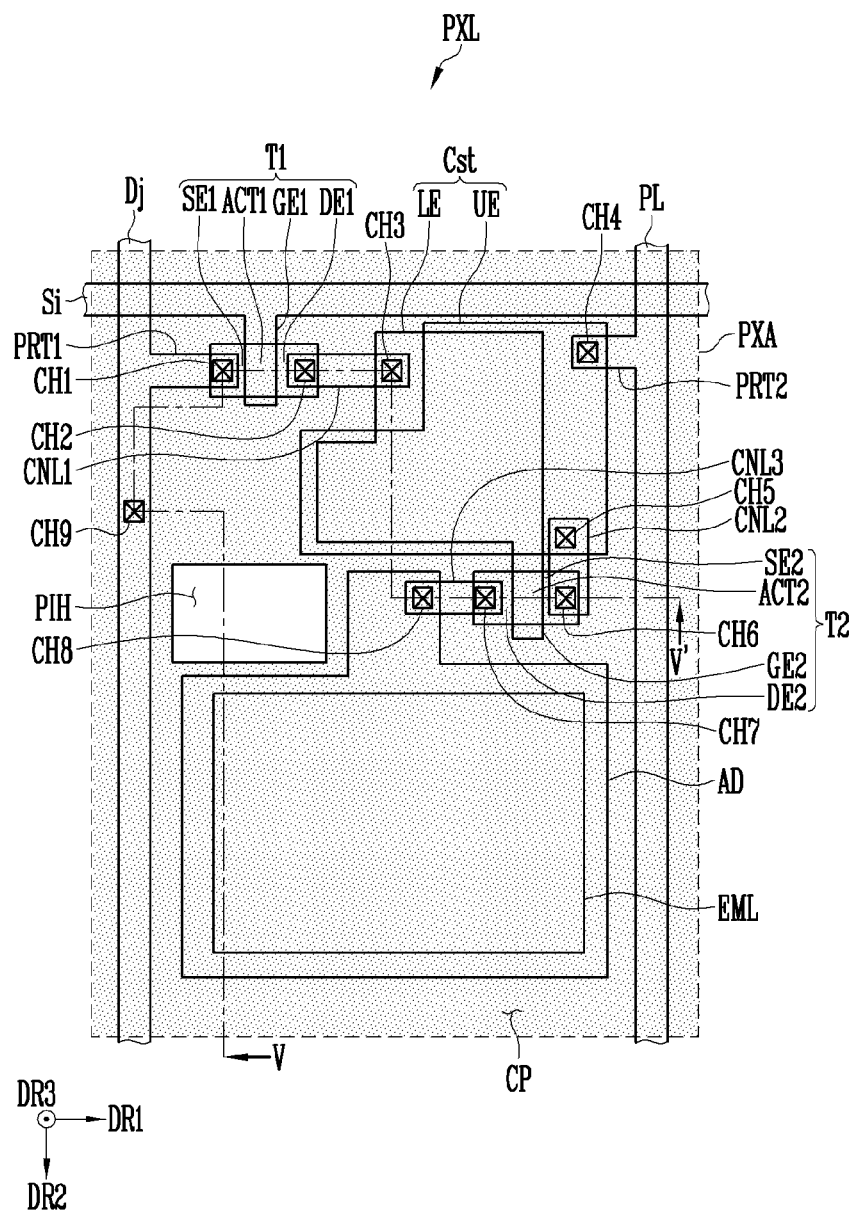
FIG. 17 is a plan view schematically illustrating a pixel of FIG. 11 according to some exemplary embodiments.
Figure 18:
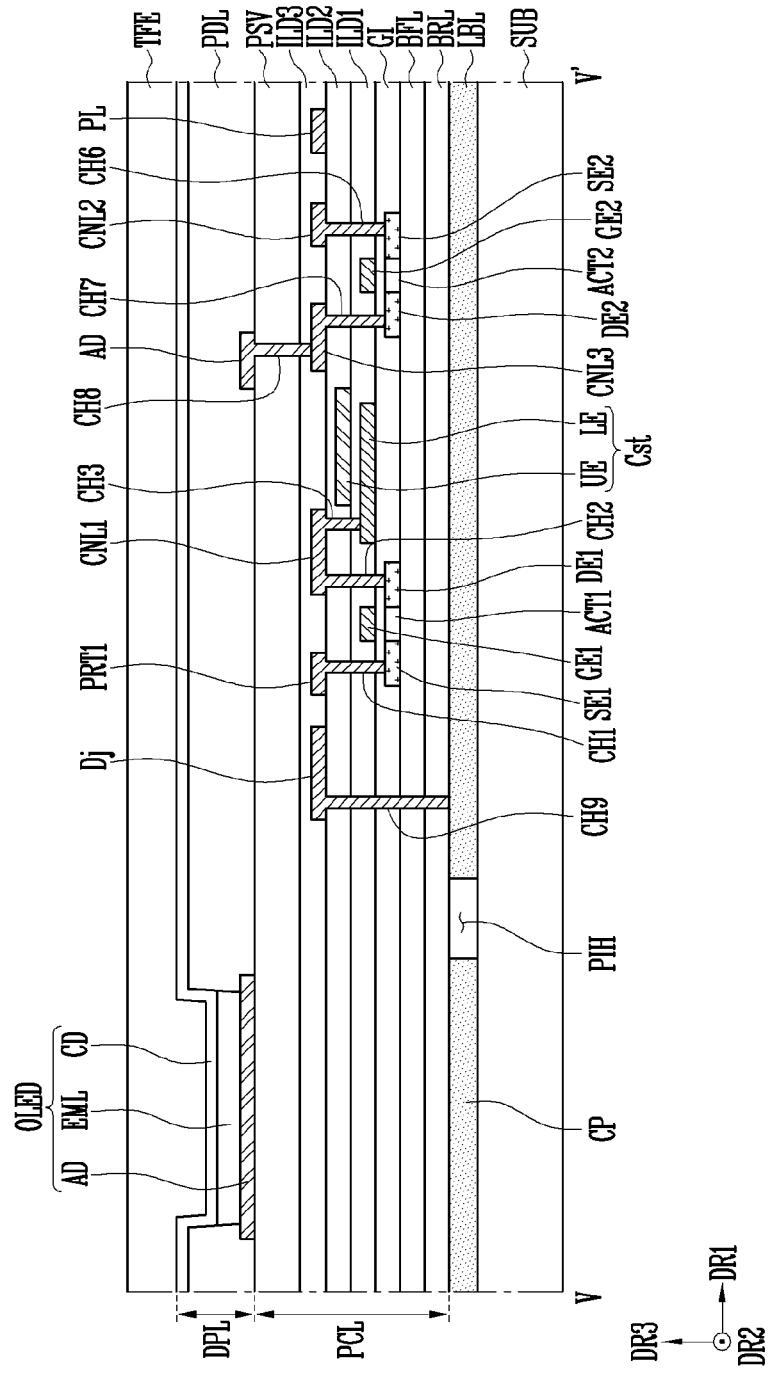
FIG. 18 is a cross-sectional view taken along sectional line V-V' in FIG. 17 according to some exemplary embodiments.

FIG. 17 is a plan view schematically illustrating a pixel of FIG. 11 according to some exemplary embodiments. FIG. 18 is a cross-sectional view taken along sectional line V-V' in FIG. 17 according to some exemplary embodiments.

One pixel PXL shown in FIGS. 17 and 18 may be substantially equivalent or similar to the pixel shown in FIGS. 12 and 13, except that the data line Dj is directly electrically connected to the light-blocking conductive pattern CP. Thus, with respect to the pixel PXL described in association with FIGS. 17 and 18, to avoid redundant description, differences from the exemplary embodiments previously described will be mainly described. Parts not described in association with FIGS. 17 and 18 follow at least one of the previously described exemplary embodiments, the same numbers denote the same constituent elements, and similar numbers denote similar constituent elements.

Referring to FIGS. 1A to 11, 17, and 18, one pixel PXL may be connected to the scan line Si, the data line Dj, and the pixel power line PL.

The data line Dj may extend in the second direction DR2 of the substrate SUB and a data signal may be transmitted to the data line Dj. In some exemplary embodiments, the data line Dj may include a first protruding portion PRT1 extending in the first direction DR1.

The first protruding portion PRT1 may be provided integrally with the data line Dj to be electrically and/or physically connected to the data line Dj. When the first protruding portion PRT1 is provided integrally with the data line Dj, the first protruding portion PRT1 may be a portion of the data line Dj; however, exemplary embodiments are not limited thereto. In some exemplary embodiments, the first protruding portion PRT1 may be formed separately from the data line Dj without being provided integrally with the data line Dj, and may be electrically connected to the data line Dj using a separate connection means and/or the like.

One end of the first protruding portion PRT1 is connected to the data line Dj and the other end of the first protruding portion PRT1 is connected to the first source electrode SE1 of the first transistor T1 through the first contact hole CH1 passing through the gate insulation layer GI and the first and second interlayer insulation layers ILD1 and ILD2, sequentially.

The data line Dj may be provided in the same layer as the pixel power line PL. In some exemplary embodiments, the data line Dj may be disposed on the second interlayer insulation layer ILD2. The data line Dj may be directly electrically connected to the light-blocking conductive pattern CP through the ninth contact hole CH9 passing through the barrier layer BRL, the buffer layer BFL, the gate insulation layer GI, and the first and second interlayer insulation layers ILD1 and ILD2, sequentially. Accordingly, the data signal transmitted to the data line Dj may be transmitted to the light-blocking conductive pattern CP.

When the data signal is transmitted to the light-blocking conductive pattern CP, the electrical characteristics of at least one circuit element provided in the pixel circuit layer PCL, for example, each of the first and second transistors T1 and T2 may change. When the electrical characteristics of each of the first and second transistors T1 and T2 are changed by a data signal transmitted to the light-blocking conductive pattern CP, the amount of current flowing through the light emitting element OLED may change and the amount (or intensity) of light emitted from the light emitting element OLED may change. This may improve the accuracy of, for example, fingerprint sensing via at least the optical sensors PSR of the light sensing array layer LSL.

Figure 19:
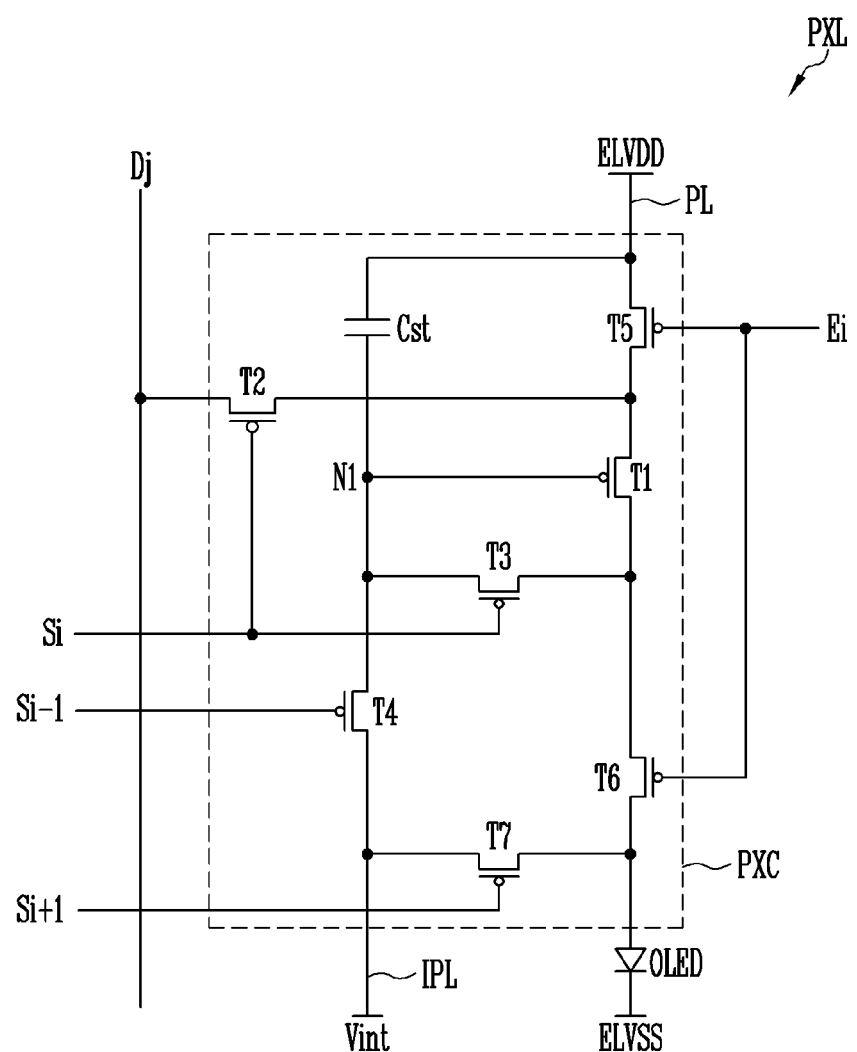
FIG. 19 is a circuit diagram illustrating an electrical connection relationship of constituent elements included in a pixel among pixels shown in FIGS. 1A and 1B according to some exemplary embodiments.

FIG. 19 is a circuit diagram illustrating an electrical connection relationship of constituent elements included in a pixel among pixels shown in FIGS. 1A and 1B according to some exemplary embodiments.

In FIG. 19, not only constituent elements included in each of pixels PXL shown in each of FIGS. 1A and 1B, but also an area where the constituent elements are provided are referred to as a pixel PXL. According to some exemplary embodiments, the pixel PXL shown in FIG. 19 may be one of the pixels PXL provided in the display devices DD of FIGS. 1A and 1B, and the pixels PXL may have substantially the same or similar structure.

Referring to FIGS. 1A to 10 and 19, each of the pixels PXL may include a light emitting element OLED and a pixel circuit PXC for driving the light emitting element OLED. In some exemplary embodiments, the light emitting element OLED may refer to an organic light emitting diode.

The pixel circuit PXC may be connected to the scan line Si and data line Dj of the corresponding pixel PXL. For example, when the pixel PXL is disposed in the i-th row (where i is a natural number) and the j-th column (where j is a natural number) of the display area DD_DA of the display device DD, the pixel circuit PXC of the pixel PXL may be connected to the i-th scan line Si and the j-th data line Dj of the display area DA. In addition, according to some exemplary embodiments, the pixel circuit PXC may be further connected to at least one other scan line. For example, one pixel PXL disposed in the i-th row of the display area DA of the display device DD may be further connected to the i−1-th scan line Si−1 and/or the i+1-th scan line Si+1. In addition, according to some exemplary embodiments, the pixel circuit PXC may be further connected to a third power in addition to the first and second pixel powers ELVDD and ELVSS. For example, the pixel circuit PXC may be also connected to the initialization power Vint.

The pixel circuit PXC may include the first to seventh transistors T1 to T7 and the storage capacitor Cst.

One electrode of the first transistor T1 (e.g., a driving transistor), for example, the source electrode, may be connected to the first pixel power ELVDD via the fifth transistor T5, and the other electrode of the first transistor T1, for example, the drain electrode, may be connected to the light emitting element OLED via the sixth transistor T6. The gate electrode of the first transistor T1 may be connected to the first node N1. This first transistor T1 controls the driving current flowing between the first pixel power ELVDD and the second pixel power ELVSS via the light emitting element OLED in response to a voltage of the first node N1.

The second transistor T2 (e.g., a switching transistor) may be connected between the j-th data line Dj connected to the pixel PXL and the source electrode of the first transistor T1. The gate electrode of the second transistor T2 may be connected to the i-th scan line Si connected to the pixel PXL. When a scan signal of a gate-on voltage (e.g., a low voltage) is supplied from the i-th scan line Si, the second transistor T2 may be turned on to electrically connect the j-th data line Dj to the source electrode of the first transistor T1. When the second transistor T2 is turned on, the data signal supplied from the j-th data line Dj is transferred to the first transistor T1.

The third transistor T3 may be connected between the drain electrode of the first transistor T1 and the first node N1. The gate electrode of the third transistor T3 may be connected to the i-th scan line Si. When a scan signal of a gate-on voltage is supplied from the i-th scan line Si, the third transistor T3 may be turned on to electrically connect the drain electrode of the first transistor T1 and the first node N1.

The fourth transistor T4 may be connected between the first node N1 and the initialization power line IPL to which the initialization power Vint is transmitted. The gate electrode of the fourth transistor T4 may be connected to the previous scan line, for example, the i−1-th scan line Si−1. When a scan signal of a gate-on voltage is supplied to the i−1-th scan line Si−1, the fourth transistor T4 may be turned on to transfer a voltage of the initialization power Vint to the first node N1. The initialization power Vint may have a voltage lower than the lowest voltage of the data signal.

The fifth transistor T5 may be connected between the first pixel power ELVDD and the first transistor T1. The gate electrode of the fifth transistor T5 may be connected to a corresponding light emission control line, for example, an i-th light emission control line Ei. The fifth transistor T5 may be turned off when the light emission control signal of a gate-off voltage is supplied to the i-th light emission control line Ei, and may be turned on in other cases.

The sixth transistor T6 may be connected between the first transistor T1 and the light emitting element OLED. A gate electrode of the sixth transistor T6 may be connected to the i-th light emission control line Ei. The sixth transistor T6 may be turned off when the light emission control signal of the gate-off voltage is supplied to the i-th light emission control line Ei, and may be turned on in other cases.

The seventh transistor T7 may be connected between the light emitting element OLED and the initialization power line IPL. A gate electrode of the seventh transistor T7 may be connected to one of the next scan lines, for example, the i+1-th scan line Si+1. The seventh transistor T7 is turned on when a scan signal of a gate-on voltage is supplied to the i+1-th scan line Si+1 to supply a voltage of the initialization power Vint to the light emitting element OLED.

The storage capacitor Cst may be connected between the first pixel power ELVDD and the first node N1. The storage capacitor Cst may store a voltage corresponding to a data signal supplied to the first node N1 during each frame period and a threshold voltage of the first transistor T1.

An anode of the light emitting element OLED may be connected to the first transistor T1 via the sixth transistor T6, and a cathode of the light emitting element OLED may be connected to the second pixel power ELVSS. The light emitting element OLED may generate light of a predetermined luminance corresponding to the amount of current supplied from the first transistor T1. The first pixel power ELVDD transmitted to the pixel power line PL may be set to a higher voltage than the second pixel power ELVSS so that a current may flow through the light emitting element OLED. A potential difference between the first pixel power ELVDD and the second pixel power ELVSS may be set to more than the threshold voltage of the light emitting element OLED during the light emitting period of the pixel PXL.

Figure 20:
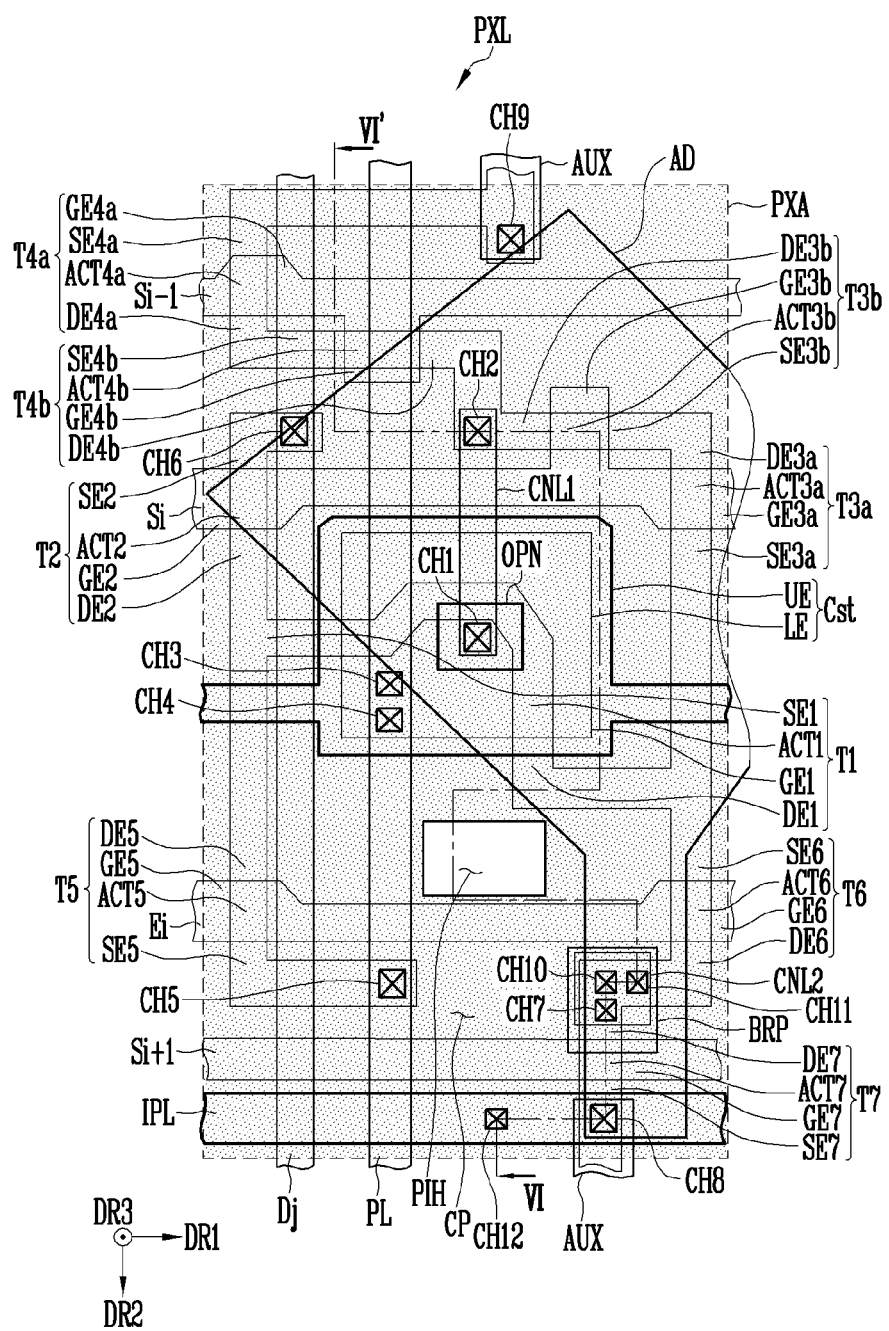
FIG. 20 is a plan view schematically illustrating the pixel of FIG. 19 according to some exemplary embodiments.
Figure 21:
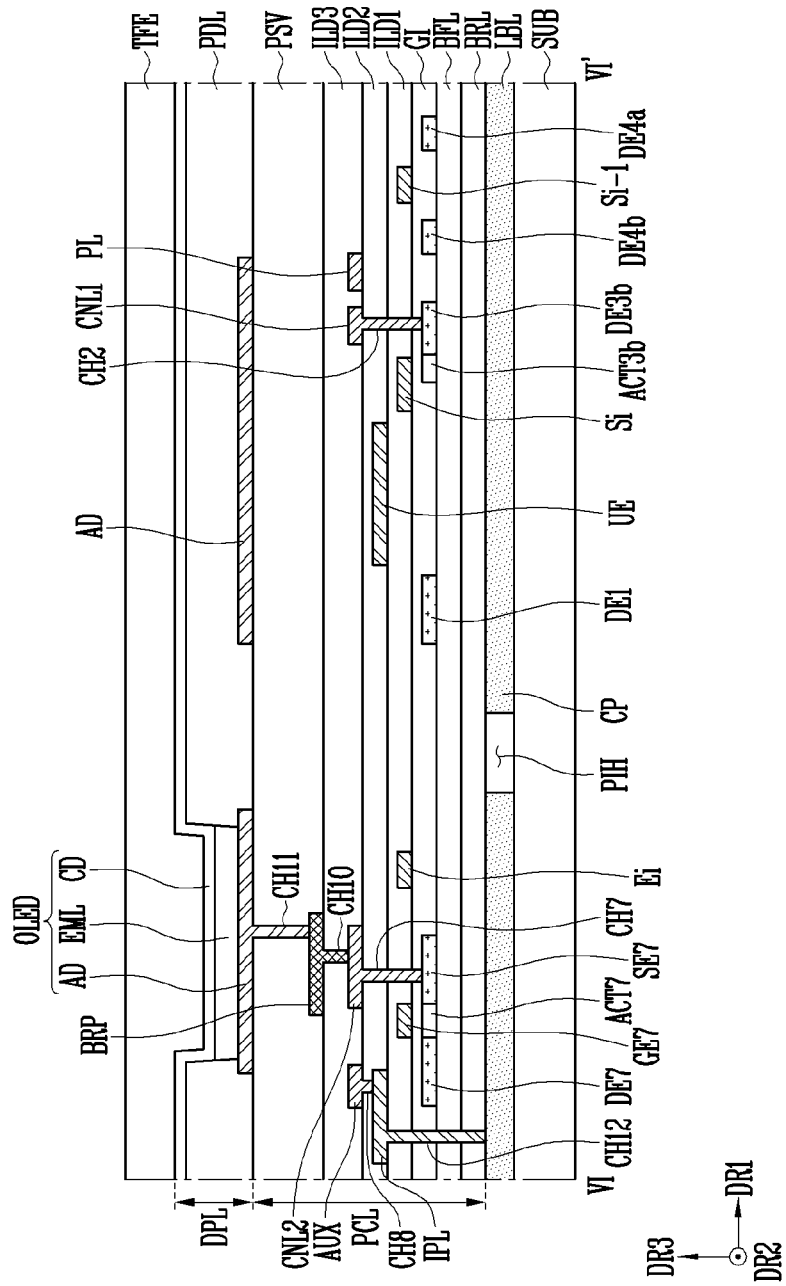
FIG. 21 is a cross-sectional view taken along sectional line VI-VI' in FIG. 20 according to some exemplary embodiments.

FIG. 20 is a plan view schematically illustrating the pixel of FIG. 19 according to some exemplary embodiments. FIG. 21 is a cross-sectional view taken along sectional line VI-VI' in FIG. 20 according to some exemplary embodiments.

For instance, FIG. 20 is a plan view illustrating in more detail the structure of the pixel shown in FIG. 19. The pixel PXL shown in FIGS. 20 and 21 may have a similar configuration to the pixel shown in FIGS. 11 and 12, except that the pixel PXL further includes a transistor element for compensating a threshold voltage of a driving transistor, a circuit element for initialization, and/or a transistor element for controlling a light emitting time of a light emitting element. Thus, with respect to the pixel PXL of FIGS. 20 and 21, to avoid redundant description, differences from the exemplary embodiments previously described will be mainly described. Parts not described in association with FIGS. 20 and 21 follow at least one of the previously described exemplary embodiments, the same numbers denote the same constituent elements, and similar numbers denote similar constituent elements.

In FIGS. 20 and 21, for convenience of description, a scan line of the i−1-th row is referred to as the i−1-th scan line Si−1, a scan line of the i-th row is referred to as the i-th scan line Si, and a scan line of the i+1-th row is referred to as the i+1-th scan line Si+1, of the scan lines Si−1, Si, and Si+1 to which a scan signal is transmitted, among the lines connected to the pixel PXL. In addition, the light emission control line of the i-th row that a light emission control signal is transmitted is referred to as a light emission control line Ei. The data line of the j-th column to which a data signal is transmitted is referred to as a data line Dj, and the pixel power line of the j-th column to which a first pixel power ELVDD is transmitted is referred to as a pixel power line PL. In addition, in FIGS. 20 and 21, the structure of the pixel PXL is simplified by illustrating each electrode as a single electrode layer and each insulation layer as a single insulation layer, but exemplary embodiments are not limited thereto.

Referring to FIGS. 1 to 10 and 19 to 21, one pixel PXL may be connected to a pixel line unit provided and/or formed on the substrate SUB.

The substrate SUB may include a display area DA and a non-display area NDA. The display area DA of the substrate SUB may include a pixel area PXA where each pixel PXL is provided.

The pixel line unit may include scan lines Si−1, Si, and Si+1 for transferring a scan signal to the pixel PXL, a light emission control line Ei for transferring a light emission control signal, a data line DL for transferring a data signal, an initialization power line IPL for transferring initialization power Vint, and a pixel power line PL for transferring a first pixel power ELVDD. It is also contemplated that the pixel line unit may further include other lines.

The scan lines Si−1, Si, and Si+1 may extend in the first direction DR1 on the substrate SUB and may be provided to the pixel PXL. The scan lines Si−1, Si, and Si+1 may include the i−1-th scan line Si−1, the i-th scan line Si, and the i+1-th scan line Si+1 arranged sequentially in the second direction DR2. Each of scan lines Si−1, Si, and Si+1 may receive a scan signal. For example, the i−1-th scan line Si−1 may receive the i−1-th scan signal, the i-th scan line Si may receive the i-th scan signal, and the i+1-th scan line Si+1 may receive the i+1-th scan signal. The scan lines Si−1, Si, and Si+1 may be provided and/or formed on the gate insulation layer GI, but exemplary embodiments are not limited thereto. The gate insulation layer GI may be an inorganic insulation layer including an inorganic material.

The light emission control line Ei may extend in the first direction DR1 on the substrate SUB and may transfer a light emission control signal to the pixel PXL. The light emission control line Ei may be disposed in the same layer as the scan lines Si−1, Si, and Si+1 and may include the same material as the scan lines Si−1, Si, and Si+1. The light emission control line Ei may be provided and/or formed on the gate insulation layer GI, but exemplary embodiments are not limited thereto.

The data line Dj may extend in the second direction DR2 crossing extending directions of the scan lines Si−1, Si, and Si+1 on the substrate SUB. A data signal may be transmitted to the data line Dj. The data line Dj may be provided and/or formed on the second interlayer insulation layer ILD2, but exemplary embodiments are not limited thereto. The second interlayer insulation layer ILD2 may be at least one of an inorganic insulation layer including an inorganic material and an organic insulation layer including an organic material.

The pixel power line PL may extend in substantially the same direction as the data line Dj on the substrate SUB. The first pixel power ELVDD may be transmitted to the pixel power line PL. The pixel power line PL may be disposed on the same layer as the data line Dj and may include the same material as the data line Dj. The pixel power line PL may be provided and/or formed on the second interlayer insulation layer ILD2, but exemplary embodiments are not limited thereto. According to some exemplary embodiments, the pixel power line PL may be provided and/or formed on a different layer from the data line Dj, for example the third interlayer insulation layer ILD3.

The initialization power line IPL may extend in the first direction DR1 on the substrate SUB, but is not limited thereto. The initialization power Vint may be applied to the initialization power line IPL. The initialization power line IPL may be provided and/or formed on the first interlayer insulation layer ILD1, but is not limited thereto.

The pixel PXL may include a display element layer DPL including at least one light emitting element OLED, a pixel circuit layer PCL driving the light emitting element OLED, and a pinhole array mask layer LBL disposed between the pixel circuit layer PCL and the substrate SUB.

The pinhole array mask layer LBL may be disposed between the display element layer DPL and the light sensing array layer LSL to selectively transmit incident light and may include at least one pinhole PIH and a light-blocking conductive pattern CP. The light-blocking conductive pattern CP may be formed of a material that blocks and/or absorbs light incident on the pinhole array mask layer LBL. In some exemplary embodiments, the light-blocking conductive pattern CP may be formed of an opaque metal layer.

The pixel circuit layer PCL may include a pixel circuit PXC for driving a light emitting element OLED and a passivation layer PSV covering the pixel circuit PXC.

The pixel circuit PXC may include first to seventh transistors T1 to T7 and a storage capacitor Cst. The pixel circuit PXC may be provided and/or formed on the buffer layer BFL of the pixel circuit layer PCL.

The first transistor T1 may include a first gate electrode GE1, a first active pattern ACT1, a first source electrode SE1, a first drain electrode DE1, and a first connection line CNL1.

The first gate electrode GE1 may be connected to the 3a-th drain electrode DE3a of the 3a-th transistor T3a and the 4b-th drain electrode DE4b of the 4b-th transistor T4b.

One end of the first connection line CNL1 may be connected the 3b-th drain electrode DE3b of the 3b-th transistor T3b and the 4b-th drain electrode DE4b of the 4b-th transistor T4b through the second contact hole CH2 passing through the gate insulation layer GI, and the first and second interlayer insulation layers ILD1 and ILD2. The other end of the first connection line CNL1 may be connected to the first gate electrode GE1 through the first contact hole CH1 passing through the first and second interlayer insulation layers ILD1 and ILD2.

The first active pattern ACT1, the first source electrode SE1, and the first drain electrode DE1 may be formed of a semiconductor layer in which no impurity is doped or an impurity is doped. For example, the first source electrode SE1 and the first drain electrode DE1 may be formed of a semiconductor layer in which the impurity is doped, and the first active pattern ACT1 may be formed of a semiconductor layer in which no impurity is doped.

The first active pattern ACT1 may have a bar shape extending in a predetermined direction and may have a shape bent several times in an extending direction. The first active pattern ACT1 may overlap with the first gate electrode GE1 in a plan view. Since the first active pattern ACT1 is formed long, a channel region of the first transistor T1 may be formed long. As such, a driving range of a gate voltage transmitted to the first transistor T1 is widened. In this manner, the grayscale of the light emitted from the light emitting element OLED afterwards may be finely controlled.

The first source electrode SE1 may be connected to one end of the first active pattern ACT1. In addition, the first source electrode SE1 may be connected to the second drain electrode DE2 of the second transistor T2 and the fifth drain electrode DE5 of the fifth transistor T5. The first drain electrode DE1 may be connected to the other end of the first active pattern ACT1. In addition, the first drain electrode DE1 may be connected to the 3a-th source electrode SE3a of the 3a-th transistor T3a and the sixth source electrode SE6 of the sixth transistor T6.

The second transistor T2 (e.g., a switching transistor) may include a second gate electrode GE2, a second active pattern ACT2, a second source electrode SE2, and a second drain electrode DE2.

The second gate electrode GE2 may be connected to the i-th scan line Si. The second gate electrode GE2 may be provided as portion of the i-th scan line Si or as a shape protruded from the i-th scan line Si.

The second active pattern ACT2, the second source electrode SE2, and the second drain electrode DE2 may be formed as a semiconductor layer in which no impurity is doped or an impurity is doped. For example, the second source electrode SE2 and the second drain electrode DE2 may be formed of a semiconductor layer in which the impurity is doped, and the second active pattern ACT2 may be formed of a semiconductor layer in which no impurity is doped.

The second active pattern ACT2 corresponds to a semiconductor layer overlapping with the second gate electrode GE2. One end of the second source electrode SE2 is connected to the second active pattern ACT2, and the other end of the second source electrode SE2 is connected to a data line Dj through a sixth contact hole CH6 passing through the gate insulation layer GI and the first and second interlayer insulation layers ILD1 and ILD2. One end of the second drain electrode DE2 is connected to the second active pattern ACT2 and the other end of the second drain electrode DE2 is connected to the first source electrode SE1 of the first transistor T1 and the fifth drain electrode DE5 of the fifth transistor T5.

The third transistor T3 may be provided with a dual gate structure to prevent a leakage current. For instance, the third transistor T3 may include the 3a-th transistor T3a and the 3b-th third transistor T3b.

The 3a-th transistor T3a may include the 3a-th gate electrode GE3a, the 3a-th active pattern ACT3a, the 3a-th source electrode SE3a, and the 3a-th drain electrode DE3a. The 3b-th transistor T3b may include the 3b-th gate electrode GE3b, the 3b-th active pattern ACT3b, the 3b-th source electrode SE3b, and the 3b-th drain electrode DE3b.

Each of the 3a-th and 3b-th gate electrodes GE3a and GE3b may be connected to the i-th scan line Si and may be provided as portion of the i-th scan line Si or in a shape protruded from the i-th scan line Si.

Each of the 3a-th and 3b-th active patterns ACT3a and ACT3b, the 3a-th and 3b-th source electrodes SE3a and SE3b, and the 3a-th and 3b-th drain electrodes DE3a and DE3b may be formed of a semiconductor layer in which no impurity is doped or an impurity is doped. For example, each of the 3a-th and 3b-th source electrodes SE3a and SE3b and the 3a-th and 3b-th drain electrodes DE3a and DE3b may be formed of a semiconductor layer in which the impurity is doped, and each of the 3a-th and 3b-th active patterns ACT3a and ACT3b may be formed of a semiconductor layer in which no impurity is doped. The 3a-th active pattern ACT3a corresponds to a semiconductor layer overlapping with the 3a-th gate electrode GE3a, and the 3b-th active pattern ACT3b corresponds to a semiconductor layer overlapping with the 3b-th gate electrode GE3b.

One end of the 3a-th source electrode SE3a may be connected to the 3a-th active pattern ACT3a and the other end of the 3a-th source electrode SE3a may be connected to the first drain electrode DE1 of the first transistor T1 and the sixth source electrode SE6 of the sixth transistor T6. One end of the 3a-th drain electrode DE3a may be connected to the 3a-th active pattern ACT3a and the other end of the 3a-th drain electrode DE3a may be connected to the 3b-th source electrode SE3b of the 3b-th transistor T3b.

One end of the 3b-th source electrode SE3b may be connected to the 3b-th active pattern ACT3b and the other end of the 3b-th source electrode SE3b may be connected to the 3a-th drain electrode DE3a of the 3a-th transistor T3a. One end of the 3b-th drain electrode DE3b may be connected to the 3b-th active pattern ACT3b and the other end of the 3b-th drain electrode DE3b may be connected to the 4b-th drain electrode DE4b of the 4b-th transistor T4b. In addition, the other end of the 3b-th drain electrode DE3b may be connected to the first gate electrode GE1 using the first and second contact holes CH1 and CH2 and the first connection line CNL1.

The fourth transistor T4, like the third transistor T3, may be provided with a double gate structure to prevent a leakage current. For instance, the fourth transistor T4 may include the 4a-th transistor T4a and the 4b-th transistor T4b.

The 4a-th fourth transistor T4a may include the 4a-th gate electrode GE4a, the 4a-th active pattern ACT4a, the 4a-th source electrode SE4a, and the 4a-th drain electrode DE4a. The 4b-th transistor T4b may include the 4b-th gate electrode GE4b, the 4b-th active pattern ACT4b, the 4b-th source electrode SE4b, and the 4b-th drain electrode DE4b.

Each of the 4a-th and 4b-th gate electrodes GE4a and GE4b may be connected to the i−1-th scan line Si−1 and may be provided as portions of the i−1-th scan line Si−1 or in shapes protruded from the i−1-th scan line Si−1.

Each of the 4a-th and 4b-th active patterns ACT4a and ACT4b, the 4a-th and 4b-th source electrodes SE4a and SE4b, and the 4a-th and 4b-th drain electrodes DE4a and DE4b may be formed of a semiconductor layer in which no impurity is doped or an impurity is doped. For example, each of the 4a-th and 4b-th source electrodes SE4a and SE4b and the 4a-th and 4b-th drain electrodes DE4a and DE4b may be formed of a semiconductor layer in which the impurity is doped, and each of the 4a-th and 4b-th active patterns ACT4a and ACT4b may be formed of a semiconductor layer in which no impurity is doped. The 4a-th active pattern ACT4a corresponds to a semiconductor layer overlapping with the 4a-th gate electrode GE4a, and the 4b-th active pattern ACT4b corresponds to a semiconductor layer overlapping with the 4b-th gate electrode GE4b.

One end of the 4a-th source electrode SE4a may be connected to the 4a-th active pattern ACT4a and the other end of the 4a-th source electrode SE4a may be connected to an auxiliary connection line AUX through the ninth contact hole CH9 passing through the gate insulation layer GI and the first and second interlayer insulation layers ILD1 and ILD2.

One end of the auxiliary connection line AUX may be connected to the 4a-th source electrode SE4a through the ninth contact hole CH9 and the other end of the auxiliary connection line AUX may be connected to the initialization power line IPL of the pixel PXL of the i−1-th row through the eighth contact hole CH8 passing through the second interlayer insulation layer ILD2.

One end of the 4a-th drain electrode DE4a may be connected to the 4a-th active electrode ACT4a and the other end of the 4a-th drain electrode DE4a may be connected to the 4b-th source electrode SE4b of the 4b-th transistor T4b.

One end of the 4b-th source electrode SE4b may be connected to the 4b-th active pattern ACT4b and the other end of the 4b-th source electrode SE4b may be connected to the 4a-th drain electrode DE4a of the 4a-th transistor T4a. One end of the 4b-th drain electrode DE4b may be connected to the 4b-th active pattern ACT4b and the other end of the 4b-th drain electrode DE4b may be connected to the 3b-th drain electrode DE3b of the 3b-th transistor T3b. In addition, the other end of the 4b-th drain electrode DE4b may be connected to the first gate electrode GE1 of the first transistor T1 through the first and second contact holes CH1 and CH2 and the first connection line CNL1.

The fifth transistor T5 may include a fifth gate electrode GE5, a fifth active pattern ACT5, a fifth source electrode SE5, and a fifth drain electrode DE5.

The fifth gate electrode GE5 may be connected to the light emission control line Ei. The fifth gate electrode GE5 may be provided as portion of the light emission control line Ei or as a shape protruded from the light emission control line Ei.

The fifth active pattern ACT5, the fifth source electrode SE5, and the fifth drain electrode DE5 may be formed of a semiconductor layer in which no impurity is doped or an impurity is doped. For example, the fifth source electrode SE5 and the fifth drain electrode DE5 may be formed of a semiconductor layer in which the impurity is doped, and the fifth active pattern ACT5 may be formed of a semiconductor layer in which no impurity is doped.

The fifth active pattern ACT5 may correspond to a semiconductor layer overlapping with the fifth gate electrode GE5.

One end of the fifth source electrode SE5 may be connected to the fifth active pattern ACT5. The other end of the fifth source electrode SE5 may be connected to the power line PL through the fifth contact hole CH5 passing through the gate insulation layer GI and the first and second interlayer insulation layers ILD1 and ILD2. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, a sixth source electrode SE6, and a sixth drain electrode DE6.

The sixth gate electrode GE6 may be connected to the light emission control line Ei. The sixth gate electrode GE6 may be provided as portion of the light emission control line Ei or as a shape protruded from the light emission control line Ei.

The sixth active pattern AC6, the sixth source electrode SE6, and the sixth drain electrode DE6 may be formed of a semiconductor layer in which no impurity is doped or an impurity is doped. For example, the sixth source electrode SE6 and the sixth drain electrode DE6 may be formed of a semiconductor layer in which the impurity is doped, and the sixth active pattern ACT6 may be formed of a semiconductor layer in which no impurity is doped.

The sixth active pattern ACT6 may correspond to a semiconductor layer overlapping with the sixth gate electrode GE6.

One end of the sixth source electrode SE6 may be connected to the sixth active pattern ACT6. The other end of the sixth source electrode SE6 may be connected to the first drain electrode DE1 of the first transistor T1 and the 3a-th source electrode SE3a of and the 3a-th transistor T3a. One end of the sixth drain electrode DE6 may be connected to the sixth active pattern ACT6. The other end of the sixth drain electrode DE6 may be connected to the second connection line CNL2 through the seventh contact hole CH7 passing through the gate insulation layer GI and the first and second interlayer insulation layers ILD1 and ILD2.

One end of the second connection line CNL2 may be connected to the sixth drain electrode DE6 of the sixth transistor T6 through the seventh contact hole CH7. In addition, the other end of the second connection electrode CNL2 may be connected to a bridge pattern BRP through the tenth contact hole CH10 passing through the third interlayer insulation layer ILD3.

The bridge pattern BRP may be disposed on the second connection line CNL2 with the third interlayer insulation layer ILD3 interposed therebetween, one end of the bridge pattern BRP may be connected to the second connection line CNL2 through the tenth contact hole CH10, and the other end of the bridge pattern BRP may be connected to the first electrode AD of the display element layer DPL through an eleventh contact hole CH11 passing through the passivation layer PSV.

The seventh transistor T7 may include a seventh gate electrode GE7, a seventh active pattern ACT7, a seventh source electrode SE7, and a seventh drain electrode DE7.

The seventh gate electrode GE7 may be connected to the i+1-th scan line Si+1. The seventh gate electrode GE7 may be provided as portion of the i+1-th scan line Si+1 or as a shape protruded from the i+1-th scan line Si+1.

The seventh active pattern AC7, the seventh source electrode SE7, the seventh drain electrode DE7 may be formed of a semiconductor layer in which no impurity is doped or an impurity is doped. For example, the seventh source electrode SE7 and the seventh drain electrode DE7 may be formed of a semiconductor layer in which the impurity is doped, and the seventh active pattern ACT7 may be formed of a semiconductor layer in which no impurity is doped.

The seventh active pattern ACT7 may correspond to a semiconductor layer overlapping with the seventh gate electrode GE7.

One end of the seventh source electrode SE7 may be connected to the seventh active pattern ACT7. The other end of the seventh source electrode SE7 may be connected to the sixth drain electrode DE6 of the sixth transistor T6.

One end of the seventh drain electrode DE7 may be connected to the seventh active pattern ACT7. The other end of the seventh drain electrode DE7 may be connected to the initialization power line IPL through the eighth contact hole CH8 passing through the gate insulation layer GI and the second interlayer insulation layer ILD2. In this manner, the other end of the seventh drain electrode DE7 may be connected to the 4a-th source electrode SE4a of the fourth transistor T4a of the pixel PXL disposed in the i+1-th row.

The storage capacitor Cst may include a lower electrode LE and an upper electrode UE.

The lower electrode LE may be provided integrally with the first gate electrode GE1 of the first transistor T1. When the lower electrode LE is provided integrally with the first gate electrode GE1, the lower electrode LE may be a portion of the first gate electrode GE1.

The upper electrode UE may overlap with the lower electrode LE and may cover the lower electrode LE in a plan view. A capacitance of the storage capacitor Cst may increase by widening an overlapped area between the upper electrode UE and the lower electrode LE. The upper electrode UE may be electrically connected to the power line PL through the third and fourth contact holes CH3 and CH4 passing through the second interlayer insulation layer ILD2. Accordingly, the first pixel power source ELVDD transmitted to the power line PL may be transferred to the upper electrode UE. The upper electrode UE may include an opening OPN corresponding to an area in which the first contact electrode CH1 for the connection between the first gate electrode GE1 of the first transistor T1 and the first connection line CNL1 is formed.

The light emitting element OLED may include a first electrode AD, a second electrode CD, and an emission layer EML formed and/or provided between the first electrode AD and the second electrode CD. According to some exemplary embodiments, the first electrode AD and the second electrode CD may be disposed to overlap each other in each light emitting area partitioned in each pixel area PXA of the display element layer DPL, and the emission layer EML may be disposed in the light emitting area. For instance, the light emitting area of each pixel PXL may be an area in which the first electrode AD of the light emitting element OLED, the emission layer EML, and the second electrode CD overlap each other.

The first electrode AD may be provided to (or in) a predetermined light emitting area of the pixel area PXA corresponding to the pixel PXL. The first electrode AD may be connected to the seventh source electrode SE7 of the seventh transistor T7 and the sixth drain electrode DE6 of the sixth transistor T6 through the second connection line CNL2 and the bridge pattern BRP.

In some exemplary embodiments, the initialization power line IPL may be electrically connected to the light-blocking conductive pattern CP through a twelfth contact hole CH12 passing through the barrier layer BRL, the buffer layer BFL, the gate insulation layer GI, and the first interlayer insulation layer ILD1. When the initialization power line IPL is electrically connected to the light-blocking conductive pattern CP through the twelfth contact hole CH12, the initialization power Vint transmitted to the initialization power line IPL may be transferred to the light-blocking conductive pattern CP. When the initialization power Vint of a constant voltage level is transmitted to the light-blocking conductive pattern CP, electrical characteristics of at least one circuit element provided in the pixel circuit layer PCL, for example, at least one transistor of first to seventh transistors T1 to T7 may change.

When the electrical characteristics of at least one of the first to seventh transistors T1 to –T7 change according to a voltage level of a predetermined voltage transmitted to the light-blocking conductive pattern CP, for example, the initialization power Vint, the amount of current flowing through the light emitting element OLED that is electrically connected to the first to seventh transistors T1 to T7 may change. When the amount of current flowing through the light emitting element OLED changes, the amount (or intensity) of light emitted from the light emitting element OLED may change. For instance, as the amount (or intensity) of light emitted from the light emitting element OLED increases, the amount (or intensity) of the reflected light incident on the pinholes PIH of the pinhole array mask layer LBL may increase, and, as a result, the amount (or intensity) of light reaching the optical sensors PSR provided in the light sensing array layer LSL through the pinholes PIH may also increase. In this manner, the optical sensors PSR disposed in the light sensing array layer LSL may output a sensing signal based on optical characteristics for a greater amount of reflected light, and the accuracy of, for example, fingerprint sensing based on the sensing signal may be improved.

Figure 22:
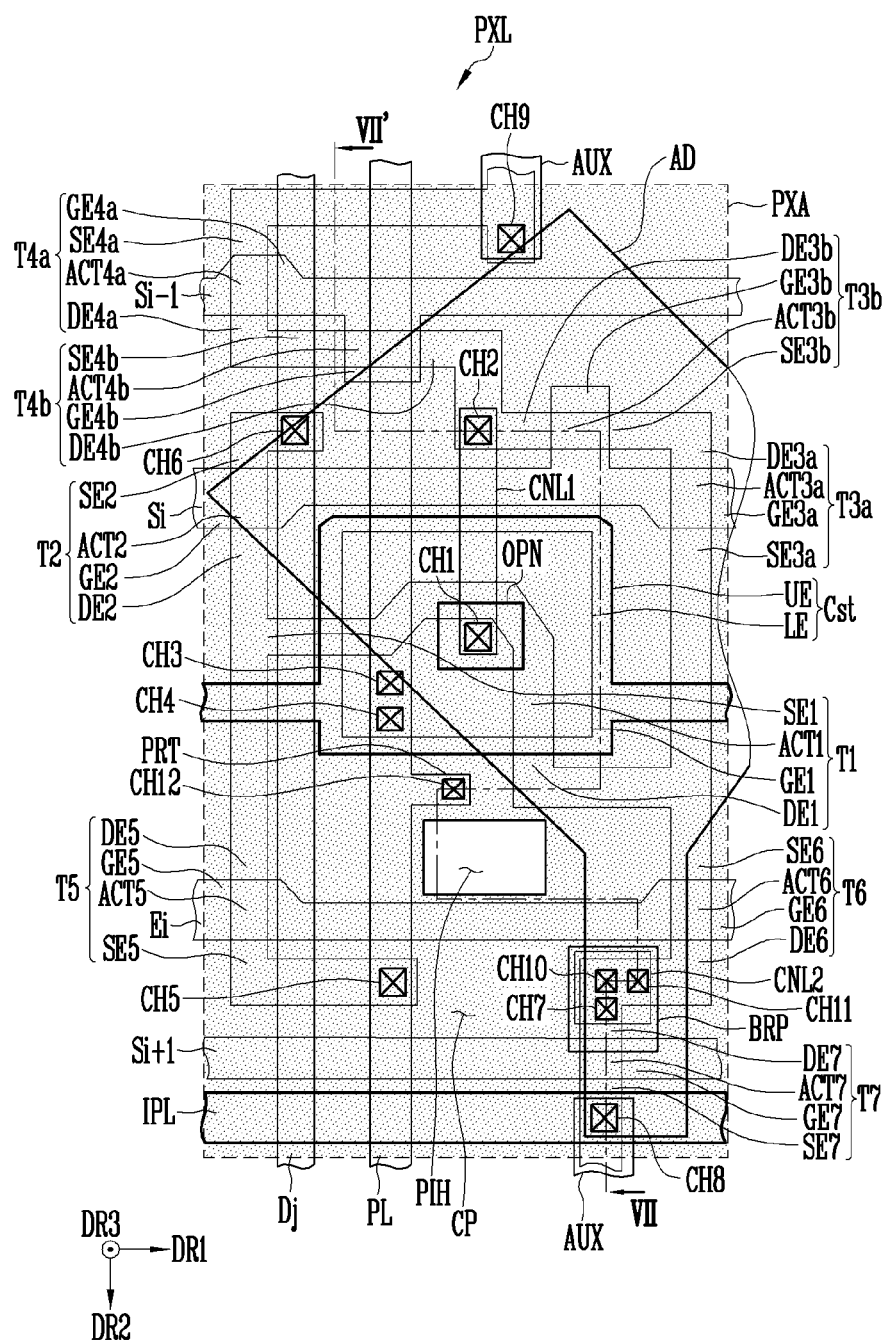
FIG. 22 is a plan view schematically illustrating the pixel of FIG. 19 according to some exemplary embodiments.
Figure 23:
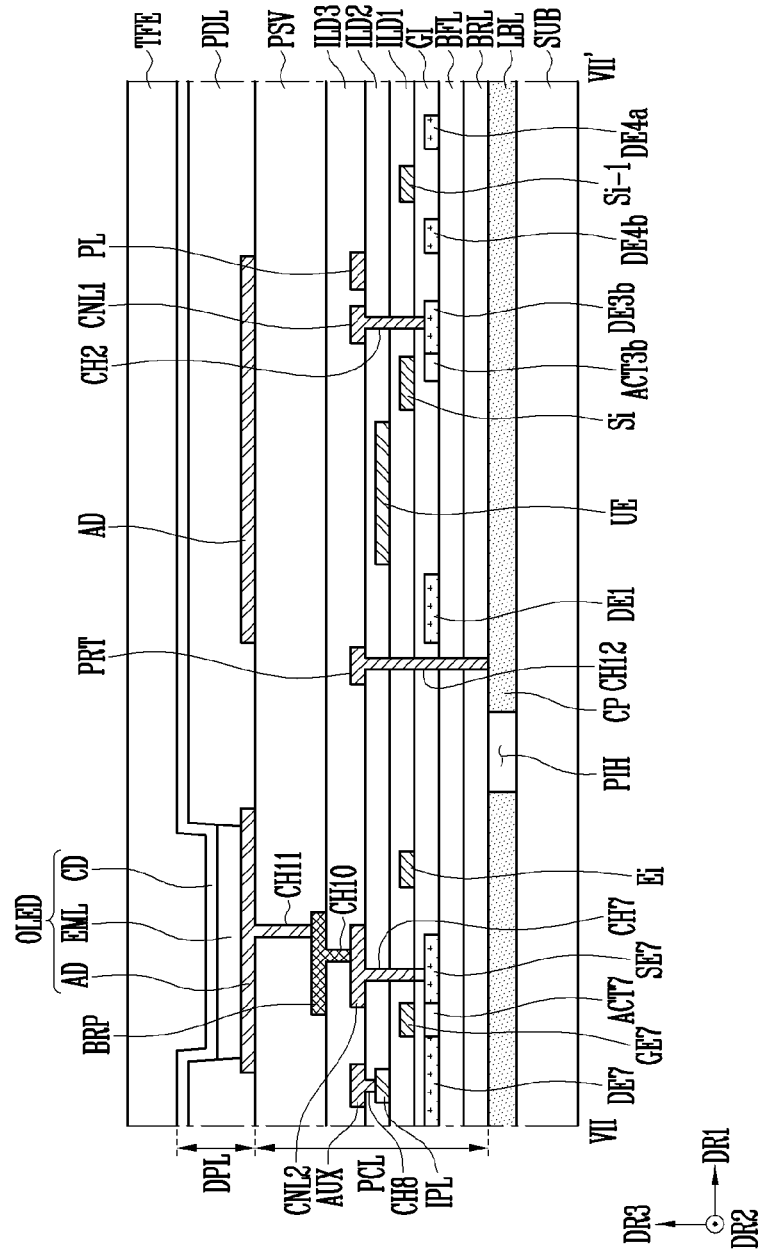
FIG. 23 is a cross-sectional view taken along sectional line VII-VII' in FIG. 22 according to some exemplary embodiments.

FIG. 22 is a plan view schematically illustrating the pixel of FIG. 19 according to some exemplary embodiments. FIG. 23 is a cross-sectional view taken along sectional line VII-VII' in FIG. 22 according to some exemplary embodiments.

One pixel PXL shown in FIGS. 22 and 23 may be substantially equivalent or similar to the pixel shown in FIGS. 20 and 21, except that the pixel power line PL is directly electrically connected to the light-blocking conductive pattern CP in FIGS. 22 and 23. Thus, with respect to the pixel described in association with FIGS. 22 and 23, to avoid redundant description, differences from the exemplary embodiments previously described will be mainly described. Parts not described in association with FIGS. 22 and 23 follow at least one of the previously described exemplary embodiments, the same numbers denote the same constituent elements, and similar numbers denote similar constituent elements.

Referring to FIGS. 1 to 10, 19, 22, and 23, the pixel PXL may be connected to the scan lines Si−1, Si, and Si+1, the light emission control line Ei, the data line Dj, the pixel power line PL, and the initialization power line IPL.

The pixel power line PL may extend in the second direction DR2 of the substrate SUB, and the first pixel power ELVDD may be transmitted to the pixel power line PL. In some exemplary embodiments, the pixel power line PL may include a protruding portion PRT extending in the first direction DR1.

The protruding portion PRT may be provided integrally with the pixel power line PL and may be electrically and/or physically connected to the pixel power line PL. When the protruding portion PRT is provided integrally with the pixel power line PL, the protruding portion PRT may be a portion of the pixel power line PL; however, exemplary embodiments are not limited thereto. According to some exemplary embodiments, the protruding portion PRT may be formed separately from the pixel power line PL without being provided integrally with the pixel power line PL, and may be electrically connected to the pixel power line PL using separate connection means and the like.

One end of the protruding portion PRT is connected to the pixel power line PL. The other end of the protruding portion PRT may be connected to the light-blocking conductive pattern CP of the pinhole array mask layer LBL through the twelfth contact hole CH12 passing through the barrier layer BRL, the buffer layer BFL, the gate insulation layer GI, and the first and second interlayer insulation layers ILD1 and ILD2. Accordingly, the first pixel power ELVDD transmitted to the pixel power line PL may be transferred to the light-blocking conductive pattern CP through the protruding portion PRT and twelfth contact hole CH12.

When the first pixel power ELVDD is transmitted to the light-blocking conductive pattern CP, the electrical characteristic of at least one transistor of the first to seventh transistors T1 to T7 provided in the pixel circuit layer PCL may change. When the electrical characteristic of at least one of the first to seventh transistors T1 to T7 changes by the first pixel power ELVDD transmitted to the light-blocking conductive pattern CP, the amount of current flowing through the light emitting element OLED may change. Accordingly, the amount (or intensity) of light emitted from the light emitting element OLED changes such that the amount (or intensity) of the reflected light reaching the optical sensors PSR provided in the light sensing array layer LSL may change. For instance, as the amount (or intensity) of the reflected light reaching the optical sensors PSR increases, the optical sensors PSR may output a sensing signal for a greater amount of reflected light and sense, for instance, the user's fingerprint more accurately based on the sensing signal.

Figure 24:
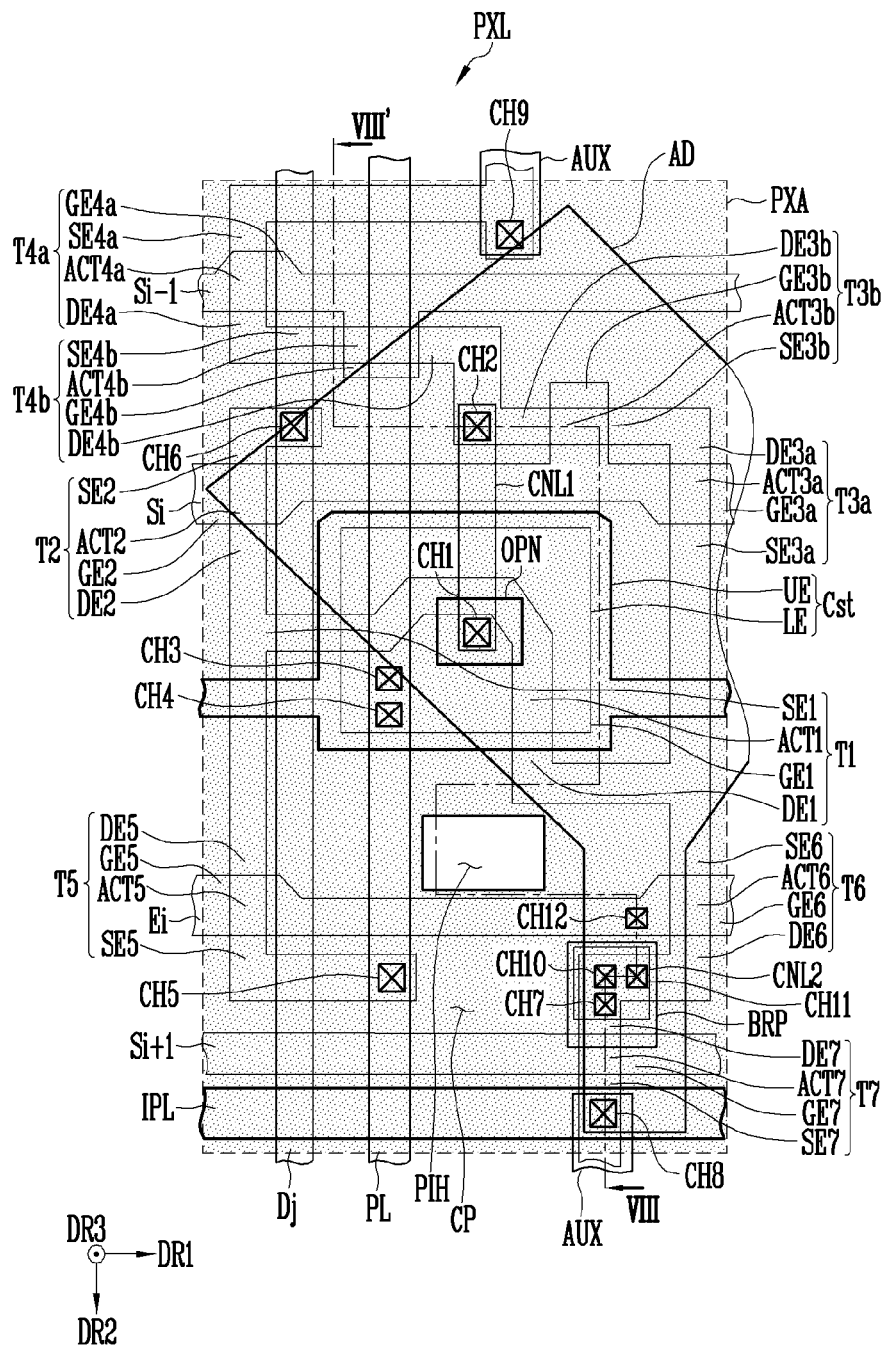
FIG. 24 is a plan view schematically illustrating the pixel of FIG. 19 according to some exemplary embodiments.
Figure 25:
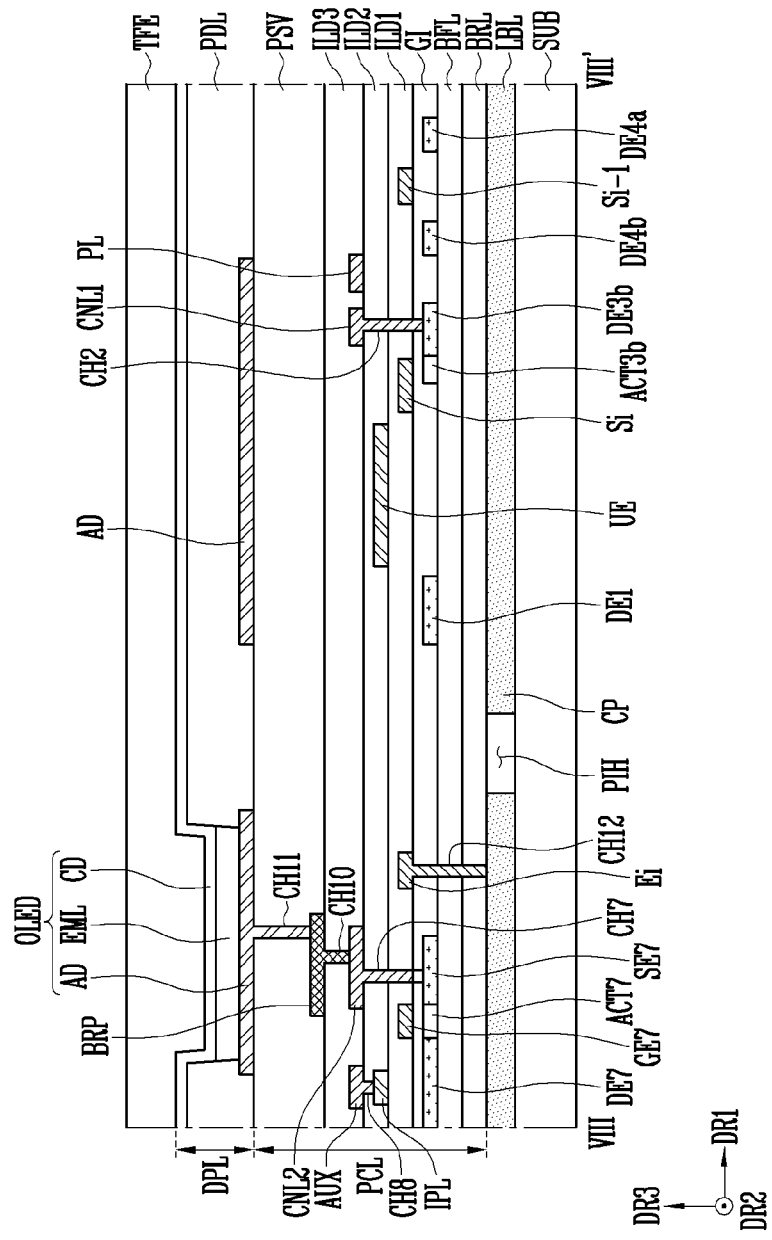
FIG. 25 is a cross-sectional view taken along sectional line VIII-VIII' in FIG. 24 according to some exemplary embodiments.

FIG. 24 is a plan view schematically illustrating the pixel of FIG. 19 according to some exemplary embodiments. FIG. 25 is a cross-sectional view taken along sectional line VIII-VIII' in FIG. 24 according to some exemplary embodiments.

One pixel PXL shown in FIGS. 24 and 25 may be substantially equivalent or similar to the pixel shown in FIGS. 20 and 21, except that the light emission control line Ei is directly electrically connected to the light-blocking conductive pattern CP. Thus, with respect to the pixel described in association with FIGS. 24 and 25, to avoid redundant description, differences from the exemplary embodiments previously described will be mainly described. Parts not described in association with FIGS. 24 and 25 follow at least one of the previously described exemplary embodiments, the same numbers denote the same constituent elements, and similar numbers denote similar constituent elements.

Referring to FIGS. 1 to 10, 19, 24, and 25, the pixel PXL may be connected to the scan lines Si−1, Si, and Si+1, the light emission control line Ei, the data line Dj, the power line PL, and the initialization power line IPL.

The light emission control line Ei may extend in the first direction DR1 of the substrate SUB and the light emission control signal may be transmitted to the light emission control line Ei.

In some exemplary embodiments, the light emission control line Ei may be connected to the light-blocking conductive pattern CP of the pinhole array mask layer LBL through the twelfth contact hole CH12 passing through the barrier layer BRL, the buffer layer BFL, and the gate insulation layer GI. Accordingly, the light emission control signal transmitted to the light emission control line Ei may be transmitted to the light-blocking conductive pattern CP through the twelfth contact hole CH12.

When the light emission control signal is transmitted to the light-blocking conductive pattern CP, the electrical characteristic of at least one of the first to seventh transistors T1 to T7 provided in the pixel circuit layer PCL may change. When the electrical characteristic of at least one of the first to seventh transistors T1 to T7 changes by the light emission control signal transmitted to the light-blocking conductive pattern CP, the amount of current flowing through the light emitting element OLED may change. Accordingly, the amount (or intensity) of the light emitted from the light emitting element OLED may change such that the amount (or intensity) of the reflected light reaching the optical sensors PSR provided in the light sensing array layer LSL may change. For instance, as the amount (or intensity) of the reflected light reaching the optical sensors PSR increases, the optical sensors PSR may output a sensing signal for a greater amount of reflected light and sense, for example, the user's fingerprint more accurately based on the sensing signal.

Figure 26:
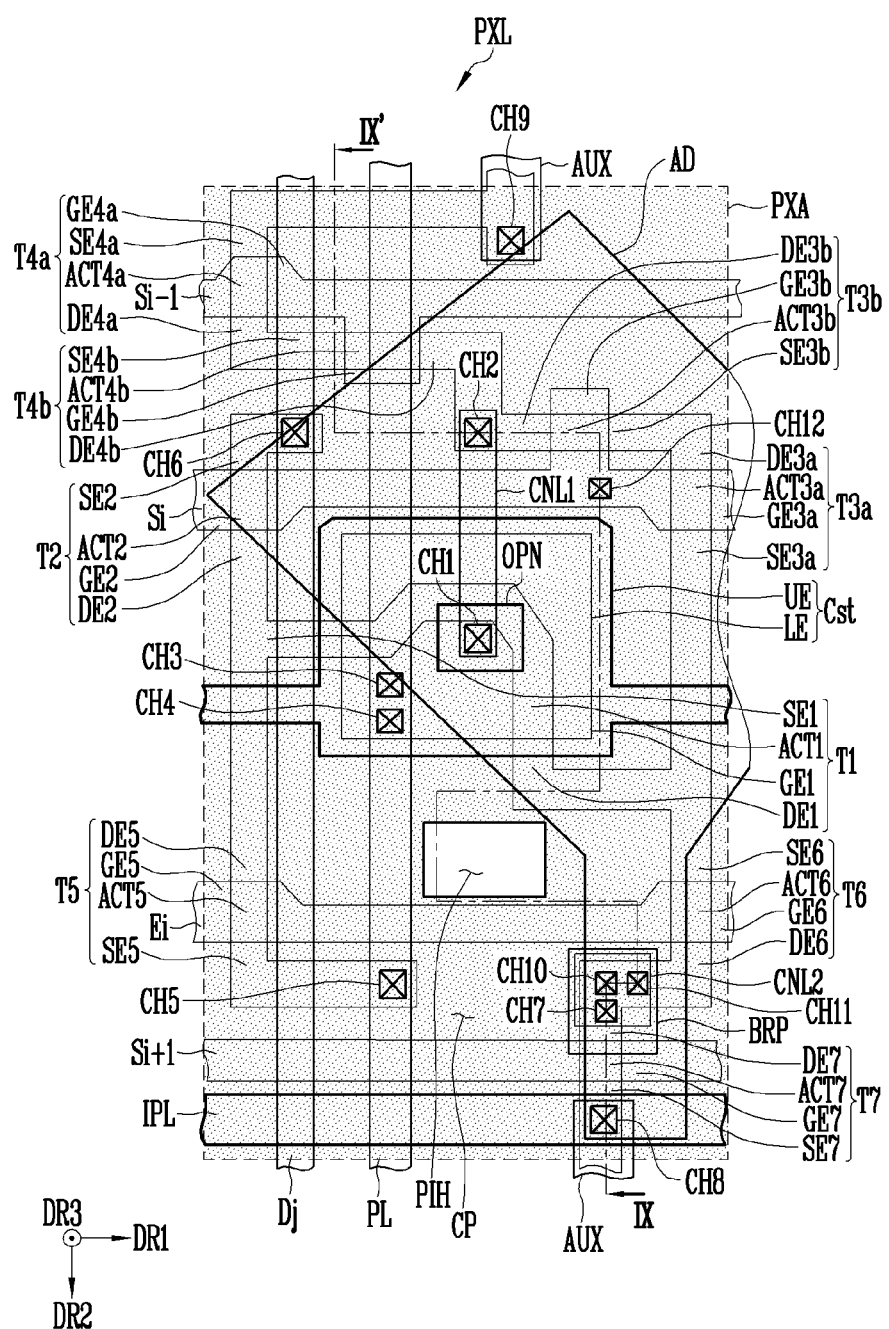
FIG. 26 is a plan view schematically illustrating the pixel of FIG. 19 according to some exemplary embodiments.
Figure 27:
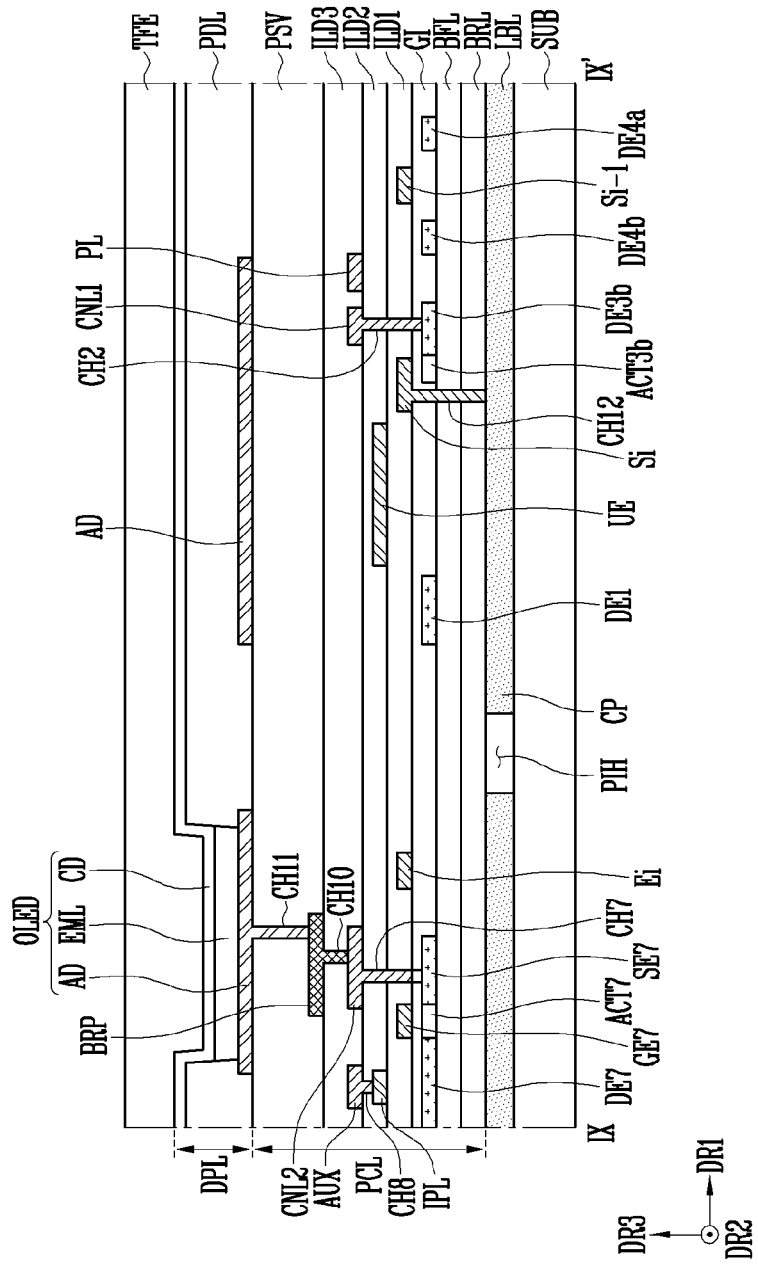
FIG. 27 is a cross-sectional view taken along sectional line IX-IX' in FIG. 26 according to some exemplary embodiments.

FIG. 26 is a plan view schematically illustrating the pixel of FIG. 19 according to some exemplary embodiments. FIG. 27 is a cross-sectional view taken along sectional line IX-IX' in FIG. 26 according to some exemplary embodiments.

One pixel PXL shown in FIGS. 26 and 27 may be substantially equivalent or similar to the pixel shown in FIGS. 20 and 21, except that the i-th scan line Si is directly electrically connected to the light-blocking conductive pattern CP. Thus, with respect to the pixel described in association with FIGS. 26 and 27, to avoid redundant description, differences from the exemplary embodiments previously described will be mainly described. Parts not described in association with FIGS. 26 and 27 follow at least one of the previously described exemplary embodiments, the same numbers denote the same constituent elements, and similar numbers denote similar constituent elements.

Referring to FIGS. 1 to 10, 19, 26, and 27, the pixel PXL may be connected to the scan lines Si−1, Si, and Si+1, the light emission control line Ei, the data line Dj, the power line PL, and the initialization power line IPL.

Each of the scan lines Si−1, Si, and Si+1 may be spaced apart from each other and extend in the first direction DR1 of the substrate SUB. A corresponding scan signal may be transmitted to each of the scan lines Si−1, Si, and Si+1.

In some exemplary embodiments, the i-th scan line Si of the scan lines Si−1, Si, and Si+1 may be connected to the light-blocking conductive pattern CP of the pinhole array mask layer LBL through the twelfth contact hole CH12 passing through the barrier layer BRL, the buffer layer BFL, and the gate insulation layer GI. Accordingly, the i-th scan signal transmitted to the i-th scan line Si may be transferred to the light-blocking conductive pattern CP through the twelfth contact hole CH12.

When the i-th scan signal is transmitted to the light-blocking conductive pattern CP, the electrical characteristic of at least one of the first to seventh transistors T1 to T7 provided in the pixel circuit layer PCL may change. When the electrical characteristic of at least one of the first to seventh transistors T1 to T7 changes by the i-th scan signal transmitted to the light-blocking conductive pattern CP, the amount of current flowing through the light emitting element OLED may change. Accordingly, the amount (or intensity) of light emitted from the light emitting element OLED changes such that the amount (or intensity) of the reflected light reaching the optical sensors PSR provided in the light sensing array layer LSL may change. For instance, as the amount (or intensity) of the reflected light reaching the optical sensors PSR increases, the optical sensors PSR may output a sensing signal for a greater amount of reflected light and sense, for example, the user's fingerprint more accurately based on the sensing signal.

According to various exemplary embodiments, a display device DD is configured to electrically connect a conductive layer provided in the light-blocking conductive pattern CP of the pinhole array mask layer LBL and the display unit DM and receiving a signal (or voltage) of a predetermined voltage level, for example, the pixel line unit to the light-blocking conductive pattern CP and transfer a predetermined voltage to the light-blocking conductive pattern CP. As a predetermined voltage is transmitted to the light-blocking conductive pattern CP, the electrical characteristic of at least one transistor included in the pixel circuit layer PCL may change due to the electric field effect between the light-blocking conductive pattern CP and the conductive layer adjacent thereto such that the amount of current flowing through the light emitting element OLED connected to the transistor may change. Accordingly, the amount (or intensity) of light emitted from the light emitting element OLED may change, and the amount (or intensity) of the reflected light reaching the optical sensors PSR of the light sensing array layer LSL may be changed. This may improve the accuracy of, for example, fingerprint sensing via at least the optical sensors PSR of the light sensing array layer LSL.

The display device DD according to various exemplary embodiments may include a selective light-blocking film SLBF for blocking light in the infrared region of light that inflows from the outside, but manufacturing cost and/or time may increase due to a purchase cost of the selective light-blocking film SLBF. In addition, thinning the display device DD may not be easy due to the thickness of the selective light-blocking film SLBF. Hereinafter, alternative exemplary embodiments to the selective light-blocking film SLBF described above will be described by changing the configuration of the insulation layers included in the display unit DM instead of the selective light-blocking film SLBF.

Figure 28:
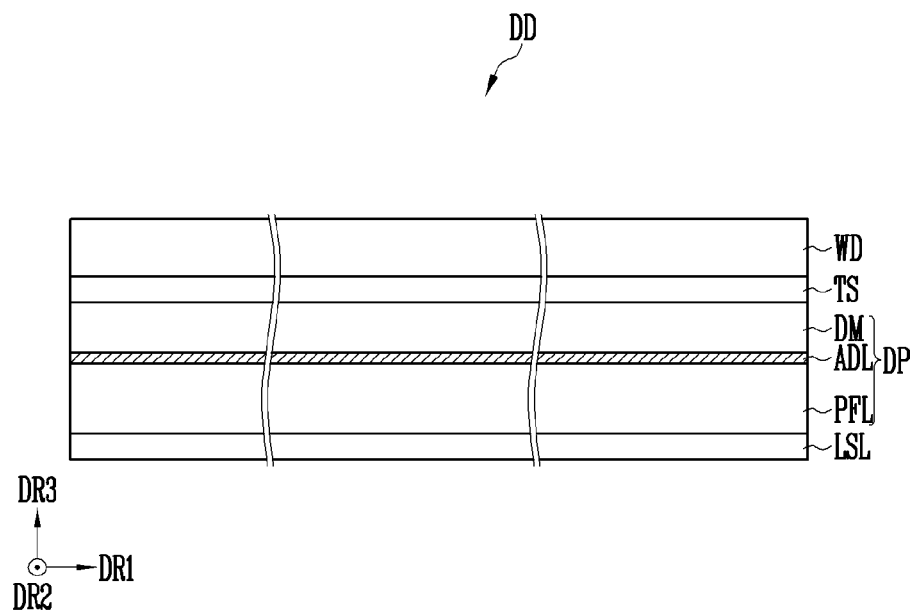
FIG. 28 is a schematic cross-sectional view of a display device according to some exemplary embodiments.

FIG. 28 is a schematic cross-sectional view of a display device according to some exemplary embodiments.

Referring to FIGS. 1A, 1B, and 28, the display device DD may include the display panel DP, the touch sensor TS, the window WD, and the light sensing array layer LSL.

The display panel DP may display an image and include the display unit DM providing a plurality of pixels PXL and the protective film layer PFL disposed on the lower surface of the display unit DM.

In some exemplary embodiments, the display unit DM may include the pixel circuit layer PCL (see FIG. 3), the display element layer DPL (see FIG. 3), and the thin-film encapsulation layer TFE (see FIG. 3).

The protective film layer PFL may block an inflow of oxygen and/or moisture from the outside into the display unit DM and may be provided in the form of a single layer or a multilayer. The protective film layer PFL may be formed of a film type to further secure the flexibility of the display panel DP.

The touch sensor TS may be disposed on a surface (e.g., a display surface) in (or on) which an image is emitted in the display panel DP and to receive a touch input of the user. The touch sensor TS may recognize a touch event of the display device DD by using the user's hand, a separate input means, and/or the like. For example, the touch sensor TS may recognize the touch event by a capacitive method.

A window WD for protecting the exposed surface of the touch sensor TS may be disposed on the touch sensor TS. The window WD may protect the touch sensor TS and display panel DP from external impact and provide an input surface and/or a display surface to the user. The window WD may be combined with the touch sensor TS and/or display panel DP using a transparent or translucent adhesive member (not shown).

The window WD may have a multi-layer structure selected from at least one of a glass substrate, a plastic film, and a plastic substrate. Such a multi-layer structure may be formed using a continuous process or a bonding process using an adhesive layer. The window WD may have entire or partial flexibility.

The light sensing array layer LSL may be disposed on one surface (e.g., a surface where no image is displayed) of the display panel DP to overlap with at least one area of the display panel DP. The light sensing array layer LSL may include a plurality of optical sensors PSR distributed at predetermined resolutions and/or distances.

The display panel DP may further include an adhesive layer ADL provided and/or formed between the display unit DM and the protective film layer PFL. The adhesive layer ADL may firmly bond (or adhere) the display unit DM and the protective film layer PFL.

The adhesive layer ADL may include, for example, a pressure sensitive adhesive (PSA) where an adhesive material acts when pressure is applied to adhere to an adhesive surface. When the adhesive layer ADL includes the pressure sensitive adhesive, the adhesive layer ADL may be adhered to an adhesive surface only by pressure without additional heat treatment or ultraviolet (UV) treatment at room temperature.

In some exemplary embodiments, the adhesive layer ADL may include materials that absorb and/or block specific light. For example, the adhesive layer ADL may include an infrared absorbing material that absorbs light in the infrared region having a high energy density and/or may include an infrared blocking material that blocks light in the infrared region.

The infrared absorbing material may include, for example, at least one of an inorganic oxide, such as antimony-tin oxide (ATO), indium tin oxide (ITO), tungsten oxide, carbon black, and the like, and a metal, such as silver (Ag) and the like. The inorganic oxide may selectively transmit light in the visible region and absorb light in the infrared region. In addition, the infrared absorbing material may include, for example, an organic dye. The organic dye may be, for example, a dye used in a color filter (not shown) provided in the display unit DM.

The infrared blocking material may include at least one selected from the group consisting of a borate mixture, a carbonate mixture, an aluminate mixture, a nitrate mixture, a nitrite mixture, lithium borate, sodium borate, potassium borate, magnesium borate, calcium borate, strontium borate, barium borate, sodium borate, $Na_2B_4O_x$, colemanite, lithium carbonate, sodium carbonate, potassium carbonate, calcium carbonate, calcite, $CaCO_3$, dolomite, and magnesite. In addition, the infrared blocking material may include at least one dye selected from the group consisting of nickel dithiol-based, dithiol-based metal complex compound, cyanine-based, scumium-based, croconium-based, diimmonium-based, aminium-based, ammonium-based, phthalocyanine-based, naphthalocyanine-based, aminium-based, anthraquinone-based, naphthoquinone-based, polymer-condensed azo-based pyrrole, polymethine-based, and propyline-based.

When the user's hand is seated (or disposed) on the display surface (e.g. one surface displaying an image) of the display device DD, the display device DD may sense the user's fingerprint using the light sensing array layer LSL including the optical sensors PSR. When external light inflows to the display device DD while the user's fingerprint is sensed, light in the visible region of the external light is blocked by the user's hand, but light in the infrared region of the external light is transmitted through the user's hand to be incident on the optical sensors PSR. When the light in the infrared region is incident on the optical sensors PSR, the optical sensors PSR may be emitted from the pixels PXL of the sensing area SA due to the light in the infrared region and cannot recognize light reflected by the user's hand. In this case, since the optical sensors PSR can not recognize the user's fingerprint, the fingerprint sensing capability may be deteriorated.

According to some exemplary embodiments, when the adhesive layer ADL includes the infrared absorbing material and/or the infrared blocking material, light in the infrared region may be absorbed and/or blocked by the adhesive layer ADL disposed on the light sensing array layer LSL although the light in the infrared region of the external light may transmit through (or off of) the user's hand. In this case, since the external light including the light in the infrared region does not inflow into the optical sensors PSR included in the light sensing array layer LSL, the optical sensors PSR may analyze (or sense) only the light emitted from the pixels PXL of the sensing area SA and reflected by the user to more accurately recognize the user's fingerprint. As a result, when the adhesive layer ADL includes the infrared absorbing material and/or infrared blocking material, the fingerprint sensing capability of the optical sensors PSR may be further improved.

Figure 29:
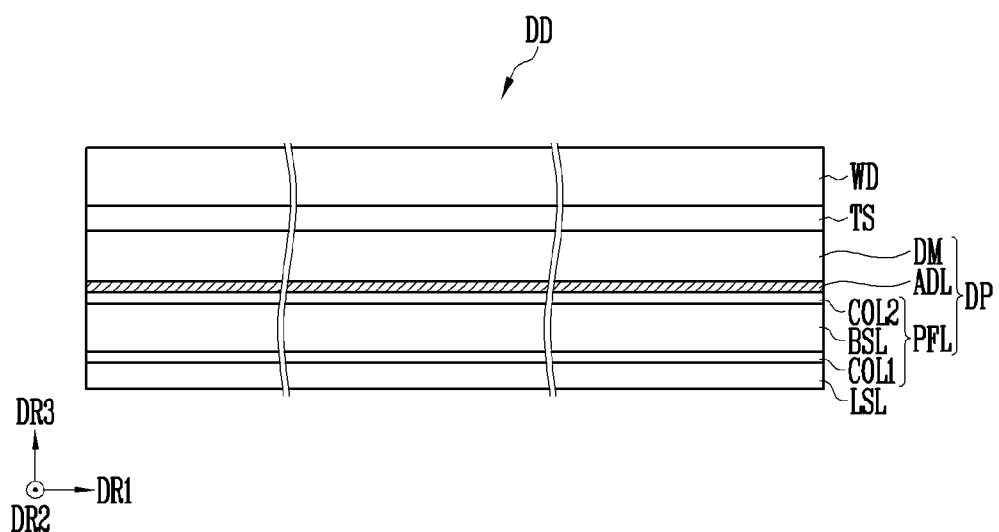
FIG. 29 is a schematic cross-sectional view of a display device according to some exemplary embodiments.

FIG. 29 is a schematic cross-sectional view of a display device according to some exemplary embodiments.

The display device shown in FIG. 29 may be substantially equivalent or similar to the display device shown in FIG. 28, except that the protective film layer PRL includes a base layer BSL, as well as first and second coating layers COL1 and COL2. Thus, with respect to the display device DD described in association with FIG. 29, to avoid redundant description, differences from the exemplary embodiments previously described will be mainly described. Parts not described in association with at least FIG. 28 follow at least one of the previously described exemplary embodiments, the same numbers denote the same constituent elements, and similar numbers denote similar constituent elements.

Referring to FIG. 29, the display device DD may include a display panel DP, a touch sensor TS, a window WD, and a light sensing array layer LSL.

The display panel DP may include a display unit DM, an adhesive layer ADL, and a protective film layer PFL. In some exemplary embodiments, the adhesive layer ADL may be formed of a transparent adhesive, such as OCA, and may be provided and/or formed between the display unit DM and the protective film layer PFL to stably bond (or adhere) the display unit DM and the protective film layer PFL.

The protective film layer PFL may include a base layer BSL, a first coating layer COL1, and a second coating layer COL2 provided and/or formed on the lower and upper surfaces of the base layer BSL respectively.

The base layer BSL may be formed of a plastic film including at least one organic layer. The plastic film may include at least one of a thermoplastic polymeric resin, such as polycarbonate (PC), polyimide (PI), polyether sulfone (PES), polyarylate (PAR), polyethylene naphthalate (PEN), polyethylene terephthalate (PET), cycloolefin copolymer, and the like, and a thermosetting polymeric resin, such as epoxy, unsaturated polyester, phenol (PF), silicone, polyurethane, and the like having high transparency and an excellent heat insulation property.

In some exemplary embodiments, the base layer BSL is not limited to the above-described materials, but may be manufactured by selecting materials suitable for protecting the display unit DM disposed on the base layer BSL according to design conditions of the display panel DP and the like. According to some exemplary embodiments, the base layer BSL may include the same material as the infrared absorbing material and or the infrared blocking material included in at least one of the above-described exemplary embodiments, such as, for example, the adhesive layer ADL of the display device DD shown in FIG. 28.

One of the first and second coating layers COL1 and COL2 may be coated with a material that reflects and/or blocks the light in the infrared region and the other of the first and second coating layers COL1 and COL2 may be coated with a material that absorbs light in the infrared region. For example, the first coating layer COL1 may be a layer spread (or coated) with a mixture of materials that absorbs light in the infrared region, and the second coating layer COL2 may be a layer spread (or coated) with a mixture of materials that reflects and blocks light in the infrared region.

In some exemplary embodiments, the material that reflects and blocks the light in the infrared region may include, for example, titanium oxide ($TiO_2$), magnesium fluoride ($MgF_2$), and the like, but exemplary embodiments are not limited thereto.

As described above, when the protective film layer PFL includes a material that reflects and/or blocks light in the infrared region and a material that absorbs light in the infrared region, light in the infrared region may be absorbed and/or blocked by the protective film layer PFL disposed on the light sensing array layer LSL although the light in the infrared region of the external light may propagate through or off of the user's hand. Accordingly, the optical sensors PSR of the light sensing array layer LSL may analyze only the light emitted from the pixels PXL of the sensing area SA and reflected from the user without interference of the external light to more accurately recognize the user's fingerprint.

According to various exemplary embodiments, some configurations of the display panel DP, for example, the adhesive layer ADL and/or the protective film layer PFL, are configured to include an infrared absorbing material and/or an infrared blocking material to block light in the infrared region, thereby not utilizing a separate configuration for blocking light in the infrared region, for example, an infrared blocking film. Accordingly, the manufacturing time and/or cost of the display device DD may be reduced at least because the purchasing cost of the infrared blocking film is reduced, and the thickness of the display device DD may be further reduced as the infrared blocking film is not included in the display device DD.

Figure 30:
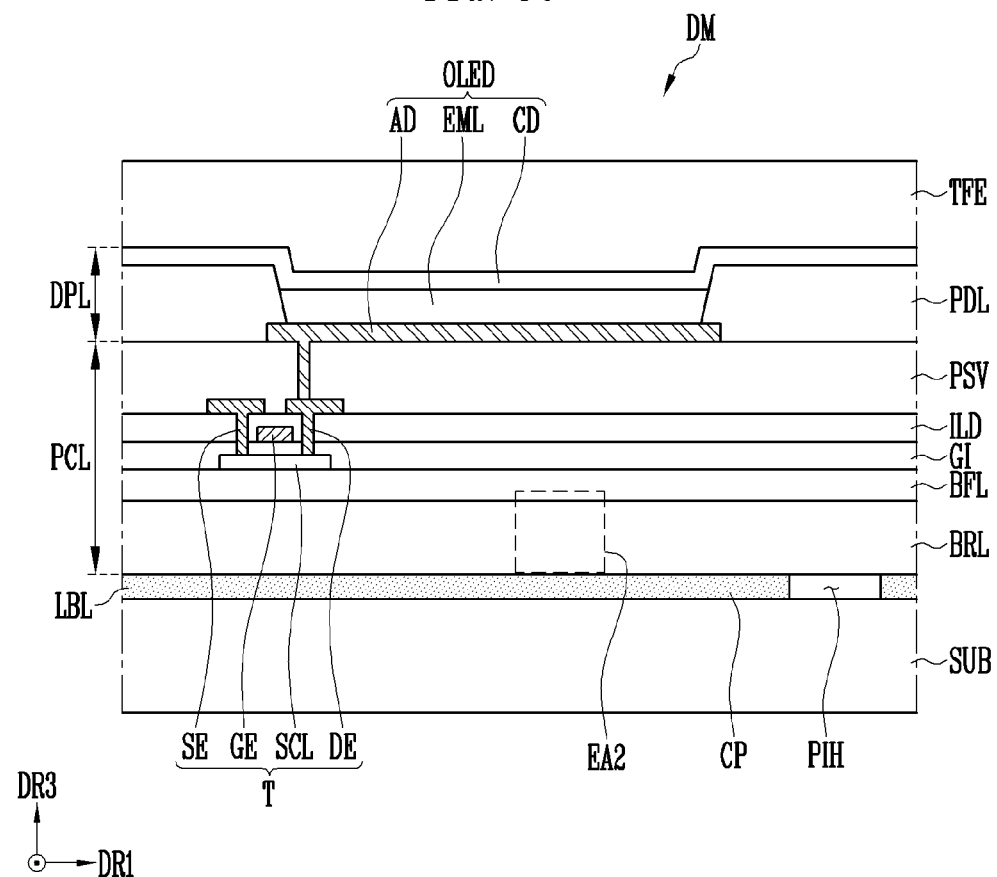
FIG. 30 is a cross-sectional view schematically illustrating a display unit of FIG. 28 according to some exemplary embodiments.
Figure 31:
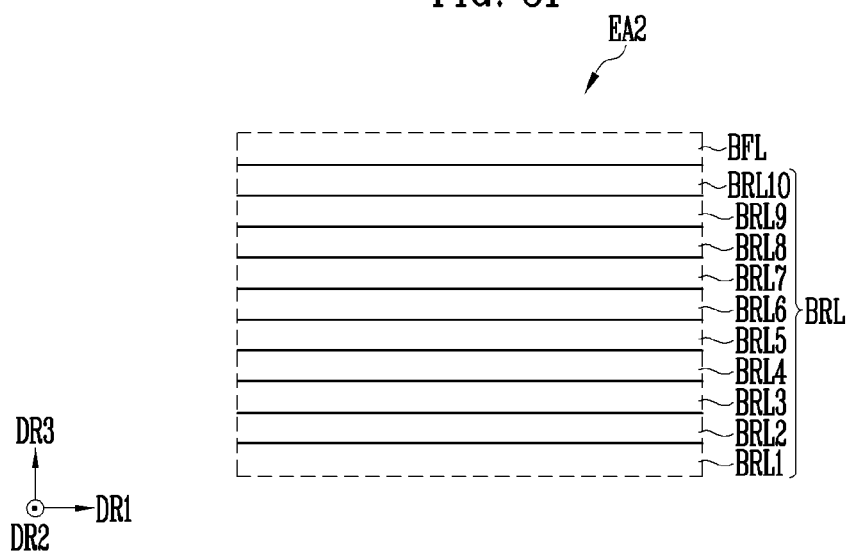
FIG. 31 is an enlarged cross-sectional view of a portion EA2 in FIG. 30 according to some exemplary embodiments.
Figure 32:
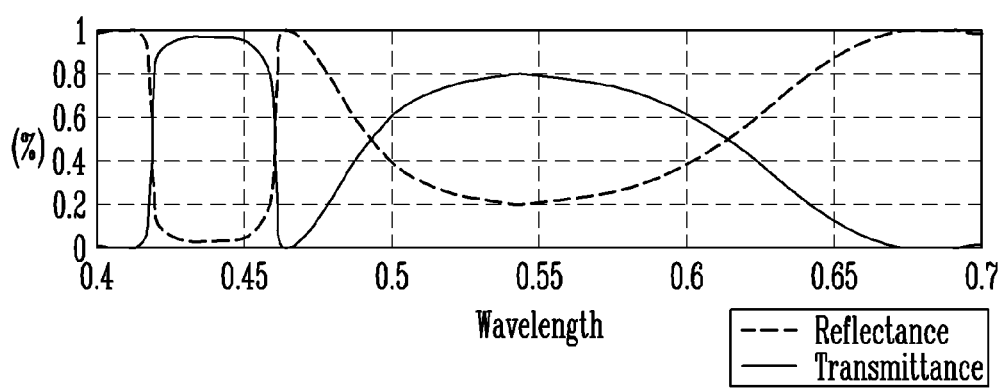
FIG. 32 is a graph illustrating a reflectance and transmittance for each area of external light that inflows to a display unit including a barrier layer of FIG. 31 according to some exemplary embodiments.

FIG. 30 is a cross-sectional view schematically illustrating a display unit of FIG. 28 according to some exemplary embodiments. FIG. 31 is an enlarged cross-sectional view of a portion EA2 in FIG. 30 according to some exemplary embodiments. FIG. 32 is a graph illustrating a reflectance and transmittance for each area of external light that inflows to a display unit including a barrier layer of FIG. 31 according to some exemplary embodiments.

Referring to FIGS. 1A, 1B, 2A to 2E, 28, and 30 to 32, the display unit DM may include a substrate SUB, a pinhole array mask layer LBL disposed on the substrate SUB, a pixel circuit layer PCL disposed on the pinhole array mask layer LBL, a display element layer DPL disposed on the pixel circuit layer PCL, and a thin-film encapsulation layer TFE covering the display element layer DPL.

In some exemplary embodiments, the substrate SUB may be formed of a flexible material, such as polyimide, but exemplary embodiments are not limited thereto. According to some exemplary embodiments, the substrate SUB may be provided in the form of a bilayer (or multilayer) with a first layer formed of polyimide and a second layer including the same material as the first layer. In this case, one of the first and second layers may include an infrared absorbing material for blocking light in the infrared region of the external light that inflows into the display device DD. The infrared absorbing material included in the substrate SUB may include, for example, at least one of an inorganic oxide, such as antimony-tin oxide (ATO), indium tin oxide (ITO), tungsten oxide, carbon black, and the like, and a metal, such as silver (Ag) and the like. According to some exemplary embodiments, the substrate SUB may be formed of a flexible and translucent material without including an infrared absorbing material.

The pinhole array mask layer LBL may be disposed on one surface of the substrate SUB to be disposed between the substrate SUB and the pixel circuit layer PCL. The pinhole array mask layer LBL may selectively transmit light reflected from an object disposed on the display surface of the display device DD, for example, a user's fingerprint. As such, the pinhole array mask layer LBL may include at least one pinhole PIH and a light-blocking conductive pattern CP.

The pixel circuit layer PCL may be disposed on the pinhole array mask layer LBL. The pixel circuit layer PCL may include a plurality of insulation layers, a plurality of conductive layers, and a semiconductor layer. The conductive layers of the pixel circuit layer PCL may constitute signal lines or pixel circuits. The pixel circuit layer PCL may include at least one transistor T provided and/or formed on the buffer layer BFL.

The display element layer DPL may include a light emitting element OLED disposed on the passivation layer PSV of the pixel circuit layer PCL and may emit light. The light emitting element OLED may include first and second electrodes AD and CD, and an emission layer EML provided between the first and second electrodes AD and CD.

In some exemplary embodiments, the pixel circuit layer PCL may further include the barrier layer BRL provided and/or formed between the pinhole array mask layer LBL and the buffer layer BFL.

The barrier layer BRL may prevent moisture and/or oxygen from penetrating into the semiconductor layer SCL of the transistor T. In addition, the barrier layer BRL may prevent metal atoms and/or impurities from diffusing from the substrate SUB to the semiconductor layer SCL of the transistor T.

According to some exemplary embodiments, the barrier layer BRL may be provided in the form of a single layer or multilayer. For example, the barrier layer BRL may be formed of a structure in which at least ten inorganic insulation layers are stacked. In some exemplary embodiments, the barrier layer BRL may include first to tenth barrier layers BRL1 to BRL10 sequentially stacked from one surface of the pinhole array mask layer LBL.

The barrier layers BRL1, BRL3, BRL5, BRL7, and BRL9 corresponding to odd-numbered layers from the one surface of the pinhole array mask layer LBL of the first to tenth barrier layers BRL1 to BRL10 may have different refractive indices from the barrier layers BRL2, BRL4, BRL6, BRL8, and BRL10 corresponding to even-numbered layers. For example, the barrier layers BRL1, BRL3, BRL5, BRL7, and BRL9 corresponding to the odd-numbered layers may have a refractive index greater than the barrier layers BRL2, BRL4, BRL6, BRL8, and BRL10 corresponding to the even-numbered layers. A refractive index difference between the barrier layers BRL1, BRL3, BRL5, BRL7, and BRL9 corresponding to the odd-numbered layers and the barrier layers BRL2, BRL4, BRL6, BRL8, and BRL10 corresponding to the even-numbered layers may be smaller than about ½, but exemplary embodiments are not limited thereto. For example, each of the barrier layers BRL1, BRL3, BRL5, BRL7, and BRL9 corresponding to the odd-numbered layers may have a refractive index of (or about) 1.887954, and each of the barrier layers BRL2, BRL4, BRL6, BRL8, and BRL10 corresponding to the even-numbered layers may have a refractive index of (or about) 1.472646.

In addition, each of the barrier layers BRL1, BRL3, BRL5, BRL7, and BRL9 corresponding to the odd-numbered layers and each of the barrier layers BRL2, BRL4, BRL6, BRL8, and BRL10 corresponding to the even-numbered layers may have the same thickness as each other or a different thickness from each other. For example, each of the barrier layers BRL1, BRL3, BRL5, BRL7, and BRL9 corresponding to odd-numbered layers may have a thickness of about 0.1059 μm, and each of barrier layers BRL2, BRL4, BRL6, BRL8, and BRL10 corresponding to even-numbered layers may have a thickness of about 0.1358 μm. Exemplary embodiments, however, are not limited thereto, and the thickness of the barrier layer BRL including the first to tenth barrier layers BRL1 to BRL10 may be determined within the range (or within the limit) that does not affect the overall thickness of the display device DD.

For convenience of description, the refractive index of the barrier layers BRL1, BRL3, BRL5, BRL7, and BRL9 corresponding to the odd-numbered layers is referred to as a first refractive index, and the refractive index of the barrier layers BRL2, BRL4, BRL6, BRL8, and BRL10 corresponding to the even-numbered layers is referred to as a second refractive index.

In some exemplary embodiments, the barrier layers BRL1, BRL3, BRL5, BRL7, and BRL9 corresponding to the odd-numbered layers may be an inorganic insulation layer including, for instance, silicon nitride ($SiN_x$). In addition, the barrier layers BRL2, BRL4, BRL6, BRL8, and BRL10 corresponding to the even-numbered layers may be an inorganic insulation layer including, for example, silicon oxide ($SiO_x$).

For instance, the barrier layer BRL according to some exemplary embodiments may be formed of multiple layers of a structure in which at least five dual-structured insulation layers in which at least one barrier layer having the first refractive index and including silicon nitride ($SiN_x$) and at least one barrier layer having the second refractive index and including silicon oxide ($SiO_x$) form a pair, are sequentially stacked.

As described above, when the barrier layer BRL is formed of multiple layers, the barrier layer BRL may adjust an optical path difference of the external light using constructive interference due to a refractive index difference between the barrier layers BRL1, BRL3, BRL5, BRL7, and BRL9 corresponding to the odd-numbered layers and the barrier layers BRL2, BRL4, BRL6, BRL8, and BRL10 corresponding to the even-numbered layers.

In some exemplary embodiments, a graph shown in FIG. 32 is a result of measuring the reflectance (%) and the transmittance (%) for each region (or for each wavelength) of the external light when external light inflows into the display unit DM including the barrier layer BRL including the first to tenth barrier layers BRL1 to BRL10 and having a thickness of about 0.9174 μm, and shows that the transmittance approaches 0% toward the infrared region of the external light. For instance, when the barrier layer BRL is formed of multiple layers of a structure in which at least five dual-structured insulation layers in which one barrier layer formed of silicon nitride ($SiN_x$) of the first refractive index and one barrier layer formed of silicon oxide ($SiO_x$) of the second refractive index form a pair, are sequentially stacked, the light in the infrared region of the external light that inflows into the display unit DM may be cut off.

According to various exemplary embodiments, when an insulation layer in which the first inorganic insulation layer and the second inorganic insulation layer having different refractive indices are alternately stacked to have a multilayer structure of at least ten layers is applied to the display unit DM, the light in the infrared region of the external light that inflows into the display unit DM may not transmit through the insulation layer due to the refractive index difference between the first and second inorganic insulation layers and may not be incident on the structure disposed under the insulation layer, for example, the light sensing array layer LSL.

The barrier layer BRL may block the light in the infrared region of the external light that inflows into the display device DD to prevent the light in the infrared region from being incident on the optical sensors PSR of the light sensing array layer LSL. Therefore, the optical sensors PSR of the light sensing array layer LSL may analyze only the light emitted from the pixels PXL of the sensing area SA and reflected from the user without interference of the external light to accurately recognize the user's fingerprint.

According to some exemplary embodiments, some configurations of the pixel circuit layer PCL, for example, the barrier layer BRL, is formed of multiple layers of at least ten layers to block light in the infrared region of external light, thereby not utilizing an infrared blocking film for blocking light in the infrared region, for example, a selective light-blocking film SLBF (see FIG. 3).

In various exemplary embodiments, the barrier layer BRL is formed as multiple layers having at least ten layers, thereby blocking light in the infrared region of the external light that inflows into the display device DD, but exemplary embodiments are not limited thereto. According to some exemplary embodiments, the barrier layer BRL may be formed of a single layer and at least one or two insulation layers of the insulation layers included in the display unit DM, except for the barrier layer BRL may be formed of multiple layers of at least ten layers, thereby blocking light in the infrared region of the light that inflows from the outside.

Figure 33:
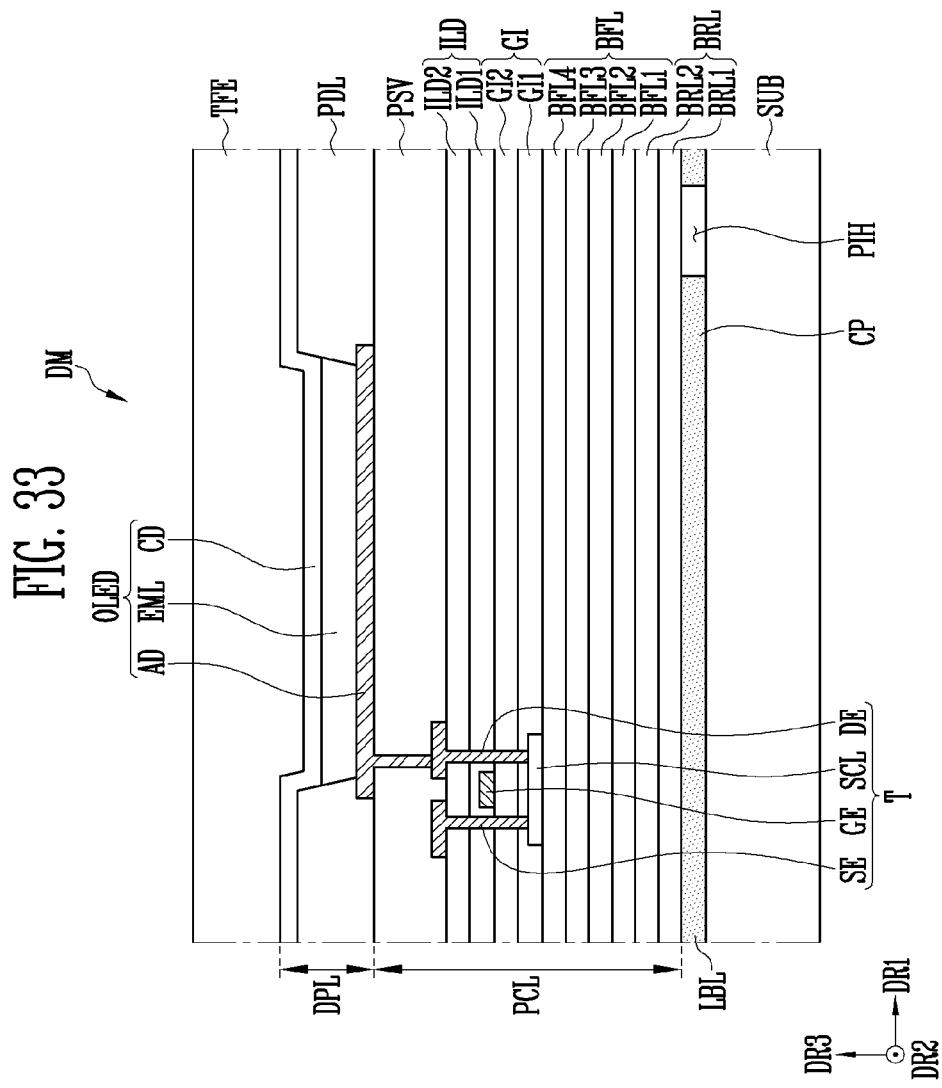
FIG. 33 is a cross-sectional view schematically illustrating a display unit of FIG. 28 according to some exemplary embodiments.

FIG. 33 is a cross-sectional view schematically illustrating a display unit of FIG. 28 according to some exemplary embodiments.

The display unit shown in FIG. 33 may be substantially equivalent or similar to the display unit DM shown in FIG. 30, except that each of the buffer layer BFL, the gate insulation layer GI, and the interlayer insulation layers ILD is formed of multiple layers. Thus, with respect to the display unit DM described in association with FIG. 33, to avoid redundant description, differences from the exemplary embodiments previously described will be mainly described. Parts not described in association with FIG. 33 follow at least one of the previously described exemplary embodiments, the same numbers denote the same constituent elements, and similar numbers denote similar constituent elements.

Referring to FIGS. 1A, 1B, 2A to 2E, and 33, the display unit DM may include a substrate SUB, a pinhole array mask layer LBL disposed on the substrate SUB, a pixel circuit layer PCL disposed on the pinhole array mask layer LBL, a display element layer DPL disposed on the pixel circuit layer PCL and a thin-film encapsulation layer TFE covering the display element layer DPL.

The pixel circuit layer PCL may include a barrier layer BRL, a buffer layer BFL disposed on the barrier layer BRL, at least one transistor T disposed on the buffer layer BFL, and a passivation layer PSV disposed on the transistor T. In addition, the pixel circuit layer PCL may further include a gate insulation layer GI disposed between a semiconductor layer SCL of the transistor T and a gate electrode GE, and an interlayer insulation layer ILD disposed between the gate electrode GE and the first and second ends SE and DE of the transistor T.

The barrier layer BRL may include at least one inorganic insulation layer. For example, the barrier layer BRL may include the first and second barrier layers BRL1 and BRL2 sequentially stacked.

The first barrier layer BRL1 may be disposed on one surface of the pinhole array mask layer LBL, and the second barrier layer BRL2 may be disposed on one surface of the first barrier layer BRL1. In some exemplary embodiments, the first barrier layer BRL1 and the second barrier layer BRL2 may be formed of inorganic insulation layers having different refractive indices. For example, the first barrier layer BRL1 may have a higher refractive index than the second barrier layer BRL2. The first barrier layer BRL1 may be an inorganic insulation layer including, for instance, silicon nitride ($SiN_x$), and the second barrier layer BRL2 may be an inorganic insulation layer including, for example, silicon oxide ($SiO_x$).

Although the first and second barrier layers BRL1 and BLR2 having different refractive indices are sequentially stacked to form the barrier layer BRL in FIG. 33, exemplary embodiments are not limited thereto. According to some exemplary embodiments, at least two dual-structured insulation layers in which the first and second barrier layers BRL1 and BRL2 having different refractive indices form a pair may be sequentially stacked to form the barrier layer BRL.

The buffer layer BFL may include at least one inorganic insulation layer. For example, the buffer layer BFL may include first to fourth buffer layers BFL1, BFL2, BFL3, and BFL4 sequentially stacked. The first buffer layer BFL1 may be disposed on one surface of the barrier layer BRL, the second buffer layer BFL2 may be disposed on one surface of the first buffer layer BFL1, and the third buffer layer BFL3 is disposed on one surface of the second buffer layer BFL2, the fourth buffer layer BFL4 may be disposed on one surface of the third buffer layer BFL3.

In some exemplary embodiments, the first buffer layer BFL1 and the third buffer layer BFL3 may have the same refractive index, and the second buffer layer BFL2 and the fourth buffer layer BFL4 may have the same refractive index. In addition, the first and third buffer layers BFL1 and BFL3 and the second and fourth buffer layers BFL2 and BFL4 may have different refractive indices. For example, the first and third buffer layers BFL1 and BFL3, corresponding to odd-numbered buffer layers from one surface of the barrier layer BRL, may have a larger refractive index than the second and fourth buffer layers BFL2 and BFL4 corresponding to even-numbered buffer layers from one surface of the barrier layer BRL. The first and third buffer layers BFL1 and BLF3 may be inorganic insulation layers including, for example, silicon nitride ($SiN_x$), and the second and fourth buffer layers BFL2 and BFL4 may be inorganic insulation layers including, for instance, silicon oxide ($SiO_x$).

In some exemplary embodiments, the first and third buffer layers BFL1 and BLF3 may be configured to include the same material with the same refractive index as the first barrier layer BRL1. In addition, the second and fourth buffer layers BFL2 and BFL4 may be configured to include the same material with the same refractive index as the second barrier layer BFL2.

Although it has been described that two dual-structured insulation layers in which odd-numbered buffer layers BFL1 or BFL3 and even-numbered buffer layers BFL2 or BFL4 that have different refractive indices and are formed of different materials form a pair, are stacked to form the buffer layer BFL, exemplary embodiments are not limited thereto. According to some exemplary embodiments, at least one dual-structured insulation layers in which at least one odd-numbered buffer layer BFL1 or BFL3 and at least one even-numbered buffer layer BFL2 or BFL4 that have different refractive indices and are formed of different materials form a pair may be sequentially stacked to form the buffer layer BFL.

The semiconductor layer SCL of the transistor T may be provided and/or formed on the buffer layer BFL.

The gate insulation layer GI may be disposed on the semiconductor layer SCL of the transistor T on the buffer layer BFL. The gate insulation layer GI may include at least one inorganic insulation layer. For example, the gate insulation layer GI may include first and second gate insulation layers GI1 and GI2 that are sequentially stacked from one surface of the buffer layer BFL. The first gate insulation layer GI1 may be disposed on one surface of the buffer layer BFL and the second gate insulation layer GI2 may be disposed on one surface of the first gate insulation layer GI1.

In some exemplary embodiments, the first gate insulation layer GI1 and the second gate insulation layer GI2 may have different refractive indices from each other. For example, the first gate insulation layer GI1 may have a refractive index greater than the second gate insulation layer GI2. The first gate insulation layer GI1 may be an inorganic insulation layer including, for instance, silicon nitride ($SiN_x$), and the second gate insulation layer GI2 may be an inorganic insulation layer including, for example, silicon oxide ($SiO_x$).

In some exemplary embodiments, the first gate insulation layer GI1 may be configured to include the same material with the same refractive index as the first and third buffer layers BFL1 and BFL3 that are buffer layers of which the stacking order are odd-numbered. In addition, the second gate insulation layer GI2 may be configured to include the same material with the same refractive index as the second and fourth buffer layers BFL2 and BFL4 that are buffer layers of which the stacking order are even-numbered.

Although it has been described that the first and second gate insulation layers GI1 and GI2 having different refractive indices are sequentially stacked to form a gate insulation layer GI, exemplary embodiments are not limited thereto. According to some exemplary embodiments, at least two double-insulation layers in which the first and second gate insulation layers GI1 and GI2 having different refractive indices form a pair, may be sequentially stacked to form the gate insulation layer GI.

A gate electrode GE of the transistor T, a scan line (not shown) for transferring a scan signal to the gate electrode GE, and a light emission control line (not shown) for transferring a light emission control signal to a pixel PXL may be provided and/or formed on the gate insulation layer GI.

An interlayer insulation layer ILD may be disposed on the gate electrode GE on the gate insulation layer GI. The interlayer insulation layer ILD may include at least one inorganic insulation layer. For example, the interlayer insulation layer ILD may include first and second interlayer insulation layers ILD1 and ILD2 that are sequentially stacked from one surface of the gate insulation layer GI. The first interlayer insulation layer ILD1 may be disposed on one surface of the gate insulation layer GI and the second interlayer insulation layer ILD2 may be disposed on one surface of the first interlayer insulation layer ILD1.

In some exemplary embodiments, the first interlayer insulation layer ILD1 and the second interlayer insulation layer ILD2 may have different refractive indices. For example, the first interlayer insulation layer ILD1 may have a refractive index greater than the second interlayer insulation layer ILD2. The first interlayer insulation layer ILD1 may be an inorganic insulation layer including, for example, silicon nitride ($SiN_x$), and the second interlayer insulation layer ILD2 may be an inorganic insulation layer including, for instance, silicon oxide ($SiO_x$).

In some exemplary embodiments, the first interlayer insulation layer ILD1 may be configured to include the same material with the same refractive index as the first gate insulation layer GI1. In addition, the second interlayer insulation layer ILD2 may be configured to include the same material with the same refractive index as the second gate insulation layer GI2.

Although it has been described that the first and second interlayer insulation layers ILD1 and ILD2 having different refractive indices are sequentially stacked to form the interlayer insulation layer ILD, exemplary embodiments are not limited thereto. According to some exemplary embodiments, at least two dual-structured insulation layers in which the first and second interlayer insulation layers ILD1 and ILD2 having different refractive indices form a pair may be sequentially stacked to form the interlayer insulation layer ILD.

A first end SE contacting one portion of the semiconductor layer SCL of the transistor T, a second end DE contacting another portion of the semiconductor layer SCL, a data line (not shown) for transferring a data signal to each pixel PXL, and a power line (not shown) for transferring driving power to each pixel PXL may be provided and/or formed on the interlayer insulation layer ILD.

A passivation layer PSV may be provided and/or formed on the interlayer insulation layer ILD.

A display element layer DPL may be provided and/or formed on the passivation layer PSV.

Accordingly to various exemplary embodiments, when the number of layers of the inorganic insulation layers in the pixel circuit layer PCL, for example, the barrier layer BFL, the buffer layer BFL, the gate insulation layer GI, and the interlayer insulation layer ILD is at least ten and the inorganic insulation layers corresponding to the odd-numbered layers and the inorganic insulation layers corresponding to the even-numbered layers from the one surface of the pinhole array mask layer LBL have different refractive indices from each other, the optical path difference of the external light may be adjusted using constructive interference due to the refractive index difference between the inorganic insulation layers. Therefore, the inorganic insulation layers in the pixel circuit layer PCL may block light in a specific region of the external light that inflows into the display device DD, for example, the infrared region, thereby preventing the light in the infrared region from being incident on the optical sensors PSR of the light sensing array layer LSL disposed under the pinhole array mask layer LBL. Therefore, the optical sensors PSR of the light sensing array layer LSL may analyze only the light emitted from the pixels PXL of the sensing area SA and reflected from the user without interference of the external light to more accurately recognize the user's fingerprint.

According to various exemplary embodiments, the number of layers of the inorganic insulation layers in the pixel circuit layer PCL is configured to be at least ten to block light in the infrared region of the external light that inflows into the display device DD, thereby not utilizing a separate configuration for blocking light in the infrared region, for example, an infrared blocking film.

It is contemplated that various exemplary embodiments described above may be configured separately or in a form that another exemplary embodiment is adopted to one exemplary embodiment to further block the light in the infrared region of the external light that inflows into the display device DD, thereby improving the accuracy of, for instance, the fingerprint sensing of the optical system including the optical sensor PSR. In some exemplary embodiments, the inorganic insulation layers included in the display unit DM are formed of multiple layers of at least ten layers to block external light in the infrared region instead of the selective light-blocking film SLBF in the display device DD shown in FIG. 3, thereby improving fingerprint sensing and the accuracy of the light sensing array layer LSL.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:
1. A display device comprising:
a light sensing array layer comprising at least one optical sensor configured to sense incident light;
a substrate disposed on the light sensing array layer, the substrate comprising:
a display area; and
a non-display area adjacent to at least one side of the display area;
a pixel circuit layer disposed on the substrate;
a display element layer disposed on the pixel circuit layer, the display element layer being configured to emit light;
a selective light transmission layer disposed between the light sensing array layer and the display element layer, the selective light transmission layer comprising:
a plurality of through-holes configured to form a path of light onto the at least one optical sensor; and
a light-blocking conductive pattern disposed between the plurality of through-holes; and
a plurality of pixels, each pixel among the plurality of pixels comprising:
a pixel circuit disposed in the pixel circuit layer; and
a light emitting element disposed in the display element layer,
wherein a voltage transmitted to the light-blocking conductive pattern is one of voltages transmitted to the pixel circuit.

2. The display device of claim 1, wherein:
the pixel circuit layer comprises at least one conductive layer and at least one insulating layer; and
the at least one conductive layer is electrically connected to the pixel circuit.

3. The display device of claim 2, wherein the light-blocking conductive pattern is electrically connected to the at least one conductive layer.

4. The display device of claim 3, wherein the at least one conductive layer comprises:
a plurality of scan lines on the display area, the plurality of scan lines being configured to transmit scan signals to the plurality of pixels;
a plurality of data lines on the display area, the plurality of data lines being configured to transmit data signals to the plurality of pixels;
a plurality of light emission control lines on the display area, the plurality of light emission control lines being configured to transmit a light emission control signal to the plurality of pixels;
a plurality of pixel power lines on the display area, the plurality of pixel power lines being configure to transmit a first power to the plurality of pixels; and
a plurality of initialization power lines on the display area, the plurality of initialization power lines being configured to transmit an initialization power to the plurality of pixels.

5. The display device of claim 4, wherein the at least one conductive layer is electrically connected to the light-blocking conductive pattern through a contact hole.

6. The display device of claim 5, wherein:
the at least one of the plurality of pixel power lines is electrically connected to the light-blocking conductive pattern through the contact hole; and
the voltage transmitted to the light-blocking conductive pattern is a voltage of the first power transmitted to the at least one of the plurality of pixel power lines.

7. The display device of claim 5, wherein:
the at least one of the plurality of initialization power lines is electrically connected to the light-blocking conductive pattern through the contact hole; and the voltage transmitted to the light-blocking conductive pattern is a voltage of the initialization power transmitted to the at least one of the plurality of initialization power lines.

8. The display device of claim 5, wherein:
the at least one of the plurality of data lines is electrically connected to the light-blocking conductive pattern through the contact hole; and
the voltage transmitted to the light-blocking conductive pattern is a data signal transmitted to at least one of the plurality of data lines.

9. The display device of claim 4, wherein the at least one conductive layer comprises:
a first power line on the non-display area, the first power line being configured to transmit the first power to the plurality of pixel power lines; and
a second power line on the non-display area, the second power line being configured to transmit a second power to the plurality of pixels.

10. The display device of claim 9, wherein one of the first and second power lines is electrically connected to the light-blocking conductive pattern through a contact hole overlapping the non-display area.

11. The display device of claim 10, wherein:
the pixel circuit comprises at least one transistor; and
the at least one transistor comprises:
an active pattern formed in at least one area of a semiconductor layer;
a gate electrode overlapping the active pattern; and
a source electrode and a drain electrode respectively connected to opposing ends of the active pattern.

12. The display device of claim 11, wherein a threshold voltage of the transistor is configured to vary in accordance with a power level of the light-blocking conductive pattern.

13. The display device of claim 3, wherein the at least one insulating layer comprises:
a barrier layer disposed on the selective light transmission layer;
a buffer layer disposed on the barrier layer;
a gate insulating layer disposed on the buffer layer;
an interlayer insulating layer disposed on the gate insulating layer; and
a passivation layer disposed on the interlayer insulating layer.

14. The display device of claim 13, wherein:
the barrier layer comprises at least ten layers;
a first inorganic insulating layer and a second inorganic insulating layer are alternately stacked to form the at least ten layers; and
refractive indices of the first inorganic insulating layer and the second inorganic insulating layer are different from each other.

15. The display device of claim 13, wherein:
each of the barrier layer, the buffer layer, the gate insulating layer, and the interlayer insulating layer comprises at least two layers;
a first inorganic insulating layer and a second inorganic insulating layer are alternately stacked to form the at least two layers; and
refractive indices of the first inorganic insulating layer and the second inorganic insulating layer are different from each other.

16. The display device of claim 1, wherein:
the substrate is flexible and comprises an infrared absorbing material;
the infrared absorbing material comprises an inorganic material; and
the inorganic material comprises at least one of antimony-tin oxide (ATO), indium tin oxide (ITO), tungsten oxide, and carbon black.

17. The display device of claim 1, further comprising:
a protective film layer disposed between the substrate and the light sensing array layer to protect the substrate; and
an adhesive layer disposed between the protective film layer and the substrate to adhere the protective film layer on one surface of the substrate.

18. The display device of claim 17, wherein:
the adhesive layer comprises an infrared absorbing material;
the infrared absorbing material comprises at least one of an inorganic material and an organic material;
the inorganic material comprises at least one of antimony-tin oxide (ATO), indium tin oxide (ITO), tungsten oxide, and carbon black; and
the organic material comprises an infrared absorbing dye.

19. The display device of claim 17, wherein:
the protective film layer comprises:
a base layer;
a first coating layer disposed on a first surface of the base layer; and
a second coating layer disposed on a second surface of the base layer, the second surface opposing the first surface; and
one of the first coating layer and the second coating layer comprises an infrared reflective coating layer and the other of the first coating layer and the second coating layer comprises an infrared absorbing coating layer.

20. The display device of claim 19, wherein:
the base layer comprises an infrared absorbing material;
the infrared absorbing material comprises at least one of an inorganic material and an organic material;
the inorganic material comprises at least one of antimony-tin oxide (ATO), indium tin oxide (ITO), tungsten oxide, and carbon black; and
the organic material comprises an infrared absorbing dye.

* * * * *